(12) United States Patent
Kosakai et al.

(10) Patent No.: US 11,887,877 B2
(45) Date of Patent: Jan. 30, 2024

(54) ELECTROSTATIC CHUCK DEVICE

(71) Applicant: SUMITOMO OSAKA CEMENT CO., LTD., Tokyo (JP)

(72) Inventors: Mamoru Kosakai, Tokyo (JP); Masaki Ozaki, Tokyo (JP); Keisuke Maeda, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 844 days.

(21) Appl. No.: 16/649,969

(22) PCT Filed: Sep. 26, 2018

(86) PCT No.: PCT/JP2018/035627
§ 371 (c)(1),
(2) Date: Mar. 23, 2020

(87) PCT Pub. No.: WO2019/065710
PCT Pub. Date: Apr. 4, 2019

(65) Prior Publication Data
US 2020/0266088 A1 Aug. 20, 2020

(30) Foreign Application Priority Data

Sep. 29, 2017 (JP) ................................ 2017-189718
Sep. 29, 2017 (JP) ................................ 2017-189719

(51) Int. Cl.
H01L 21/683 (2006.01)
H01L 21/3065 (2006.01)
(Continued)

(52) U.S. Cl.
CPC .... H01L 21/6833 (2013.01); H01J 37/32091 (2013.01); H01L 21/3065 (2013.01);
(Continued)

(58) Field of Classification Search
CPC ......... H01L 21/67109; H01L 21/76826; H01L 21/3065; H01L 21/6833; H01L 21/67098;
(Continued)

(56) References Cited

U.S. PATENT DOCUMENTS 10,475,687 B2 * 11/2019 Kosakai ................. H02N 13/00
11,328,948 B2 * 5/2022 Ozaki ............... H01L 21/67109
(Continued)

FOREIGN PATENT DOCUMENTS

JP      04-213854 A     8/1992
JP    2002-231798 A     8/2002
(Continued)

OTHER PUBLICATIONS

Office Action for Japanese Patent Application No. 2019-545553 (dated Apr. 5, 2022).
(Continued)

*Primary Examiner* — Savitri Mulpuri
(74) *Attorney, Agent, or Firm* — Merchant & Gould P.C.

(57) ABSTRACT

An electrostatic chuck device includes: an electrostatic chuck part having a sample placing surface on which a sample is placed and having a first electrode for electrostatic attraction; a cooling base part placed on a side opposite to the sample placing surface with respect to the electrostatic chuck part to cool the electrostatic chuck part; and an adhesive layer that bonds the electrostatic chuck part and the cooling base part together, in which the electrostatic chuck part has a recess and protrusion on the adhesive layer side, and a sheet resistance value of the first electrode is higher than $1.0\,\Omega/\square$ and lower than $1.0\times10^{10}\,\Omega/\square$.

10 Claims, 24 Drawing Sheets

(51) Int. Cl.
   *H01L 21/67*    (2006.01)
   *H01L 21/768*   (2006.01)
   *H01J 37/32*    (2006.01)
   *H02N 13/00*    (2006.01)

(52) U.S. Cl.
   CPC .. *H01L 21/67098* (2013.01); *H01L 21/76826* (2013.01); *H02N 13/00* (2013.01)

(58) Field of Classification Search
   CPC .......... H01J 37/32715; H01J 37/32091; H02N 13/00
   See application file for complete search history.

(56) References Cited

U.S. PATENT DOCUMENTS

| | | | | |
|---|---|---|---|---|
| 11,664,261 | B2* | 5/2023 | Kosakai | H01L 21/6833 156/345.52 |
| 2009/0199967 | A1* | 8/2009 | Himori | H02N 13/00 156/345.48 |
| 2009/0310274 | A1* | 12/2009 | Koyama | H01L 21/6833 361/234 |
| 2011/0031217 | A1* | 2/2011 | Himori | H01J 37/32165 156/345.48 |
| 2013/0342952 | A1* | 12/2013 | Nagai | H01L 21/6833 361/234 |
| 2014/0202386 | A1* | 7/2014 | Taga | C23C 4/08 118/500 |
| 2015/0248994 | A1* | 9/2015 | Tandou | H01L 21/6831 156/345.52 |
| 2016/0118285 | A1* | 4/2016 | Takada | H01L 21/6831 165/53 |
| 2018/0151402 | A1* | 5/2018 | Noorbakhsh | H01L 21/68785 |
| 2019/0088517 | A1* | 3/2019 | Kosakai | H01L 21/67103 |

FOREIGN PATENT DOCUMENTS

| | | |
|---|---|---|
| JP | 2005-072034 A | 3/2005 |
| JP | 2007-329499 A | 12/2007 |
| JP | 2008-042117 A | 2/2008 |
| JP | 2008-243973 A | 10/2008 |
| JP | 2009-188342 A | 8/2009 |
| JP | 2010-161109 A | 7/2010 |
| JP | 2010-183074 A | 8/2010 |
| JP | 2011-035266 A | 2/2011 |
| JP | 2014-072355 A | 4/2014 |
| JP | 2014-186994 A | 10/2014 |
| WO | 2016/158110 A | 6/2016 |
| WO | 2016/158110 A | 10/2016 |

OTHER PUBLICATIONS

Office Action for Japanese Patent Application No. 2019-545553 (dated Sep. 13, 2022).
International Search Report for PCT/JP2018/035627 (dated Dec. 25, 2018).
Office Action for Japanese Patent Application No. 2022-182076 (dated Aug. 22, 2023).
Office Action for Japanese Patent Application No. 2022-182089 (dated Aug. 22, 2023).

* cited by examiner

FIG. 4

| ELECTRODE FOR ELECTROSTATIC ATTRACTION | COMBINATION | | 1 | 2 | 3 | 4 | 5 | 6 |
|---|---|---|---|---|---|---|---|---|
| | WAFER ATTRACTION | MONOPOLAR | O | O | O | X | X | X |
| | | BIPOLAR | X | X | X | O | O | O |
| | FR (FOCUS RING) ATTRACTION | MONOPOLAR | X | O | X | X | O | O |
| | | BIPOLAR | X | X | O | X | X | O |

FIG. 14

| COMBINATION | | | 1 | 2 | 3 | 4 | 5 | 6 | 7 | 8 | 9 | 10 | 11 | 12 | 13 |
|---|---|---|---|---|---|---|---|---|---|---|---|---|---|---|---|
| RF or L COMPONENT ADJUSTMENT ELECTRODE | WAFER PORTION | SINGLE | X | X | X | X | O | O | O | O | O | O | X | X | X |
| | | PLURAL | X | X | X | X | X | X | X | O | X | X | O | O | O |
| | INTERMEDIATE PORTION | SINGLE | X | X | O | O | X | O | O | O | X | X | X | X | X |
| | FR PORTION | SINGLE | O | X | X | O | X | X | O | X | O | X | X | X | O |
| | | PLURAL | X | O | X | X | X | X | X | X | X | O | X | O | X |

ELECTROSTATIC CHUCK DEVICE

TECHNICAL FIELD

The present invention relates to an electrostatic chuck device.

This application is a U.S. National Stage Application under 35 U.S.C. 071 of International Patent Application No. PCT/JP2018/035627, filed on Sep. 26, 2018, which claims priority to Japanese Patent Application Nos. 2017-189718 and 2017-189719 filed on Sep. 29, 2017, the disclosures of all of which are hereby incorporated by reference in their entireties.

BACKGROUND

In the manufacture of semiconductor devices, there is known a plasma etching apparatus that generates plasma in a hermetically sealable processing chamber and processes a substrate to be processed, such as a semiconductor wafer. In the plasma etching apparatus, uniformity of an etching rate and uniformity of an etching direction in a plane of a wafer are required. However, in the plasma etching apparatus, the etching rate and the etching direction can be affected by the intensity of an electric field and the direction of a line of electric force in the plasma. For this reason, there is a case where the uniformity of the etching rate and the etching direction in the plane of the wafer of the plasma etching apparatus decreases.

In a memory hole or the like of a three-dimensional NAND flash memory, it is necessary to etch a deep hole in multilayer films of an insulating layer and an electrode layer, and thus the etching rate in the plane of the wafer and perpendicularity of the hole are particularly important.

In the plasma etching apparatus, as a technique for improving a problem in that the etching rate and the etching direction in the plane of the wafer become non-uniform, a plasma processing apparatus in which the uniformity of the etching rate and the etching direction in the plane of the wafer is improved by providing an electrode in a stage on which a substrate is placed and applying high-frequency power to the in-plane of the wafer is known (refer to Patent Literature No. 1).

CITATION LIST

Patent Literature

[Patent Literature No. 1] Japanese Laid-open Patent Publication No. 2011-35266

SUMMARY OF INVENTION

Technical Problem

However, in the plasma processing apparatus described above, even if an acceleration voltage is partially adjusted by a high-frequency voltage applied to a bias distribution control electrode, a high-frequency current flows in an electrostatic chuck electrode, so that an in-plane voltage gradient is reduced in the electrostatic chuck electrode, and therefore, there is a problem in that a sufficient effect cannot be exhibited.

Further, in the plasma processing apparatus described above, since a plurality of bias distribution control electrodes and power sources are required, an apparatus cost increases, and it is necessary to install an electrode for electrostatically attracting the wafer and the bias distribution control electrodes at an electrostatic chuck part, and as a result, the thickness of the electrostatic chuck part increases, and thus there is a problem in that the high-frequency permeability of the electrostatic chuck part is reduced.

The present invention has been made in view of the above points and provides an electrostatic chuck device in which it is possible to reduce non-uniformity of etching in a plane of a wafer.

Solution to Problem

The present invention has been made to solve the above problems, and according to an aspect of the present invention, there is provided an electrostatic chuck device including: an electrostatic chuck part having a sample placing surface on which a sample is placed and having a first electrode for electrostatic attraction; a cooling base part placed on a side opposite to the sample placing surface with respect to the electrostatic chuck part to cool the electrostatic chuck part; and an adhesive layer that bonds the electrostatic chuck part and the cooling base part together, in which the electrostatic chuck part has a recess and protrusion on the adhesive layer side, and a sheet resistance value of the first electrode is higher than $1.0\Omega/\square$ and lower than $1.0\times10^{10}\Omega/\square$.

Here, the unit of the sheet resistance value is $\Omega/\square$ (ohm per square), and the same applies to the following.

Further, according to an aspect of the present invention, there is provided an electrostatic chuck device including: an electrostatic chuck part having a sample placing surface on which a sample is placed and having a first electrode for electrostatic attraction; a cooling base part placed on a side opposite to the sample placing surface with respect to the electrostatic chuck part to cool the electrostatic chuck part; an adhesive layer that bonds the electrostatic chuck part and the cooling base part together; and a dielectric layer provided between the electrostatic chuck part and the cooling base part, in which a sheet resistance value of the first electrode is higher than $1.0\Omega/\square$ and lower than $1.0\times10^{10}\Omega/\square$.

Further, according to an aspect of the present invention, in the electrostatic chuck device described above, a dielectric constant of a dielectric in the dielectric layer is smaller than a dielectric constant of the electrostatic chuck part.

Further, according to an aspect of the present invention, there is provided an electrostatic chuck device including: an electrostatic chuck part having a sample placing surface on which a sample is placed and having a first electrode for electrostatic attraction; a cooling base part placed on a side opposite to the sample placing surface with respect to the electrostatic chuck part to cool the electrostatic chuck part; and an adhesive layer that bonds the electrostatic chuck part and the cooling base part together, in which a second electrode is provided between the first electrode and the cooling base part, and a sheet resistance value of the first electrode is higher than $1.0\Omega/\square$ and lower than $1.0\times10^{10}\Omega/\square$.

Further, according to an aspect of the present invention, in the electrostatic chuck device described above, the second electrode is connected to a high-frequency power source through a matching box which includes a capacitor and a coil, or is grounded through a variable conductor.

Further, according to an aspect of the present invention, in the electrostatic chuck device described above, a sheet resistance value of the second electrode is lower than the sheet resistance value of the first electrode.

Further, according to an aspect of the present invention, in the electrostatic chuck device described above, the second electrode is provided in an interior of the electrostatic chuck part or between the electrostatic chuck part and the cooling base part.

Further, according to an aspect of the present invention, in the electrostatic chuck device described above, the cooling base part is connected to a high-frequency power source through a matching box which includes a capacitor and a coil.

Further, according to an aspect of the present invention, in the electrostatic chuck device described above, the cooling base part is connected to a high-frequency power source through a matching box which includes a capacitor and a coil, and a magnitude of a first voltage of the high-frequency power source to which the cooling base part is connected and a phase of the first voltage, and a magnitude of a second voltage of the high-frequency power source to which the second electrode is connected and a phase of the second voltage are adjusted.

Further, according to an aspect of the present invention, in the electrostatic chuck device described above, the first electrode is connected to a variable direct-current power source through a high-frequency cutoff filter.

Further, according to an aspect of the present invention, in the electrostatic chuck device described above, the electrostatic chuck part has a structure installation surface on which an annular structure surrounding a periphery of the sample placing surface is installed, in a recessed portion which is located around the sample placing surface and is recessed from the sample placing surface.

Further, according to an aspect of the present invention, in the electrostatic chuck device described above, a third electrode for electrostatic attraction is provided between the structure installation surface and the cooling base part.

Further, according to an aspect of the present invention, in the electrostatic chuck device described above, a sheet resistance value of the third electrode is higher than $1.0\Omega/\square$ and lower than $1.0\times10^{10}\Omega/\square$.

Further, according to an aspect of the present invention, in the electrostatic chuck device described above, a fourth electrode is provided between the structure installation surface and the cooling base part, and the fourth electrode is connected to a high-frequency power source through a matching box which includes a capacitor and a coil, or is grounded through a variable conductor.

Further, according to an aspect of the present invention, in the electrostatic chuck device described above, the fourth electrode is provided in an interior of the electrostatic chuck part or between the electrostatic chuck part and the cooling base part.

Further, according to an aspect of the present invention, in the electrostatic chuck device described above, the fourth electrode straddles the sample placing surface and the structure installation surface in a direction parallel to the sample placing surface.

Further, according to an aspect of the present invention, in the electrostatic chuck device described above, a plurality of the fourth electrodes are provided.

Further, according to an aspect of the present invention, there is provided an electrostatic chuck device including: an electrostatic chuck part having a sample placing surface on which a sample is placed and having a first electrode for electrostatic attraction; a cooling base part placed on a side opposite to the sample placing surface with respect to the electrostatic chuck part to cool the electrostatic chuck part; an organic material part disposed between the electrostatic chuck part and the cooling base part; and a fifth electrode for high frequency provided on the organic material part.

Further, according to an aspect of the present invention, there is provided an electrostatic chuck device including: an electrostatic chuck part having a sample placing surface on which a sample is placed and having a sixth electrode for electrostatic attraction; a cooling base part placed on a side opposite to the sample placing surface with respect to the electrostatic chuck part to cool the electrostatic chuck part; and an adhesion layer that bonds the electrostatic chuck part and the cooling base part together, in which the electrostatic chuck part has a first recessed portion on the adhesion layer side, an outer periphery of the first recessed portion of the electrostatic chuck part has a slope, and the cooling base part has a first protrusion portion corresponding to the first recessed portion of the electrostatic chuck part.

Further, according to an aspect of the present invention, in the electrostatic chuck device described above, the electrostatic chuck part has a structure installation surface on which an annular structure surrounding a periphery of the sample placing surface is installed, in a second recessed portion which is located around the sample placing surface and is recessed from the sample placing surface.

Further, according to an aspect of the present invention, in the electrostatic chuck device described above, a part of the first recessed portion of the electrostatic chuck part extends to the structure installation surface.

Further, according to an aspect of the present invention, in the electrostatic chuck device described above, a thickness of the adhesive layer at a position corresponding to the structure installation surface is larger than a thickness of the adhesive layer between a bottom surface of the first recessed portion and the cooling base part.

Further, according to an aspect of the present invention, in the electrostatic chuck device described above, an inner angle of the slope of the outer periphery of the first recessed portion of the electrostatic chuck part is larger than 95 degrees and smaller than 165 degrees.

Further, according to an aspect of the present invention, in the electrostatic chuck device described above, a dielectric layer is provided between the electrostatic chuck part and the cooling base part.

Further, according to an aspect of the present invention, in the electrostatic chuck device described above, an RF application or LC component electrode layer is provided between the electrostatic chuck part and the cooling base part.

Further, according to an aspect of the present invention, in the electrostatic chuck device described above, a sheet resistance value of the first electrode is larger than $1.0\Omega/\square$ and smaller than $1.0\times10^{10}\Omega/\square$, and a thickness of the first electrode is larger than 0.5 μm and smaller than 50 μm.

Here, the unit of the sheet resistance value is $\Omega/\square$ (ohm per square), and the same applies to the following.

Further, according to an aspect of the present invention, in the electrostatic chuck device described above, an inner angle of a slope of the first protrusion portion of the cooling base part is smaller than an inner angle of the slope of the outer periphery of the first recessed portion of the electrostatic chuck part (the thickness of the adhesive layer on the slope of the outer periphery of the first recessed portion of the electrostatic chuck part is larger on the outer peripheral portion side).

Further, according to an aspect of the present invention, there is provided an electrostatic chuck device including: an electrostatic chuck part having a sample placing surface on which a sample is placed and having a sixth electrode for electrostatic attraction; a metallic base placed on a side opposite to the sample placing surface with respect to the electrostatic chuck part to apply an RF voltage; an organic material part connecting the electrostatic chuck part and the metallic base; and one or more seventh electrodes for RF voltage application or LC adjustment provided in the organic material part.

Further, according to an aspect of the present invention, in the electrostatic chuck device described above, the electrostatic chuck part is made of one or more of an aluminum oxide-silicon carbide composite sintered body and an aluminum oxide sintered body.

Advantageous Effects of Invention

According to the present invention, it is possible to reduce non-uniformity of etching in a plane of a wafer.

BRIEF DESCRIPTION OF DRAWINGS

FIG. 4 is a diagram showing an example of a combination of electrodes for electrostatic attraction according to the first embodiment of the present invention.

FIG. 14 is a table showing an example of a combination of a sample mounting surface adjustment electrode of the third embodiment of the present invention and an FR mounting surface adjustment electrode of the fourth embodiment.

DESCRIPTION OF EMBODIMENTS

First Embodiment

Figure 1:
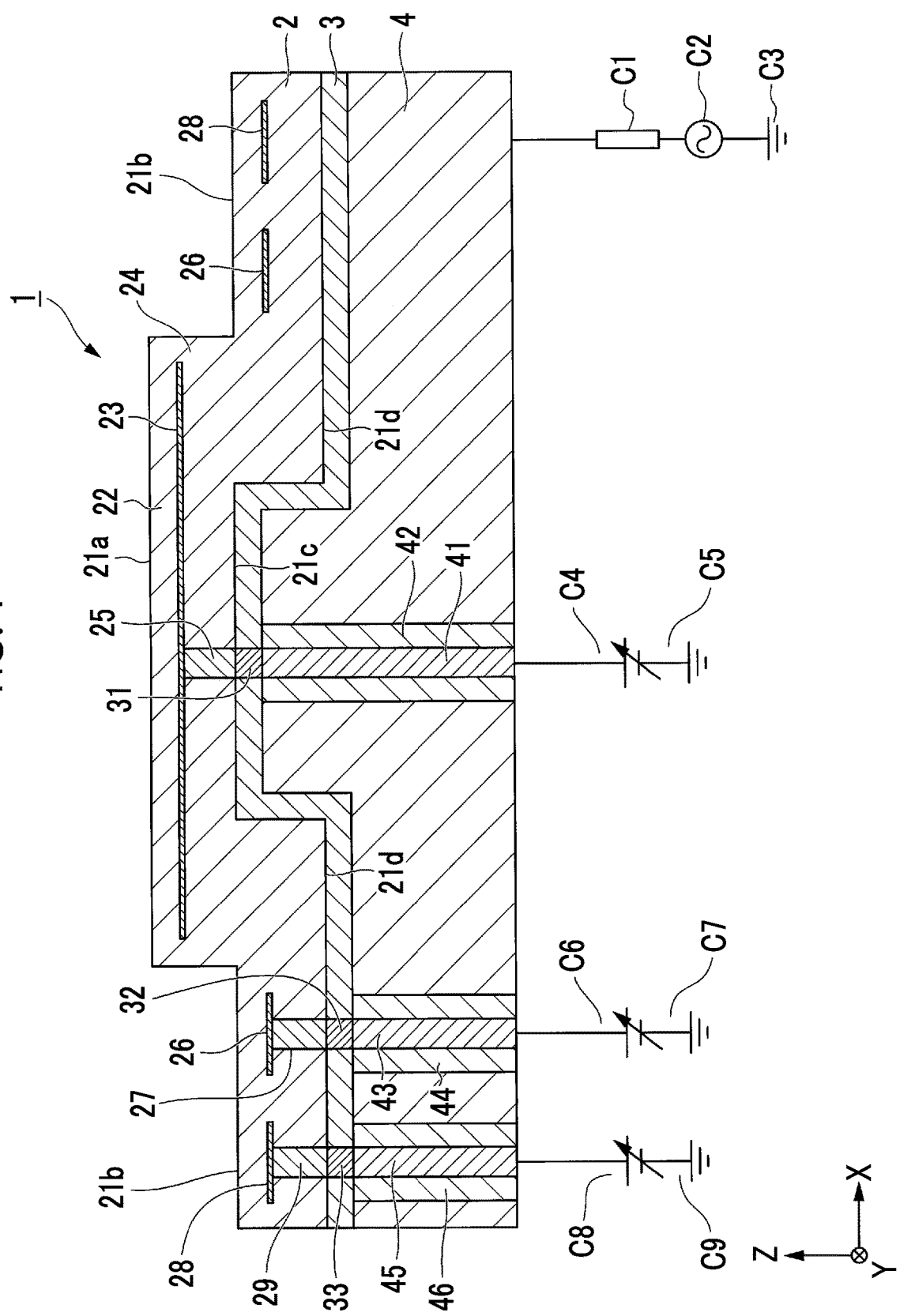
FIG. 1 is a sectional view showing an example of an electrostatic chuck device according to a first embodiment of the present invention.
Figure 2:
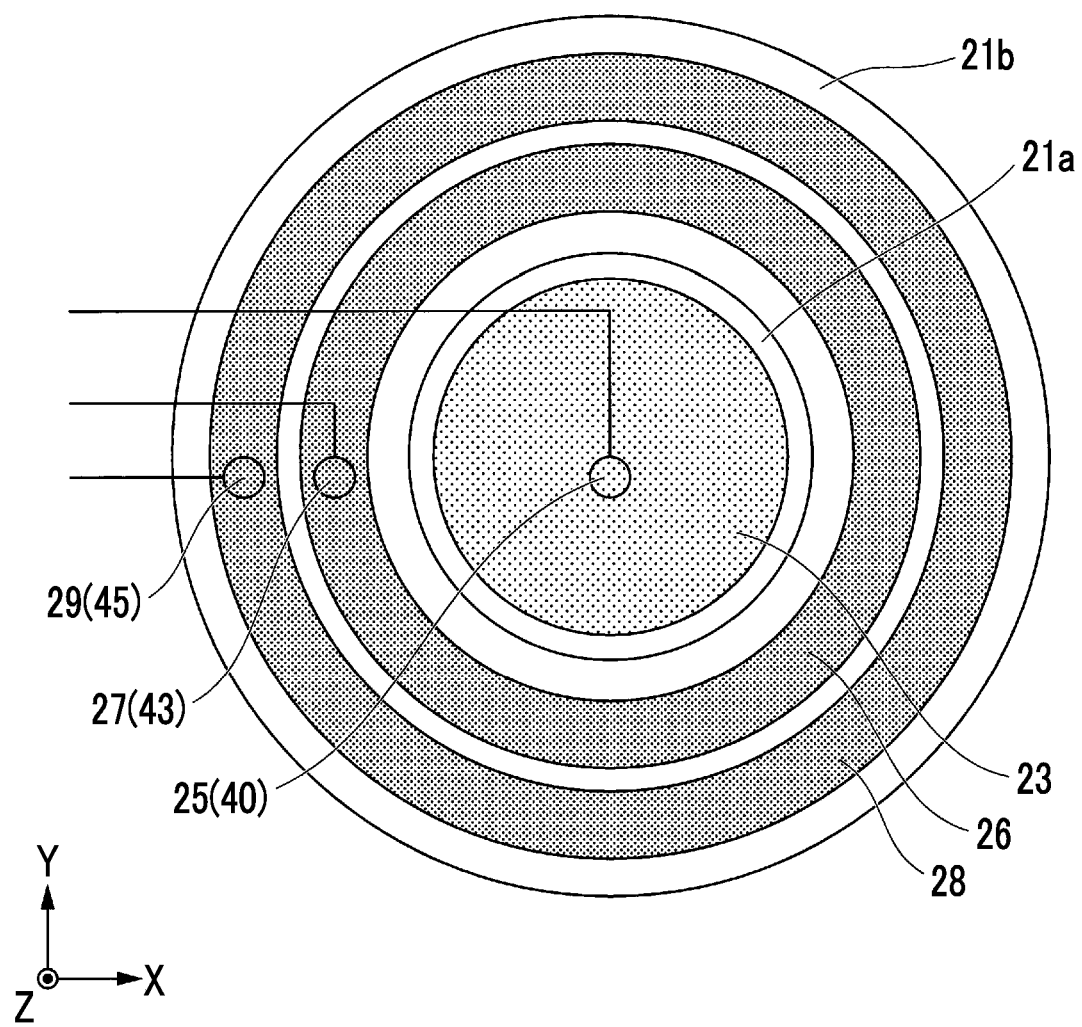
FIG. 2 is a plan view showing an example of an electrode of the electrostatic chuck device according to the first embodiment of the present invention.

Hereinafter, a first embodiment of the present invention will be described in detail with reference to the drawings. FIG. 1 is a sectional view showing an example of an electrostatic chuck device 1 according to this embodiment. FIG. 2 is a plan view showing an example of an electrode of the electrostatic chuck device 1 according to this embodiment. The electrostatic chuck device 1 includes an electrostatic chuck part 2, an insulating adhesive layer 3, and a cooling base part 4.

Here, a coordinate system fixed to the electrostatic chuck device 1 is a three-dimensional orthogonal coordinate system X, Y, Z. Here, an X axis of the three-dimensional orthogonal coordinate system X, Y, Z is a direction parallel to the horizontal direction, and a Z axis is an upward direction in the vertical direction. The upward direction is a positive direction of the Z axis.

Each of the electrostatic chuck part 2, the insulating adhesive layer 3, and the cooling base part 4 has a disk-like shape when the electrostatic chuck device 1 is viewed downward from above. The electrostatic chuck part 2 is installed on the cooling base part 4 with the insulating adhesive layer 3 interposed therebetween. The electrostatic chuck part 2, the insulating adhesive layer 3, and the cooling base part 4 are bonded together such that the centers of the disks overlap when the electrostatic chuck device 1 is viewed downward from above.

(Electrostatic Chuck Part)

The electrostatic chuck part 2 has a disk shape, as shown in FIG. 2, when the electrostatic chuck device 1 is viewed downward from above. The electrostatic chuck part 2 includes a placing plate 22, an electrode for wafer electrostatic attraction 23, a supporting plate 24, a first electrode for FR (focus ring) electrostatic attraction 26, and a second electrode for FR electrostatic attraction 28. The placing plate 22 and the supporting plate 24 are integrated.

The placing plate 22 has a sample placing surface 21a which is an upper surface of an inner peripheral portion of the disk, and a structure installation surface 21b which is an upper surface of an outer peripheral portion of the disk.

The structure installation surface 21b is provided in a recessed portion recessed from the sample placing surface 21a. The sample placing surface 21a is a surface on which a plate-shaped sample such as a semiconductor wafer is placed. The structure installation surface 21b is a surface on which a focus ring is placed. That is, the electrostatic chuck part 2 has the structure installation surface 21b on which the focus ring which is an annular structure surrounding the periphery of the sample placing surface 21a is installed, in the recessed portion which is located around the sample placing surface 21a and is recessed from the sample placing surface 21a.

The focus ring (not shown) is formed of, for example, a material having the same electrical conductivity as the wafer which is placed on the sample placing surface 21a. The focus ring is disposed at a peripheral edge portion of the wafer, whereby the electrical environment with respect to plasma can be made substantially coincident with that of the sample placing surface, and therefore, it is possible to reduce the non-uniformity of the etching rate between a central portion and a peripheral edge portion on the sample placing surface of the electrostatic chuck part 2.

The placing plate 22 and the supporting plate 24 have disk shapes in which the shapes of the overlapping surfaces are the same, and are made of an insulating ceramics sintered body having mechanical strength and durability against corrosive gas and plasma thereof, such as an aluminum oxide-silicon carbide ($Al_2O_3$—SiC) composite sintered body, an aluminum oxide ($Al_2O_3$) sintered body, an aluminum nitride (AlN) sintered body, or an yttrium oxide ($Y_2O_3$) sintered body.

The sample placing surface 21a of the placing plate 22 is a surface in which a plate-shaped sample such as a semiconductor wafer is placed on the upper surface thereof. A plurality of protrusion portions (not shown) each having a diameter smaller than the thickness of the plate-shaped sample are formed at predetermined intervals on the sample placing surface 21a, and these protrusion portions support the plate-shaped sample.

The electrode for wafer electrostatic attraction 23 is provided between the placing plate 22 and the supporting plate 24 at an inner peripheral portion of the disk of the electrostatic chuck part 2. The electrode for wafer electrostatic attraction 23 is a disk-shaped electrode, as shown in FIG. 2. The electrode for wafer electrostatic attraction 23 is provided between the sample placing surface 21a and an adhesion surface 21c and between the sample placing surface 21a and an adhesion surface 21d.

The electrode for wafer electrostatic attraction 23 is used as an electrostatic chuck electrode for generating electric charges and fixing the plate-shaped sample with an electrostatic attraction force, and the shape or size thereof is appropriately adjusted according to the use thereof. The electrode for wafer electrostatic attraction 23 is supported by an electrode pin for wafer electrostatic attraction 25. The electrode for wafer electrostatic attraction 23 is connected to an extraction electrode terminal 41 (described later) through the electrode pin for wafer electrostatic attraction 25.

The electrode for wafer electrostatic attraction 23 is preferably formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body.

The supporting plate 24 has a recessed surface on the lower surface that is in contact with the insulating adhesive layer 3. That is, the electrostatic chuck part 2 has a recess and a protrusion on the insulating adhesive layer 3 side. The lower surface of the supporting plate 24 is composed of the adhesion surface 21c and the adhesion surface 21d. Here, the downward direction is a negative direction of the Z axis.

The adhesion surface 21c is a circular flat surface which is located at an inner peripheral portion of the disk-shaped supporting plate 24. The adhesion surface 21c is recessed with respect to the adhesion surface 21d on the lower surface of the supporting plate 24. The adhesion surface 21d is a flat surface having a concentric circular shape, which is located at an outer peripheral portion of the disk-shaped supporting plate 24. In a case where the electrostatic chuck part 2 is viewed from above, the center of the circle of the adhesion surface 21c and the center of the circle of the sample placing surface 21a coincide with each other, and the diameter of the adhesion surface 21c is smaller than the diameter of the sample placing surface 21a. That is, in a case where the electrostatic chuck part 2 is viewed from above, the adhesion surface 21c is located at an inner peripheral portion of the sample placing surface 21a.

The adhesion surface 21c faces the sample placing surface 21a. The adhesion surface 21d has an inner peripheral portion facing the sample placing surface 21a and an outer peripheral portion facing the structure installation surface 21b. The thickness between the sample placing surface 21a and the adhesion surface 21c is smaller than the thickness between the sample placing surface 21a and the adhesion surface 21d.

In a plasma etching apparatus, an etching rate and an etching direction are affected by the intensity of an electric field and the direction of a line of electric force on the sample placing surface 21a of the electrostatic chuck part 2. In a case where the intensity of the electric field and the direction of the line of electric force on the sample placing surface 21a are non-uniform on the surface, the etching rate and the etching direction can become non-uniform.

In the sample placing surface 21a, an in-plane etching rate is affected by the density of plasma on the wafer placed on the sample placing surface 21a, the acceleration voltage of ions constituting the plasma, and the distribution of the temperature of the plasma. The density of plasma on the wafer, the acceleration voltage of ions constituting the plasma, and the distribution of the temperature of the plasma are different according to the type of the plasma etching apparatus provided with the electrostatic chuck device 1.

In FIG. 1, the case is described where the plasma etching apparatus provided with the electrostatic chuck device 1 is a plasma etching apparatus in which the density of the plasma-excited etching gas per unit volume in the inner peripheral portion is smaller than the density in the outer peripheral portion.

In this case, in the sample placing surface 21a, the etching rate in the inner peripheral portion is lower than that in the outer peripheral portion. Therefore, in the sample placing surface 21a, the etching rate in the portion facing the adhesion surface 21c is lower than that in the portion facing the adhesion surface 21d.

In the electrostatic chuck part 2, the thickness between the sample placing surface 21a and the adhesion surface 21d is made larger than the thickness between the sample placing surface 21a and the adhesion surface 21c. Accordingly, the capacitance between the sample placing surface 21a and the adhesion surface 21d becomes smaller than the capacitance between the sample placing surface 21a and the adhesion surface 21c, and thus a sheath voltage above the portion of the sample placing surface 21a, which faces the adhesion surface 21c, is increased.

In the electrostatic chuck part 2, by increasing the sheath voltage of the portion of the sample placing surface 21a, which faces the adhesion surface 21c and in which the density of the plasma-excited etching gas is low, it is possible to reduce non-uniformity of the etching rate on the sample placing surface 21a.

The thickness between the sample placing surface 21a and the adhesion surface 21c, the thickness between the sample placing surface 21a and the adhesion surface 21d, and the thickness between the structure installation surface 21b and the adhesion surface 21d are formed to be 0.7 mm or more and 5.0 mm or less, as an example.

For example, if the thickness of the electrostatic chuck part 2 is less than 0.7 mm, it becomes difficult to secure the mechanical strength of the electrostatic chuck part 2. If the thickness of the electrostatic chuck part 2 exceeds 5.0 mm, the high-frequency permeability of the electrostatic chuck part 2 decreases and the sheath voltage also decreases. Further, the thermal conductivity of the electrostatic chuck part 2 decreases and the heat capacity of the electrostatic chuck part 2 is increased, so that the cooling performance or the thermal responsiveness of the plate-shaped sample placed on the sample placing surface 21a deteriorates. The thickness of each part described here is an example, and is not limited to the range described above.

The sheet resistance value of the electrode for wafer electrostatic attraction 23 is higher than $1.0\Omega/\square$ and lower than $1.0\times10^{10}\Omega/\square$. It is preferable that the sheet resistance value of the electrode for wafer electrostatic attraction 23 is higher than $2.0\Omega/\square$ and lower than $1.0\times10^{7}\Omega/\square$. If the sheet resistance value of the electrode for wafer electrostatic attraction 23 is lower than the lower limit value described above, an eddy current is generated in the electrode for wafer electrostatic attraction 23, and thus an equal potential can be formed.

Even if the non-uniformity of the etching rate on the sample placing surface 21a of the electrostatic chuck part 2 is reduced by adjusting the sheath voltage on the sample placing surface 21a, due to the eddy current flowing through the electrode for wafer electrostatic attraction 23, the sheath voltage on the sample placing surface 21a is made uniform, and thus there is a case where the effect resulting from a change of the thickness of the electrostatic chuck part 2 is not sufficiently obtained.

In the electrostatic chuck device 1, by making the sheet resistance value of the electrode for wafer electrostatic attraction 23 higher than the lower limit value described above, it is possible to suppress the generation of the eddy current in the electrode for wafer electrostatic attraction 23. On the other hand, by making the sheet resistance value of the electrode for wafer electrostatic attraction 23 lower than the upper limit value described above, it is possible to maintain a good attraction characteristic.

The thickness of the electrode for wafer electrostatic attraction 23 is larger than 0.5 μm and smaller than 50 μm. It is preferable that the thickness of the electrode for wafer electrostatic attraction 23 is larger than 10 μm and smaller than 30 μm. The electrode for wafer electrostatic attraction 23 having such a thickness can be easily formed by a film forming method such as a sputtering method or a vapor deposition method, or a coating method such as a screen printing method.

If the thickness of the electrode for wafer electrostatic attraction 23 is less than 0.5 μm, it becomes difficult to secure sufficient conductivity. If the thickness of the electrode for wafer electrostatic attraction 23 exceeds 50 μm, due to the difference in coefficient of thermal expansion between the electrode for wafer electrostatic attraction 23 and the placing plate 22 and the difference in coefficient of thermal expansion between the electrode for wafer electrostatic attraction 23 and the supporting plate 24, peeling or cracking easily occurs at the joining interface between the electrode for wafer electrostatic attraction 23 and the placing plate 22 and the joining interface between the electrode for wafer electrostatic attraction 23 and the supporting plate 24.

The first electrode for FR electrostatic attraction 26 and the second electrode for FR electrostatic attraction 28 are provided between the structure installation surface 21b and the cooling base part 4 in the interior of the electrostatic chuck part 2.

The first electrode for FR electrostatic attraction 26 and the second electrode for FR electrostatic attraction 28 are ring-shaped electrodes, as shown in FIG. 2. The first electrode for FR electrostatic attraction 26 and the second electrode for FR electrostatic attraction 28 are provided between the structure installation surface 21b and the adhesion surface 21d. The diameter of the second electrode for FR electrostatic attraction 28, which is a ring-shaped electrode, is larger than the diameter of the first electrode for FR electrostatic attraction 26, which is a ring-shaped electrode.

The sheet resistance value of each of first electrode for FR electrostatic attraction 26 and the second electrode for FR electrostatic attraction 28 is higher than $1.0\Omega/\square$ and lower than $1.0\times10^{10}\Omega/\square$. It is preferable that the sheet resistance value of each of first electrode for FR electrostatic attraction 26 and the second electrode for FR electrostatic attraction 28 is higher than $2.0\Omega/\square$ and lower than $1.0\times10^{7}\Omega/\square$.

The thickness of the first electrode for FR electrostatic attraction 26 and the thickness of the second electrode for FR electrostatic attraction 28 are larger than 0.5 μm and smaller than 50 μm. It is preferable that the thickness of the first electrode for FR electrostatic attraction 26 and the thickness of the second electrode for FR electrostatic attraction 28 are larger than 10 μm and smaller than 30 μm.

The first electrode for FR electrostatic attraction 26 is supported by a first electrode pin for FR electrostatic attraction 27 at a portion of the circumference of the ring, as shown in FIG. 2. The first electrode for FR electrostatic attraction 26 is connected to an extraction electrode terminal 43 (described later) through the first electrode pin for FR electrostatic attraction 27. The second electrode for FR electrostatic attraction 28 is supported by a second electrode pin for FR electrostatic attraction 29 at a portion of the circumference of the ring. The second electrode for FR electrostatic attraction 28 is connected to an extraction electrode terminal 45 (described later) through the second electrode pin for FR electrostatic attraction 29.

(Insulating Adhesive Layer)

The insulating adhesive layer 3 attaches the cooling base part 4 to the lower surface of the electrostatic chuck part 2, that is, the adhesion surface 21c and the adhesion surface 21d. The insulating adhesive layer 3 is preferably formed of an organic adhesive such as polyimide resin, silicone resin, or epoxy resin. These organic adhesives have heat resistance and insulation properties after bonding and curing. The insulating adhesive layer 3 is preferably formed of, in particular, a silicone adhesive among the organic adhesives. The silicone adhesive has a low glass transition temperature, a high heat resistance temperature, and rubber elasticity. It is preferable that insulating ceramic powder (aluminum oxide, aluminum nitride, or the like) is added to the silicone adhesive as a thermally conductive filler.

Further, it is preferable that the adhesive before curing is formed of a gel-shaped or flexible sheet-shaped or film-shaped adhesive resin.

The insulating adhesive layer 3 is formed to have a thickness in a range of about 50 to 300 µm, as an example. The insulating adhesive layer 3 is more preferably formed to have a thickness in a range of about 100 to 200 µm.

The insulating adhesive layer 3 has a conductive adhesive layer 31, a conductive adhesive layer 32, and a conductive adhesive layer 33. The insulating adhesive layer 3 is formed to cover the peripheries of the conductive adhesive layer 31, the conductive adhesive layer 32, and the conductive adhesive layer 33.

The conductive adhesive layer 31 attaches the electrode pin for wafer electrostatic attraction 25 to the extraction electrode terminals 41. The conductive adhesive layer 32 attaches the first electrode pin for FR electrostatic attraction 27 to the extraction electrode terminal 43. The conductive adhesive layer 33 attaches the second electrode pin for FR electrostatic attraction 29 to the extraction electrode terminal 45.

The conductive adhesive layer 31, the conductive adhesive layer 32, and the conductive adhesive layer 33 are preferably formed of a silicone-based conductive adhesive having flexibility and electric resistance. Here, the silicone-based conductive adhesive is an adhesive obtained by adding conductive materials such as metal or carbon to a silicone adhesive. Further, as the shape of the conductive material, a needle-shaped material is preferable. In the needle-shaped material, conductivity can be secured only by adding a small amount as compared with a spherical material.

(Cooling Base Part)

The cooling base part 4 has a thick disk shape and is configured to adjust the temperature of the electrostatic chuck part 2 to a desired temperature. As the cooling base part 4, for example, a water-cooled base or the like, in which a flow path for circulating water is formed in the interior thereof, is preferable.

As the material for forming the cooling base part 4, as long as it is metal having excellent thermal conductivity, electrical conductivity, and workability, or a composite material containing such metal, there is no limitation, and for example, aluminum (Al), an aluminum alloy, copper (Cu), a copper alloy, stainless steel (SUS), or the like is suitably used.

It is preferable that at least the surface of the cooling base part 4, which is exposed to plasma, is subjected to alumite treatment or has an insulating film such as alumina formed thereon.

The cooling base part 4 has the extraction electrode terminal 41, the extraction electrode terminal 43, and the extraction electrode terminal 45. The cooling base part 4 is formed to cover the peripheries of the extraction electrode terminal 41, the extraction electrode terminal 43, and the extraction electrode terminal 45. The extraction electrode terminal 41, the extraction electrode terminal 43, and the extraction electrode terminal 45 are respectively covered with an insulator 42, an insulator 44, and an insulator 46 each having insulation properties.

The extraction electrode terminal 41, the extraction electrode terminal 43, and the extraction electrode terminal 45 are provided so as to penetrate the cooling base part 4 in the Z-axis direction.

The extraction electrode terminal 41 has a rod shape and is configured to apply a direct-current voltage to the electrode for wafer electrostatic attraction 23. The extraction electrode terminal 41 is connected to the electrode pin for wafer electrostatic attraction 25 through the conductive adhesive layer 31. The extraction electrode terminal 41 is connected to a variable direct-current power source C4 through a high-frequency cutoff filter (not shown).

The extraction electrode terminal 43 has a rod shape and is configured to apply a direct-current voltage to the first electrode for FR electrostatic attraction 26. The extraction electrode terminal 43 is connected to the first electrode pin for FR electrostatic attraction 27 through the conductive adhesive layer 32. The extraction electrode terminal 43 is connected to a variable direct-current power source C6 through a high-frequency cutoff filter (not shown).

The extraction electrode terminal 45 has a rod shape and is configured to apply a direct-current voltage to the second electrode for FR electrostatic attraction 28. The extraction electrode terminal 45 is connected to the second electrode pin for FR electrostatic attraction 29 through the conductive adhesive layer 33. The extraction electrode terminal 45 is connected to a variable direct-current power source C8 through a high-frequency cutoff filter (not shown).

The variable direct-current power source C4 is grounded by an earth C5. The variable direct-current power source C6 is grounded by an earth C7. The variable direct-current power source C8 is grounded by an earth C9.

The extraction electrode terminal 41, the extraction electrode terminal 43, and the extraction electrode terminal 45 are insulated with respect to the cooling base part 4 made of metal by the insulator 42, the insulator 44, and the insulator 46, respectively.

As the material of each of the extraction electrode terminal 41, the extraction electrode terminal 43, and the extraction electrode terminal 45, as long as it is a nonmagnetic conductive material having excellent heat resistance, there is no limitation. However, a material having a coefficient of thermal expansion close to the coefficients of thermal expansion of the electrode for wafer electrostatic attraction 23 and the supporting plate 24 is preferable, and for example, a metal material such as titanium (Ti) is used.

The cooling base part 4 is connected to a high-frequency power source C2 through a matching box C1 which includes a capacitor and a coil. The high-frequency power source C2 applies an RF (radio frequency) current for a bias voltage to the cooling base part 4. The high-frequency power source C2 is grounded by an earth C3.

(Summary)

As described above, the electrostatic chuck device 1 according to this embodiment includes the electrostatic chuck part 2, the cooling base part 4, and an adhesive layer (the insulating adhesive layer 3).

The electrostatic chuck part 2 has the sample placing surface 21a on which a sample is placed, and has a first electrode for electrostatic attraction (the electrode for wafer electrostatic attraction 23). The electrostatic chuck part 2 has a recess and protrusion on the adhesive layer (the insulating adhesive layer 3) side. The sheet resistance value of the first electrode (the electrode for wafer electrostatic attraction 23) is higher than $1.0\Omega/\square$ and lower than $1.0\times10^{10}\Omega/\square$. It is preferable that the sheet resistance value of the first electrode (the electrode for wafer electrostatic attraction 23) is higher than $2.0\Omega/\square$ and lower than $1.0\times10^7\Omega/\square$.

The cooling base part 4 is placed on the side opposite to the sample placing surface 21a with respect to the electrostatic chuck part 2 to cool the electrostatic chuck part 2.

The adhesive layer (the insulating adhesive layer 3) bonds the electrostatic chuck part 2 and the cooling base part 4 together.

With this configuration, in the electrostatic chuck device 1 according to this embodiment, since the thickness of the electrostatic chuck part 2 at the portion where the etching rate is low is reduced, so that the sheath voltage can be increased, it is possible to reduce the non-uniformity of etching on the sample placing surface of the electrostatic chuck part 2.

In this embodiment, the non-uniformity of etching means that the etching rate becomes non-uniform.

Further, in the electrostatic chuck device 1 according to this embodiment, the sheet resistance value of the first electrode (the electrode for wafer electrostatic attraction 23) is higher than $1.0\Omega/\square$ and lower than $1.0\times10^{10}\Omega/\square$. It is preferable that the sheet resistance value of the first electrode (the electrode for wafer electrostatic attraction 23) is higher than $2.0\Omega/\square$ and lower than $1.0\times10^7\Omega/\square$. By making the sheet resistance value of the first electrode (the electrode for wafer electrostatic attraction 23) higher than the lower limit value described above, it is possible to suppress the generation of the eddy current in the electrode for wafer electrostatic attraction 23. For this reason, it is possible to reduce the non-uniformity of the etching rate on the sample placing surface of the electrostatic chuck part 2 without weakening the effect of adjusting the sheath voltage on the sample placing surface 21a by changing the thickness of the electrostatic chuck part 2. On the other hand, by making the sheet resistance value of the first electrode (the electrode for wafer electrostatic attraction 23) lower than the upper limit value described above, it is possible to maintain a good attraction characteristic.

Further, the cooling base part 4 is connected to the high-frequency power source C2 through the matching box C1 which includes a capacitor and a coil.

With this configuration, in the electrostatic chuck device 1 according to this embodiment, it is possible to apply a high-frequency current for a high-frequency bias voltage to the cooling base part 4. For this reason, in the electrostatic chuck device 1 according to this embodiment, since it is possible to adjust the sheath voltage on the sample placing surface of the electrostatic chuck part 2, it is possible to reduce the non-uniformity of the etching rate on the sample placing surface of the electrostatic chuck part 2.

Further, the electrode for wafer electrostatic attraction 23 is connected to the variable direct-current power source C4 through the high-frequency cutoff filter (not shown).

With this configuration, in the electrostatic chuck device 1 according to this embodiment, it is possible to protect the variable direct-current power source C4 from the RF current. For this reason, in the electrostatic chuck device 1 according to this embodiment, since it is possible to stabilize the attraction of the sample by the electrode for wafer electrostatic attraction 23, the temperature becomes uniform in the plane of the wafer, so that it is possible to reduce the non-uniformity of the etching rate due to the non-uniform wafer temperature.

Further, the gap between the sample placing surface 21a and the wafer is filled with He gas, whereby it is possible to improve the heat transfer coefficient between the sample placing surface 21a and the wafer, and the temperature of the wafer can also be adjusted by adjusting the pressure of the He gas to change the thermal conductivity of the He gas.

Further, the electrostatic chuck part 2 has the structure installation surface 21b, on which an annular structure surrounding the periphery of the sample placing surface 21a is installed, in the recessed portion which is located around the sample placing surface 21a and is recessed from the sample placing surface 21a.

With this configuration, in the electrostatic chuck device 1 according to this embodiment, since the focus ring can be placed, it is possible to reduce the non-uniformity of the etching rate between the central edge portion and the peripheral portion on the sample placing surface of the electrostatic chuck part 2.

Further, a third electrode for electrostatic attraction (the first electrode for FR electrostatic attraction 26 and the second electrode for FR electrostatic attraction 28) is provided between the structure installation surface 21b and the cooling base part 4.

With this configuration, in the electrostatic chuck device 1 according to this embodiment, it is possible to attract the focus ring. For this reason, in the electrostatic chuck device 1 according to this embodiment, the heat transfer coefficient between the focus ring and the structure installation surface 21b becomes uniform in the circumferential direction, and thus it is possible to make the temperature of the focus ring uniform in the circumferential direction.

For this reason, in the electrostatic chuck device 1 according to this embodiment, it is possible to reduce the non-uniformity of the etching rate between the central portion and the peripheral edge portion on the sample placing surface of the electrostatic chuck part 2, and it is also possible to reduce the non-uniformity in the circumferential direction.

Further, the focus ring is fixed by the electrostatic attraction force, whereby the gap between the structure installation surface 21b and the focus ring can be filled with He gas, and thus it is possible to improve the heat transfer coefficient between the structure installation surface 21b and the focus ring and it is also possible to adjust the temperature of the focus ring by changing the heat conductivity of the He gas by adjusting the pressure of the He gas.

Further, the sheet resistance value of the third electrode (the first electrode for FR electrostatic attraction 26 and the second electrode for FR electrostatic attraction 28) is higher than $1.0\Omega/\square$ and lower than $1.0\times10^{10}\Omega/\square$. It is preferable that the sheet resistance value of the third electrode (the first electrode for FR electrostatic attraction 26 and the second electrode for FR electrostatic attraction 28) is higher than $2.0\Omega/\square$ and lower than $1.0\times10^7\Omega/\square$.

In the electrostatic chuck device 1 according to this embodiment, the function of adjusting the acceleration voltage including not only the sample placing surface 21a but also the structure installation surface 21b can be maintained by making the sheet resistance value of the third electrode (the first electrode for FR electrostatic attraction 26 and the second electrode for FR electrostatic attraction 28) higher than the lower limit value described above. On the other hand, by making the sheet resistance value of the third electrode (the first electrode for FR electrostatic attraction 26 and the second electrode for FR electrostatic attraction 28) lower than the upper limit value described above, it is possible to maintain a good attraction characteristic.

In this embodiment, the case has been described where the plasma etching apparatus provided with the electrostatic chuck device 1 is a plasma etching apparatus in which the density of the plasma-excited etching gas per unit volume is smaller in the inner peripheral portion than in the outer peripheral portion. However, the electrostatic chuck device according to this embodiment may be provided in a plasma etching apparatus in which the density of the excited etching gas per unit volume is larger in the inner peripheral portion than in the outer peripheral portion.

A case where the electrostatic chuck device is provided in a plasma etching apparatus in which the density of the excited etching gas per unit volume is larger in the inner peripheral portion than in the outer peripheral portion will be described with reference to FIG. 3.

First Embodiment, First Modification Example

Figure 3:
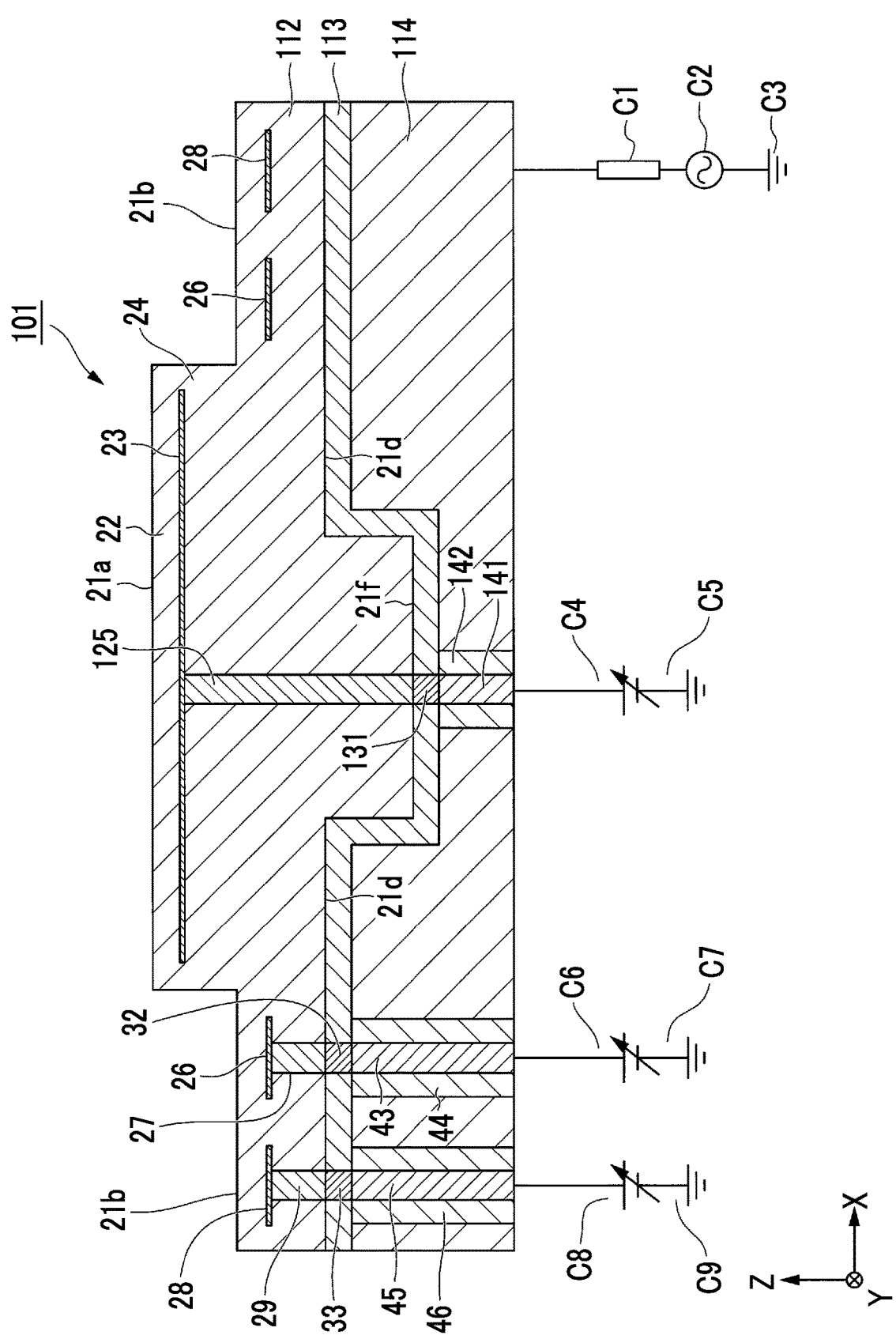
FIG. 3 is a sectional view showing a first modification example of the electrostatic chuck device according to the first embodiment of the present invention.

FIG. 3 is a sectional view showing a first modification example of the electrostatic chuck device 1 according to this embodiment. An electrostatic chuck device 101 includes an electrostatic chuck part 112, an insulating adhesion layer 113, and a cooling base part 114.

If the electrostatic chuck device 101 (FIG. 3) is compared with the electrostatic chuck device 1 (FIG. 1), the direction of the recess and protrusion of the supporting plate 24 of the electrostatic chuck part 112 is different. The supporting plate 24 has a protrusion surface on the lower surface that is a surface in contact with the insulating adhesion layer 113. Here, the functions of the other components are the same as those of the electrostatic chuck device 1 (FIG. 1). Description of the same functions as those of the electrostatic chuck device 1 (FIG. 1) will be omitted, and description will be made focusing on portions different from the electrostatic chuck device 1 (FIG. 1).

The lower surface of the supporting plate 24 is composed of an adhesion surface 21f and the adhesion surface 21d. The adhesion surface 21f is a circular flat surface which is located at an inner peripheral portion of the disk-shaped supporting plate 24. The adhesion surface 21f protrudes with respect to the adhesion surface 21d on the lower surface of the supporting plate 24. In a case where the electrostatic chuck part 112 is viewed from above, the center of the circle of the adhesion surface 21f coincides with the center of the circle of the sample placing surface 21a, and the diameter of the adhesion surface 21f is smaller than the diameter of the sample placing surface 21a. That is, in a case where the electrostatic chuck part 2 is viewed from above, the adhesion surface 21f is located at the inner peripheral portion of the sample placing surface 21a.

The adhesion surface 21f faces the sample placing surface 21a. The thickness between the sample placing surface 21a and the adhesion surface 21f is larger than the thickness between the sample placing surface 21a and the adhesion surface 21d.

In the electrostatic chuck part 112, the thickness between the sample placing surface 21a and the adhesion surface 21f is larger than the thickness between the sample placing surface 21a and the adhesion surface 21d. Accordingly, the capacitance between the sample placing surface 21a and the adhesion surface 21f becomes smaller than the capacitance between the sample placing surface 21a and the adhesion surface 21d, and thus in the sample placing surface 21a, the sheath voltage of the sample placing surface 21a facing the adhesion surface 21f is reduced.

In the electrostatic chuck part 112, by reducing the sheath voltage of the portion of the sample placing surface 21a, which faces the adhesion surface 21f and in which the density of the plasma-excited etching gas is high, it is possible to reduce the non-uniformity of the etching rate on the sample placing surface 21a.

In this embodiment, the case has been described where the electrode for wafer electrostatic attraction 23 is monopolar and the electrode for FR electrostatic attraction is bipolar (the first electrode for FR electrostatic attraction 26 and the second electrode for FR electrostatic attraction 28). However, the combination of the electrodes for electrostatic attraction is not limited thereto. The combination of the electrodes for electrostatic attraction will be described with reference to FIG. 4.

FIG. 4 is a diagram showing an example of the combination of the electrodes for electrostatic attraction according to this embodiment. In the table of FIG. 4, the symbol "o" indicates that the electrode shown in the same row as the symbol "o" is provided in the electrostatic chuck device. The symbol "x" indicates that the electrode shown in the same row as the symbol "o" is not provided in the electrostatic chuck device.

For example, combination 1 indicates a configuration in which the electrostatic chuck device 1 is provided with a monopolar electrode for wafer electrostatic attraction and is not provided with the electrode for FR electrostatic attraction. Combination 2 indicates a configuration in which the electrostatic chuck device 1 is provided with a monopolar electrode for wafer electrostatic attraction and a monopolar electrode for FR electrostatic attraction.

The electrode for wafer electrostatic attraction may be a bipolar electrode. As described above, in a case where the electrode for wafer electrostatic attraction is monopolar, it is necessary to make the resistance value of the electrode for wafer electrostatic attraction higher than a predetermined value. In a case where the electrode for wafer electrostatic attraction is bipolar, for example, two electrodes for wafer electrostatic attraction are installed concentrically. In a case where the electrode for wafer electrostatic attraction is bipolar, if the resistance value of at least one of the electrodes for wafer electrostatic attraction is higher than a predetermined value, the resistance value of the other electrode for wafer electrostatic attraction may not be higher than the predetermined value.

The electrode for FR electrostatic attraction may be monopolar or bipolar, regardless of whether the electrode for wafer electrostatic attraction is monopolar or bipolar. In a case where the electrode for FR electrostatic attraction is monopolar, it is necessary to make the resistance value of the electrode for FR electrostatic attraction higher than a predetermined value. In a case where the electrode for FR electrostatic attraction is bipolar, if the resistance value of at least one of the electrodes for FR electrostatic attraction is higher than a predetermined value, the resistance value of the other electrode for FR electrostatic attraction may not be higher than the predetermined value.

Further, the electrode for FR electrostatic attraction may not be provided.

First Embodiment, Second Modification Example

Figure 5:
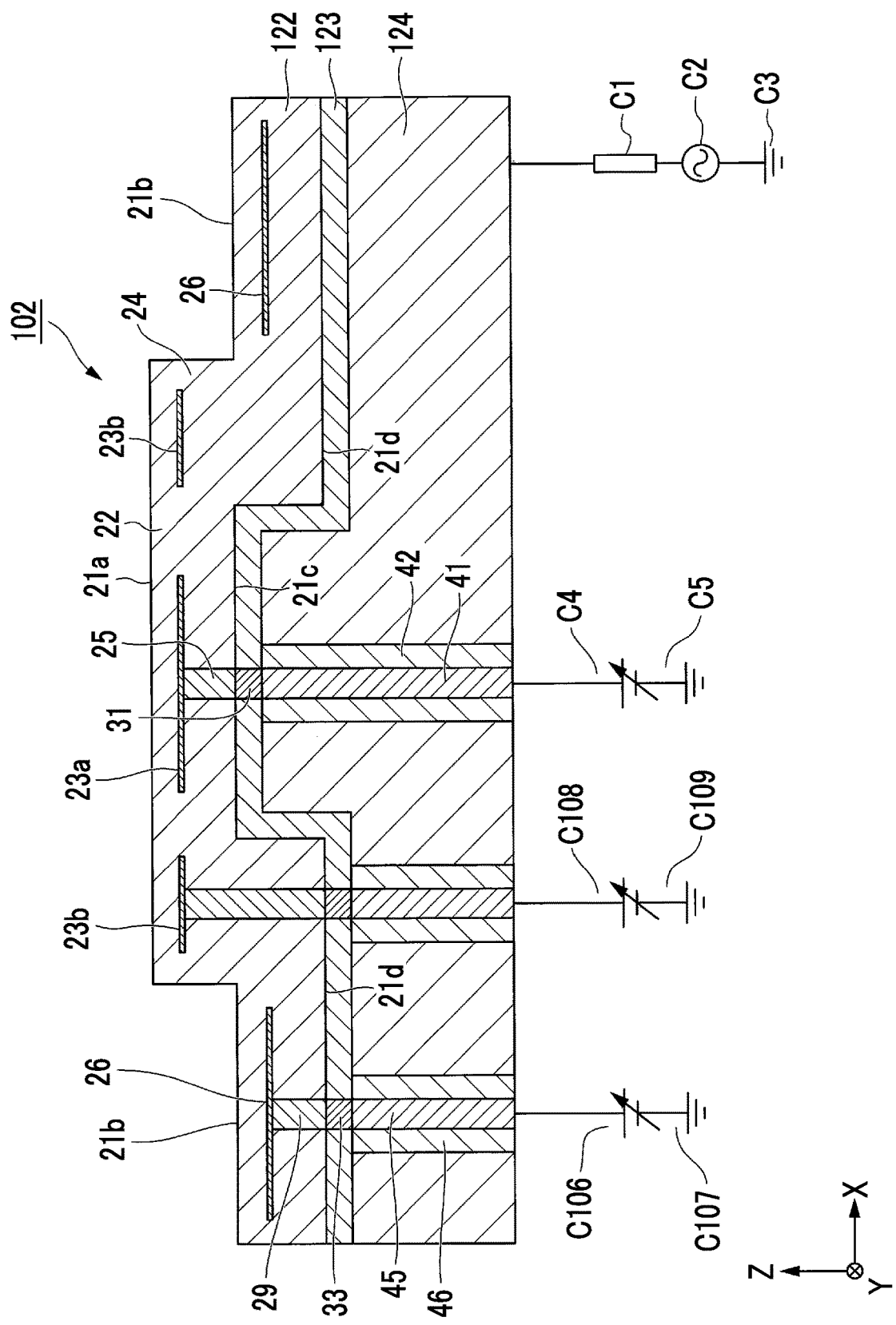
FIG. 5 is a sectional view showing a second modification example of the electrostatic chuck device according to the first embodiment of the present invention.

Here, a case where the electrode for wafer electrostatic attraction is bipolar and the electrode for FR electrostatic attraction is monopolar (the case of combination 5 in FIG. 4) will be described with reference to FIG. 5. FIG. 5 is a sectional view showing a second modification example of the electrostatic chuck device according to the first embodiment of the present invention. An electrostatic chuck device 102 shown in FIG. 5 includes an electrode for wafer electrostatic attraction 23a, an electrode for wafer electrostatic attraction 23b, and an electrode for FR electrostatic attraction 26.

The electrode for wafer electrostatic attraction 23a is provided between the sample placing surface 21a and the adhesion surface 21c in the interior of an electrostatic chuck part 122. The electrode for wafer electrostatic attraction 23a is a disk-shaped electrode.

The electrode for wafer electrostatic attraction 23b is provided between the sample placing surface 21a and the adhesion surface 21d in the interior of the electrostatic chuck part 122. The electrode for wafer electrostatic attraction 23b is a ring-shaped electrode.

The electrode for FR electrostatic attraction 26 is provided between the structure installation surface 21b and the adhesion surface 21d in the interior of the electrostatic chuck part 122. The electrode for FR electrostatic attraction 26 is a ring-shaped electrode.

Second Embodiment

Hereinafter, a second embodiment of the present invention will be described in detail with reference to the drawings.

In the first embodiment described above, the case has been described where the electrostatic chuck device is provided with the electrostatic chuck part 2 having the recess and protrusion on the insulating adhesive layer side to adjust the capacitance of the electrostatic chuck part. In this embodiment, a case will be described where the electrostatic chuck device is provided with a dielectric layer provided between the electrostatic chuck part and the cooling base part to adjust the capacitance of the electrostatic chuck part.

The electrostatic chuck device according to this embodiment is referred to as an electrostatic chuck device 201.

Figure 6:
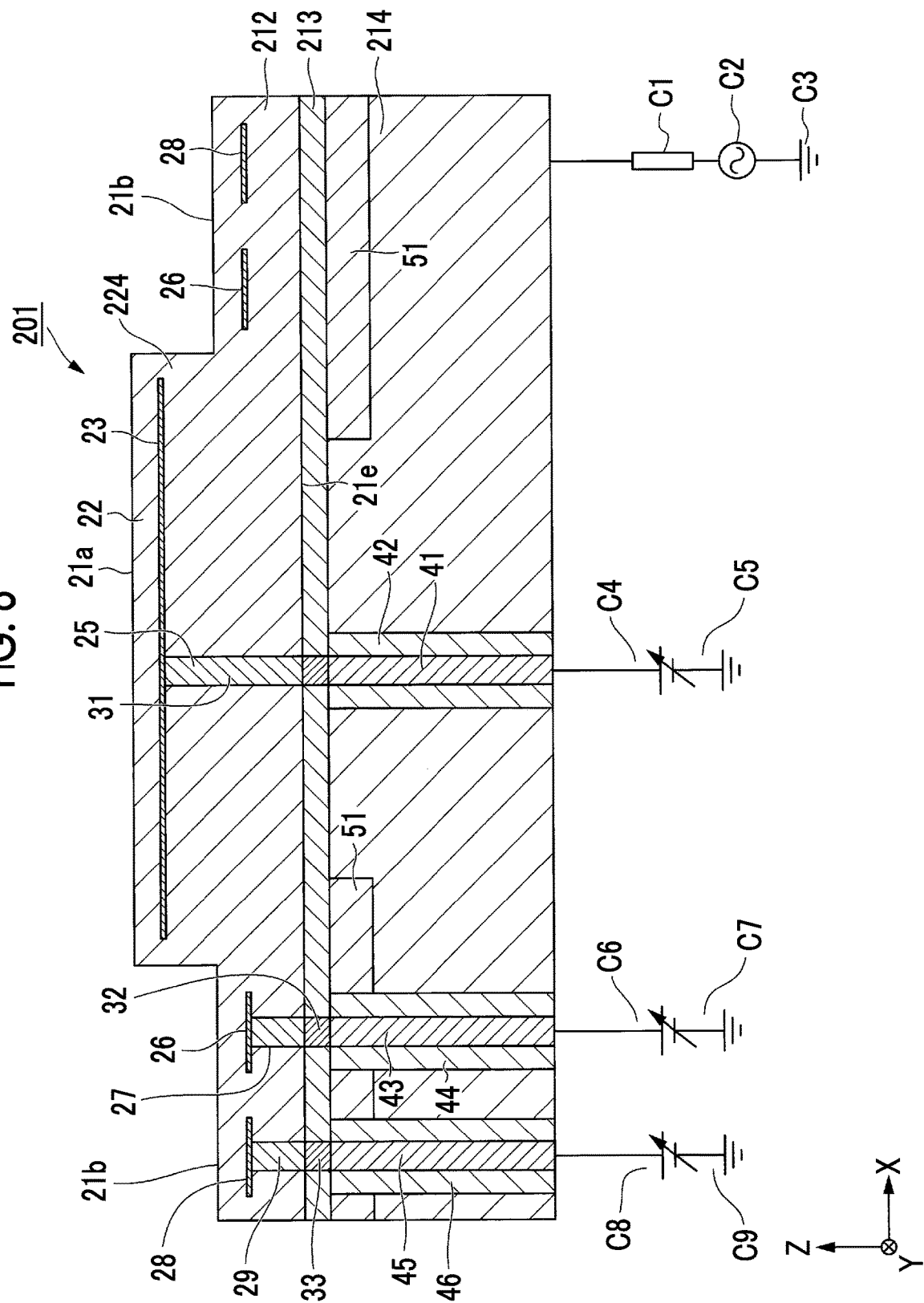
FIG. 6 is a sectional view showing an example of an electrostatic chuck device according to a second embodiment of the present invention.

FIG. 6 is a sectional view showing an example of the electrostatic chuck device 201 according to this embodiment. The electrostatic chuck device 201 includes an electrostatic chuck part 212, an insulating adhesive layer 213, a cooling base part 214, and a dielectric layer 51.

If the electrostatic chuck device 201 (FIG. 6) according to this embodiment is compared with the electrostatic chuck device 1 (FIG. 1) according to the first embodiment, the shapes of the electrostatic chuck part 212, the insulating adhesive layer 213, and the cooling base part 214 and the presence or absence of the dielectric layer 51 are different. Here, the functions of the other components are the same as those in the first embodiment. Description of the same functions as those in the first embodiment will be omitted, and in the second embodiment, description will be made focusing on portions different from those of the first embodiment.

An adhesion surface 21e which is the lower surface of a supporting plate 224 of the electrostatic chuck part 212 is a flat surface. The cooling base part 214 is provided with a recessed portion at the outer peripheral portion of the upper surface thereof. The dielectric layer 51 is provided in the recessed portion provided in the cooling base part 214. That is, the dielectric layer 51 is provided between the electrostatic chuck part 212 and the cooling base part 214. The dielectric layer 51 has a ring shape. The dielectric layer 51 has portions where the insulator 44 and the insulator 46 penetrate in the Z-axis direction at a part of the ring shape.

For the dielectric layer 51, a material having a lower dielectric constant than the electrostatic chuck part 212 is used. The dielectric constant is lowered, whereby in the electrostatic chuck device 201, it is possible to reduce the thickness of the dielectric layer 51, so that it is possible to suppress a decrease in the cooling performance of the cooling base part 214.

In a case where the dielectric layer is thick, compared to a case where the dielectric layer is not thick, there is a case where the cooling performance of the cooling base part 214 is lowered due to the dielectric layer being provided between the electrostatic chuck part 212 and the cooling base part 214. Here, since the capacitance of the dielectric layer is proportional to the dielectric constant of a dielectric and is inversely proportional to the thickness of the dielectric layer, if the dielectric constant of the dielectric is reduced, it is possible to reduce the thickness of the dielectric layer without changing the capacitance of the dielectric layer. In this embodiment, since the dielectric constant of the dielectric in the dielectric layer 51 is smaller than the dielectric constant of the electrostatic chuck part 212, it is possible to reduce the thickness without changing the capacitance.

The dielectric layer may be directly molded as a film obtained by spraying an alumina material onto the cooling base part 214 by thermal spraying or the like. The dielectric layer may be formed by attaching a ceramic sintered body to the cooling base part 214 with an adhesive or the like.

The insulating adhesive layer 213 attaches the cooling base part 214 and the dielectric layer 51 to the adhesion surface 21e that is the lower surface of the electrostatic chuck part 212.

The portion where the electrostatic chuck part 212 and the dielectric layer 51 overlap each other when the electrostatic chuck part 212 is viewed downward from above has smaller capacitance than the portion where the electrostatic chuck part 212 and the dielectric layer 51 do not overlap. For this reason, the sheath voltage above the portion which overlaps the dielectric layer 51 when the electrostatic chuck part 212 is viewed downward from above in the sample placing surface 21a is reduced.

In the electrostatic chuck part 212, by reducing the sheath voltage of the portion of the sample placing surface 21a, which is the portion which overlaps the dielectric layer 51 when the electrostatic chuck part 212 is viewed downward from above in the sample placing surface 21 and in which the density of the plasma-excited etching gas is high and the etching rate is high, it is possible to reduce the non-uniformity of the etching rate on the sample placing surface 21a.

The sheet resistance value of the electrode for wafer electrostatic attraction 23 is higher than $1.0\Omega/\square$ and lower than $1.0\times10^{10}\Omega/\square$. It is preferable that the sheet resistance value of the electrode for wafer electrostatic attraction 23 is higher than $2.0\Omega/\square$ and lower than $1.0\times10^{7}\Omega/\square$. If the sheet resistance value of the electrode for wafer electrostatic attraction 23 is lower than the lower limit value described above, an eddy current is generated in the electrode for wafer electrostatic attraction 23, and thus an equal potential can be formed. Due to the eddy current flowing through the electrode for wafer electrostatic attraction 23, there is a case where the effect of the dielectric layer 51 provided to reduce the non-uniformity of the etching rate on the sample placing surface 21a of the electrostatic chuck part 2 is not sufficiently obtained.

In the electrostatic chuck device 201, a value higher than the lower limit value described above is set as the sheet resistance value of the electrode for wafer electrostatic attraction 23, whereby it is possible to suppress the generation of the eddy current in the electrode for wafer electrostatic attraction 23. On the other hand, by making the sheet resistance value of the electrode for wafer electrostatic attraction 23 lower than the upper limit value described above, it is possible to maintain a good attraction characteristic.

(Summary)

As described above, the electrostatic chuck device 201 according to this embodiment includes the electrostatic chuck part 212, the cooling base part 214, the adhesive layer (the insulating adhesive layer 213), and the dielectric layer 51.

The dielectric layer 51 is provided between the electrostatic chuck part 212 and the cooling base part 214.

With this configuration, in the electrostatic chuck device 201 according to this embodiment, since the sheath voltage can be reduced by providing the dielectric layer 51 in the electrostatic chuck part 2 at a portion where the etching rate is high, it is possible to reduce the non-uniformity of etching on the sample placing surface of the electrostatic chuck part 212. In this embodiment, the non-uniformity of etching means that the etching rate becomes non-uniform.

Further, in the electrostatic chuck device 201 according to this embodiment, the sheet resistance value of the first electrode (the electrode for wafer electrostatic attraction 23) is higher than $1.0\Omega/\square$ and lower than $1.0\times10^{10}\Omega/\square$. It is preferable that the sheet resistance value of the first electrode (the electrode for wafer electrostatic attraction 23) is higher than $2.0\Omega/\square$ and lower than $1.0\times10^{7}\Omega/\square$. By making the sheet resistance value of the first electrode (the electrode for wafer electrostatic attraction 23) higher than the lower limit value described above, it is possible to suppress the generation of the eddy current in the electrode for wafer electrostatic attraction 23. For this reason, it is possible to reduce the non-uniformity of the etching rate on the sample placing surface of the electrostatic chuck part 212. On the other hand, by making the sheet resistance value of the first electrode (the electrode for wafer electrostatic attraction 23) lower than the upper limit value described above, it is possible to maintain a good attraction characteristic.

Further, the dielectric constant of the dielectric in the dielectric layer 51 is smaller than the dielectric constant of the electrostatic chuck part 212.

With this configuration, in the electrostatic chuck device 201 according to this embodiment, since it is possible to reduce the thickness of the dielectric layer 51, it is possible to suppress a decrease in cooling performance due to a decrease in heat transfer from the electrostatic chuck part 212 to the cooling base part 214. For this reason, in the electrostatic chuck device 201 according to this embodiment, it is possible to reduce the non-uniformity of the etching rate in the plane of the wafer due to non-uniform density of the etching gas and a non-uniform temperature in the etching on the sample placing surface of the electrostatic chuck part 212, while suppressing a decrease in the cooling performance of the sample placing surface 21a.

Further, by making the thermal conductivity of the dielectric layer 51 larger than the thermal conductivity of the electrostatic chuck part 212, it is possible to further suppress a decrease in cooling performance.

For example, in a case where the material of the electrostatic chuck part 212 is an $Al_2O_3$ material or an $Al_2O_3$—SiC material, an AlN material is preferable as the material of the dielectric layer 51.

In this embodiment, the case has been described where the plasma etching apparatus provided with the electrostatic chuck device 201 is a plasma etching apparatus in which the density of the plasma-excited etching gas per unit volume is smaller in the inner peripheral portion than in the outer peripheral portion. However, the electrostatic chuck device according to this embodiment may be provided in a plasma etching apparatus in which the density of the plasma-excited etching gas per unit volume is larger in the inner peripheral portion than in the outer peripheral portion. A case where the electrostatic chuck device is provided in a plasma etching apparatus in which the density of the excited etching gas per unit volume is larger in the inner peripheral portion than in the outer peripheral portion will be described with reference to FIG. 7.

Second Embodiment, First Modification Example

Figure 7:
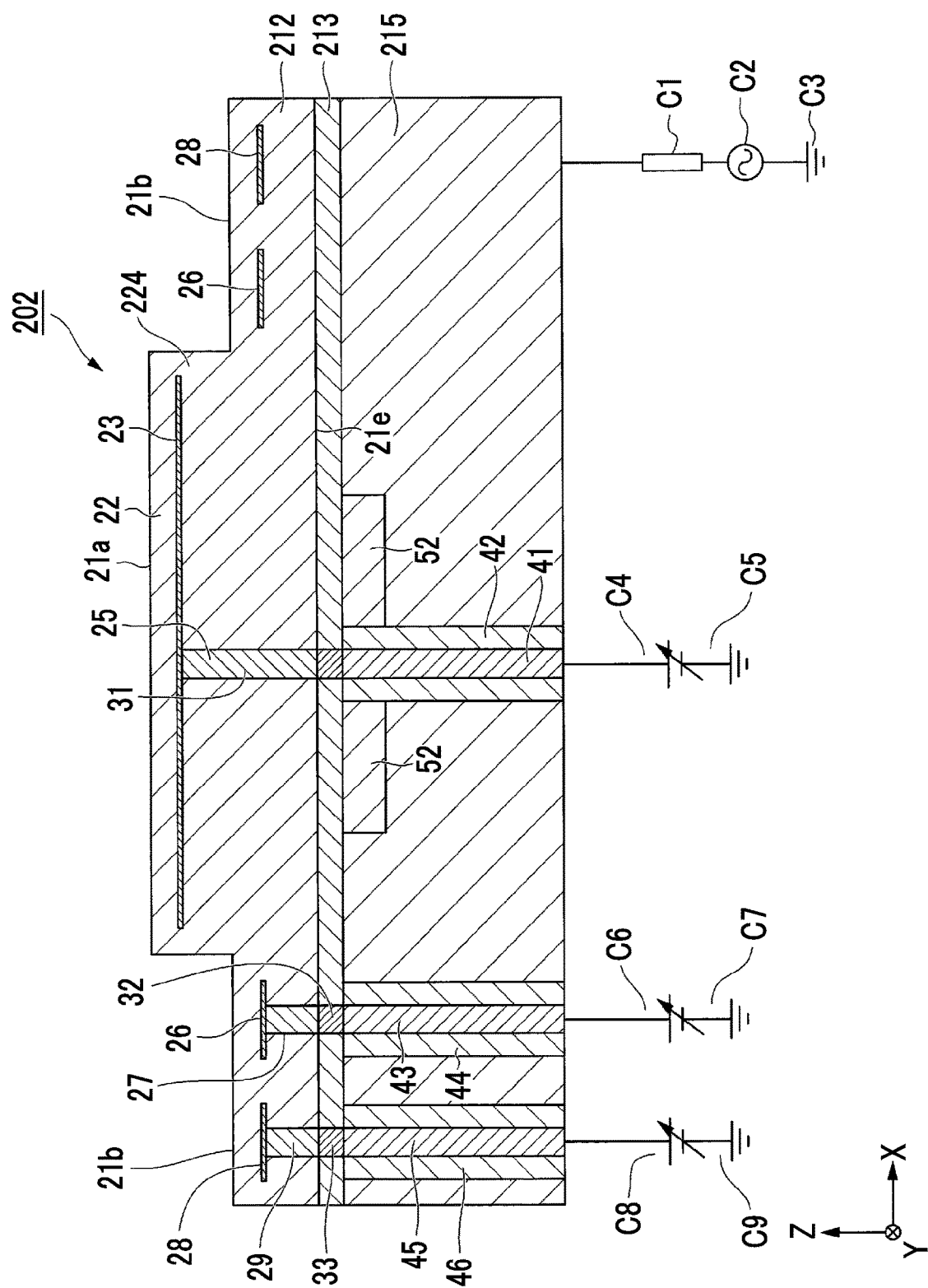
FIG. 7 is a sectional view showing a first modification example of the electrostatic chuck device according to the second embodiment of the present invention.

FIG. 7 is a sectional view showing a first modification example of the electrostatic chuck device 201 according to this embodiment. An electrostatic chuck device 202 includes the electrostatic chuck part 212, the insulating adhesive layer 213, and a cooling base part 215.

If the electrostatic chuck device 202 (FIG. 7) is compared with the electrostatic chuck device 201 (FIG. 6), the position where a dielectric layer 52 is provided is different. Here, the functions of the other components are the same as those in the electrostatic chuck device 201 (FIG. 6). Description of the same functions as those of the electrostatic chuck device 201 (FIG. 6) will be omitted, and description will be made focusing on portions different from those of the electrostatic chuck device 201 (FIG. 6).

The cooling base part 215 is provided with a recessed portion at an inner peripheral portion of the upper surface thereof. The dielectric layer 52 is provided in the recessed portion provided in the cooling base part 215. That is, the dielectric layer 52 is provided between the electrostatic chuck part 212 and the cooling base part 215. The dielectric layer 52 has a ring shape. The dielectric layer 52 has a portion where the insulator 42 penetrates in the Z-axis direction at a part of the ring shape.

The portion where the electrostatic chuck part 212 and the dielectric layer 52 overlap each other when the electrostatic chuck part 212 is viewed downward from above has smaller capacitance than the portion where the electrostatic chuck part 212 and the dielectric layer 52 do not overlap. For this reason, the sheath voltage of the sample placing surface 21a at the portion which overlaps the dielectric layer 52 when the electrostatic chuck part 212 is viewed downward from above in the sample placing surface 21a is reduced. In the electrostatic chuck part 212, in a case where the etching rate at the portion which overlaps the dielectric layer 52 when the electrostatic chuck part 212 is viewed downward from above in the sample placing surface 21a is high, the dielectric layer 52 is installed, whereby it is possible to reduce the non-uniformity of the etching rate on the sample placing surface 21a.

Third Embodiment

Hereinafter, a third embodiment of the present invention will be described in detail with reference to the drawings.

In the first embodiment, the case has been described where the electrostatic chuck device is provided with the electrostatic chuck part 2 having the recess and protrusion on the insulating adhesive layer side to adjust the capacitance of the electrostatic chuck part. In this embodiment, a case will be described where the electrostatic chuck device has a sample mounting surface adjustment electrode between the electrode for wafer electrostatic attraction and the cooling base part and adjusts the acceleration voltage of a power source for high frequency generation.

The electrostatic chuck device according to this embodiment is referred to as an electrostatic chuck device 301.

Figure 8:
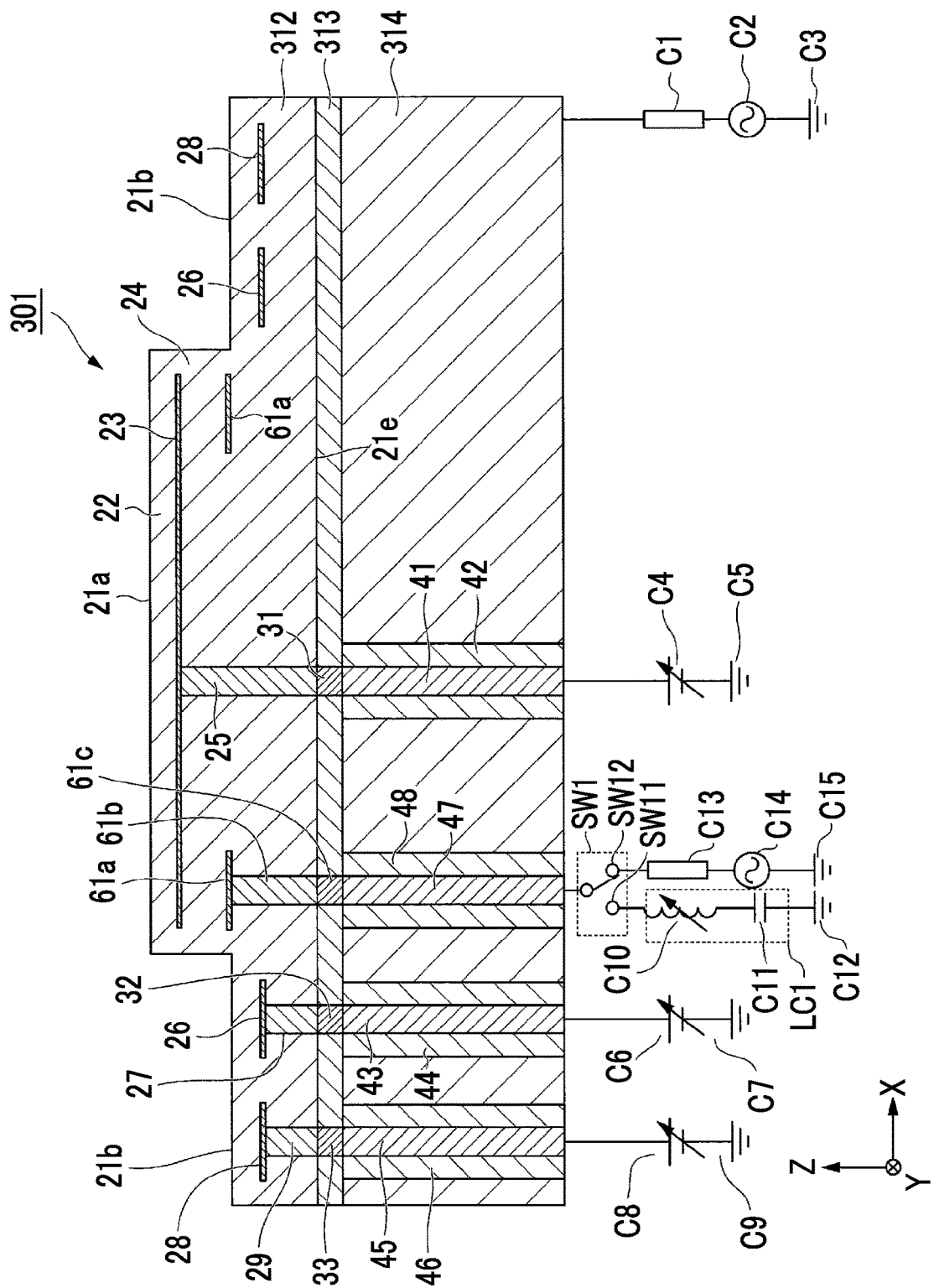
FIG. 8 is a sectional view showing an example of an electrostatic chuck device according to a third embodiment of the present invention.

FIG. 8 is a sectional view showing an example of the electrostatic chuck device 301 according to this embodiment. The electrostatic chuck device 301 includes an electrostatic chuck part 312, an insulating adhesive layer 313, and a cooling base part 314.

If the electrostatic chuck device 301 (FIG. 8) according to this embodiment is compared with the electrostatic chuck device 1 (FIG. 1) according to the first embodiment, the shapes of the electrostatic chuck part 312, the insulating adhesive layer 313, and the cooling base part 314 and the presence or absence of a sample mounting surface adjustment electrode 61a are different. Here, the functions of the other components are the same as those in the first embodiment. Description of the same functions as those in the first embodiment will be omitted, and in the third embodiment, description will be made focusing on portions different from those of the first embodiment.

The electrostatic chuck part 312 has the sample mounting surface adjustment electrode 61a in addition to the placing plate 22, the electrode for wafer electrostatic attraction 23, the supporting plate 24, the first electrode for FR electrostatic attraction 26, and the second electrode for FR electrostatic attraction 28.

The sample mounting surface adjustment electrode 61a is provided between the electrode for wafer electrostatic attraction 23 and the cooling base part 314 at the outer peripheral portion of the disk of the placing plate 22 of the electrostatic chuck part 312. That is, the electrostatic chuck device 301 has the sample mounting surface adjustment electrode 61a between the electrode for wafer electrostatic attraction 23 and the cooling base part 314. The sample mounting surface adjustment electrode 61a is a ring-shaped electrode.

The sheet resistance value of the sample mounting surface adjustment electrode 61a is lower than the sheet resistance value of the electrode for wafer electrostatic attraction 23.

By making the sheet resistance value of the sample mounting surface adjustment electrode 61a lower than the sheet resistance value of the electrode for wafer electrostatic attraction 23, it is possible to reduce the non-uniformity of the voltage applied to the sample mounting surface adjustment electrode 61a within the electrode, and the heat generation, particularly the heat generation in the vicinity of a conductive joining layer 61c where RF current density increases.

The insulating adhesive layer 313 has the conductive joining layer 61c in addition to the conductive adhesive layer 31, the conductive adhesive layer 32, and the conductive adhesive layer 33. The insulating adhesive layer 313 is formed to cover the periphery of the conductive joining layer 61c. The conductive joining layer 61c which is a joining layer (a joining part) having conductivity is formed of, for example, a brazing material. Since an RF current flows through the conductive joining layer 61c, it is preferable that the resistance value of the conductive joining layer 61c is lower than, for example, 1 mΩ to suppress heat generation of the conductive joining layer 61c.

The cooling base part 314 has an extraction electrode terminal 47 in addition to the extraction electrode terminal 41, the extraction electrode terminal 43, and the extraction electrode terminal 45. The cooling base part 314 is formed to cover the periphery of the extraction electrode terminal 47. The extraction electrode terminal 47 is covered with an insulator 48. The extraction electrode terminal 47 is provided so as to penetrate the cooling base part 314 in the Z-axis direction. The extraction electrode terminal 47 is insulated with respect to the cooling base part 314 made of metal by the insulator 48.

The extraction electrode terminal 47 has a rod shape and is configured to apply a high-frequency voltage to the sample mounting surface adjustment electrode 61a. The extraction electrode terminal 47 is connected to an electrode pin for sample mounting surface adjustment electrode 61b through the conductive joining layer 61c.

The extraction electrode terminal 47 is connected to a control terminal of a switch SW1. In a case where the switch SW1 is connected to a first terminal SW11, the extraction electrode terminal 47 is connected to an LC resonance circuit LC1. The extraction electrode terminal 47 is grounded by an earth C12 through the LC resonance circuit LC1. The LC resonance circuit LC1 includes a variable conductor C10 and a capacitor C11. The variable conductor C10 and the capacitor C11 are connected in series. In a case where the switch SW1 is connected to the first terminal SW11, the extraction electrode terminal 47 is connected to the variable conductor C10.

In a case where the switch SW1 is connected to a second terminal SW12, the extraction electrode terminal 47 is connected to a high-frequency power source C14 through a matching box C13. The extraction electrode terminal 47 is grounded by an earth C15 through the matching box C13 and the high-frequency power source C14.

A control circuit (not shown) switches whether the switch SW1 is connected to the first terminal SW11 or the second terminal SW12.

In a case where the switch SW1 is connected to the first terminal SW11, the control circuit (not shown) variably controls the magnitude of the voltage of the sample mounting surface adjustment electrode 61a by adjusting an L component of the LC resonance circuit LC1.

An RF current flowing through the cooling base part 314 flows through the variable conductor C10 and the capacitor C11, and therefore, the electrostatic chuck device 301 can relatively reduce the sheath voltage of the portion of the sample placing surface 21a at the portion which overlaps the sample mounting surface adjustment electrode 61a when the cooling base part 314 is viewed downward from above, compared to the sheath voltage of the portion which does not overlap the sample mounting surface adjustment electrode 61a.

Since the sheath voltage of the sample placing surface 21a at the portion which overlaps the sample mounting surface adjustment electrode 61a when the cooling base part 314 is viewed downward from above is reduced, the sheath voltage of the portion which overlaps the sample mounting surface adjustment electrode 61a when the electrostatic chuck part 312 is viewed downward from above in the sample placing surface 21a is reduced, and thus it is possible to reduce the non-uniformity of the etching rate on the sample placing surface 21a.

In a case where the switch SW1 is connected to the second terminal SW12, the control circuit (not shown) variably controls the magnitude of the voltage of the high-frequency power source C14 and a phase of the high-frequency power source C2.

In the electrostatic chuck device 301, the control circuit variably controls the magnitude of the voltage of the high-frequency power source C14, the phase of the voltage of the high-frequency power source C14, the magnitude of the voltage of the high-frequency power source C2, and the phase of the voltage of the high-frequency power source C2, whereby it is possible to control the magnitude and direction of the sheath voltage of the sample placing surface 21a and the structure installation surface 21b.

In the electrostatic chuck device 301, it is also possible to make the sheath voltage of the portion overlapping the sample mounting surface adjustment electrode 61a in the sample placing surface 21a larger than the magnitude of the sheath voltage of the portion which does not overlap the sample mounting surface adjustment electrode, and it is also possible to make the sheath voltage of the portion overlapping the sample mounting surface adjustment electrode 61a smaller than the magnitude of the sheath voltage of the portion which does not overlap the sample mounting surface adjustment electrode 61a. The high-frequency power source C2 and the high-frequency power source C14 may be a common power source or may be independent power sources.

The matching box C13 includes a capacitor and a coil. The matching box C13 is an impedance matching device and matches the impedance between the high-frequency power source C14 on the input side and the sample mounting surface adjustment electrode 61a on the output side.

In this embodiment, the case where the high-frequency power source C14 and the LC resonance circuit LC1 are provided in the electrostatic chuck device 301 has been described. However, the electrostatic chuck device 301 may not be provided with the LC resonance circuit LC1. In that case, the extraction electrode terminal 47 is connected to the matching box C13 without the switch SW1 intervention.

(Summary)

As described above, the electrostatic chuck device 301 according to this embodiment includes the electrostatic chuck part 312, the cooling base part 314, the adhesive layer (the insulating adhesive layer 313), and a second electrode (the sample mounting surface adjustment electrode 61a).

The electrostatic chuck device 301 has the second electrode (the sample mounting surface adjustment electrode 61a) between the first electrode (the electrode for wafer electrostatic attraction 23) and the cooling base part 314.

With this configuration, in the electrostatic chuck device 301 according to this embodiment, since the sheath voltage can be reduced, it is possible to reduce the non-uniformity of etching on the sample placing surface 21a of the electrostatic chuck part 312. In this embodiment, the non-uniformity of etching means that the etching rate and direction become non-uniform.

Further, in the electrostatic chuck device 301 according to this embodiment, the sheet resistance value of the first electrode (the electrode for wafer electrostatic attraction 23) is higher than $1.0\Omega/\square$ and lower than $1.0\times10^{10}\Omega/\square$. It is preferable that the sheet resistance value of the first electrode (the electrode for wafer electrostatic attraction 23) is higher than $2.0\Omega/\square$ and lower than $1.0\times10^{7}\Omega/\square$. By making the sheet resistance value of the first electrode (the electrode for wafer electrostatic attraction 23) higher than the lower limit value described above, it is possible to suppress the generation of the eddy current in the electrode for wafer electrostatic attraction 23, and it is possible to reduce the non-uniformity of the etching rate on the sample placing surface 21a of the electrostatic chuck part 312 without reducing the effect of the sample mounting surface adjustment electrode 61a. On the other hand, by making the sheet resistance value of the first electrode (the electrode for wafer electrostatic attraction 23) lower than the upper limit value described above, it is possible to maintain a good attraction characteristic.

Further, the second electrode (the sample mounting surface adjustment electrode 61a) is grounded through a variable conductor.

With this configuration, an RF current flowing through the cooling base part 314 can flow through the variable conductor C10 and the capacitor C11, and therefore, it is possible to adjust the RF acceleration voltage of the cooling base part 314. For this reason, in the electrostatic chuck device 301 according to this embodiment, it is possible to reduce the non-uniformity of etching on the sample placing surface 21a of the electrostatic chuck part 312.

Further, the sheet resistance value of the second electrode (the sample mounting surface adjustment electrode 61a) is lower than the sheet resistance value of the first electrode (the electrode for wafer electrostatic attraction 23).

With this configuration, it is possible to suppress non-uniformity of the potential in the second electrode (the sample mounting surface adjustment electrode 61a) or heat generation in the electrode part. For this reason, in the electrostatic chuck device 301 according to this embodiment, it is possible to reduce the non-uniformity of etching on the sample placing surface 21a of the electrostatic chuck part 312.

Further, the cooling base part 314 is connected to the high-frequency power source C2 through the matching box C1 which includes a capacitor and a coil, and the magnitude of the voltage of the high-frequency power source C2 to which the cooling base part 314 is connected and the phase of the voltage of the high-frequency power source C2, and the magnitude of the voltage of the high-frequency power source C14 to which the second electrode (the sample mounting surface adjustment electrode 61a) is connected and the phase of the voltage of the high-frequency power source C14 are adjusted.

With this configuration, the state of the in-plane sheath voltage on the sample placing surface 21a of the electrostatic chuck part 312 can be adjusted up and down. Here, the state of the sheath voltage being adjusted up or down means that the sheath voltage is adjusted by increasing or decreasing it.

Third Embodiment, First Modification Example

Figure 9:
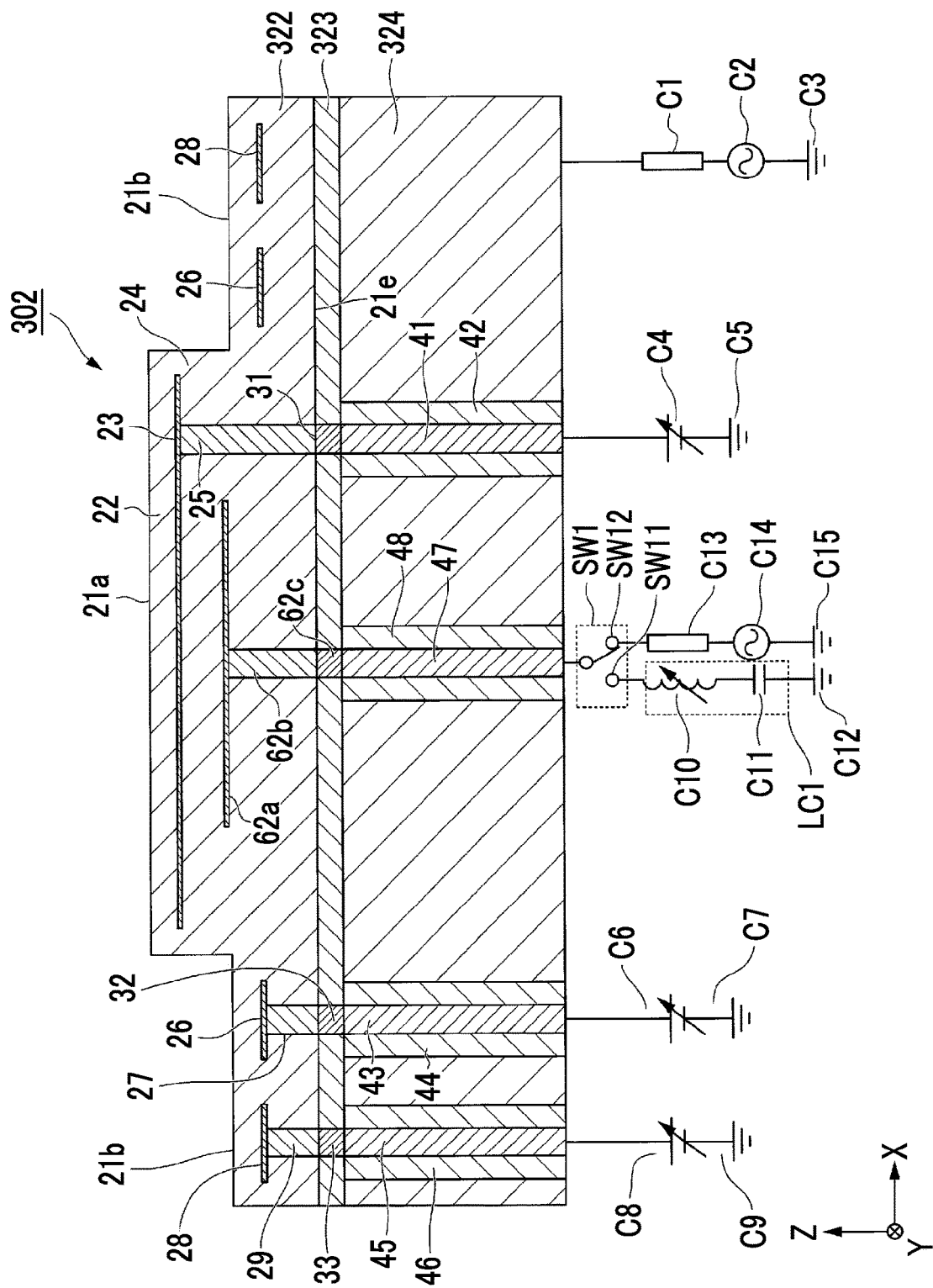
FIG. 9 is a sectional view showing a first modification example of the electrostatic chuck device according to the third embodiment of the present invention.

FIG. 9 is a sectional view showing a first modification example of the electrostatic chuck device 301 according to this embodiment. An electrostatic chuck device 302 includes an electrostatic chuck part 322, an insulating adhesive layer 323, and a cooling base part 324.

If the electrostatic chuck device 302 (FIG. 9) is compared with the electrostatic chuck device 301 (FIG. 8), the position where a sample mounting surface adjustment electrode 62a is provided in the electrostatic chuck part 322 and the position of the electrode pin for wafer electrostatic attraction 25 are different. The sample mounting surface adjustment electrode 62a is provided at the inner peripheral portion of the electrostatic chuck part 322, whereby the electrode pin for wafer electrostatic attraction 25 is provided at the outer peripheral portion of the electrostatic chuck part 322. Here, the functions of the other components are the same as those of the electrostatic chuck device 301 (FIG. 8). Description of the same functions as those of the electrostatic chuck device 301 (FIG. 8) will be omitted, and description will be made focusing on portions different from those of the electrostatic chuck device 301 (FIG. 8).

The sample mounting surface adjustment electrode 62a is provided between the electrode for wafer electrostatic attraction 23 and the cooling base part 324 at the inner peripheral portion of the disk of the placing plate 22 of the electrostatic chuck part 322. That is, the sample mounting surface adjustment electrode 62a is provided in the interior of the electrostatic chuck part 322. The sample mounting surface adjustment electrode 62a is a disk-shaped electrode.

Since the sample mounting surface adjustment electrode 62a is provided in the interior of the electrostatic chuck part 322, it is possible to install the sample mounting surface adjustment electrode 62a while maintaining the general structure of the electrostatic chuck part 322.

In a case where the switch SW1 is connected to the second terminal SW12, the electrostatic chuck device 302 can reduce the voltage of the cooling base part 324. The sheath voltage of the sample placing surface 21a at the portion which overlaps the sample mounting surface adjustment electrode 62a when the electrostatic chuck part 322 is viewed downward from above in the sample placing surface 21a is relatively reduced, and thus it is possible to reduce the non-uniformity of the etching rate on the sample placing surface 21a.

Further, the second electrode (the sample mounting surface adjustment electrode 62a) is connected to the high-frequency power source C14 through the matching box C13 which includes a capacitor and a coil.

With this configuration, the phases and voltages of the high-frequency power source C2 and the high-frequency power source C14 are adjusted, so that it is possible to adjust the sheath voltage of the sample placing surface 21a at the portion overlapping the second electrode (the sample mounting surface adjustment electrode 62a).

The second electrode (the sample mounting surface adjustment electrode 62a) is provided in the interior of the electrostatic chuck part 322.

With this configuration, it is possible to install the second electrode (the sample mounting surface adjustment electrode 62a) while maintaining the general structure of the electrostatic chuck part 322.

Third Embodiment, Second Modification Example

Figure 10:
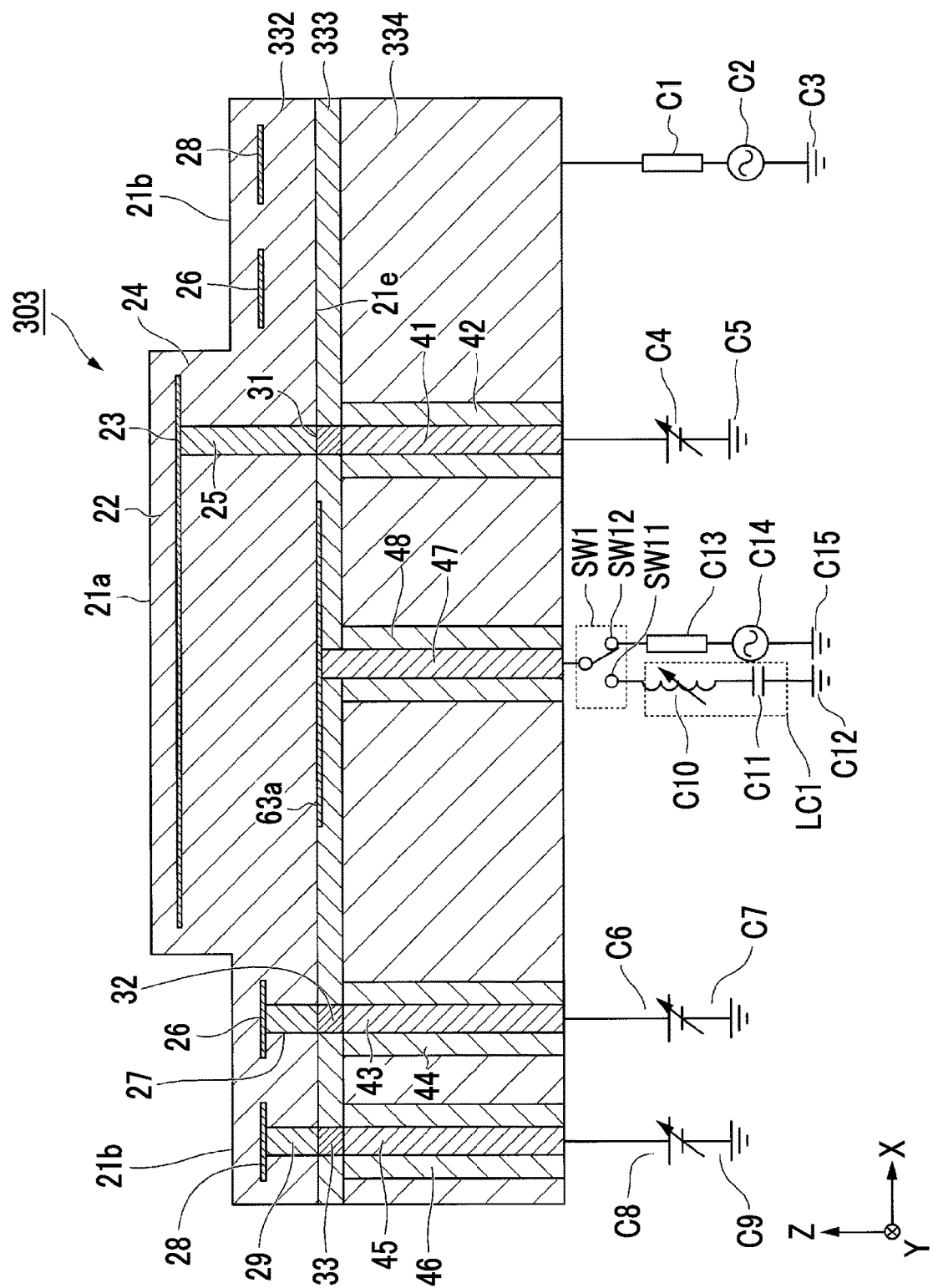
FIG. 10 is a sectional view showing a second modification example of the electrostatic chuck device according to the third embodiment of the present invention.

FIG. 10 is a sectional view showing a second modification example of the electrostatic chuck device 301 according to this embodiment. An electrostatic chuck device 303 includes an electrostatic chuck part 332, an insulating adhesive layer 333, and a cooling base part 334.

If the electrostatic chuck device 303 (FIG. 10) is compared with the electrostatic chuck device 302 (FIG. 9), the position where a sample mounting surface adjustment electrode 63a is provided is different. Here, the functions of the other components are the same as those of the electrostatic chuck device 302 (FIG. 9). Description of the same functions as those of the electrostatic chuck device 302 (FIG. 9) will be omitted, and description will be made focusing on portions different from those of the electrostatic chuck device 302 (FIG. 9).

The sample mounting surface adjustment electrode 63a is provided between the electrostatic chuck part 332 and the cooling base part 334. The sample mounting surface adjustment electrode 63a is provided at the inner peripheral portion of the disk of the electrostatic chuck part 332 when the electrostatic chuck part 332 is viewed downward from above. The sample mounting surface adjustment electrode 63a a disk-shaped electrode.

The sample mounting surface adjustment electrode 63a is bonded to the adhesion surface 21e which is the lower surface of the electrostatic chuck part 332. The sample mounting surface adjustment electrode 63a is, for example, a metal foil electrode. In addition to the insulating adhesive layer 333, a polyimide sheet (not shown) is interposed between the sample mounting surface adjustment electrode 63a and the cooling base part 334, whereby the sample mounting surface adjustment electrode 63a is insulated from the cooling base part 334.

In a case where the sample mounting surface adjustment electrode 63a is provided on the lower surface of the electrostatic chuck part 332, the installation of the sample mounting surface adjustment electrode 63a is easy compared to a case where the sample mounting surface adjustment electrode 63a is provided in the interior of the electrostatic chuck part 332. Further, the sample mounting surface adjustment electrode is provided, whereby there is a case where the thickness of the electrostatic chuck part 332 is increased. However, in a case where the sample mounting surface adjustment electrode 63a is provided on the lower surface of the electrostatic chuck part 332, the thickness of the electrostatic chuck part 332 can be reduced compared to a case where the sample mounting surface adjustment electrode 63a is provided in the interior of the electrostatic chuck part 332.

The second electrode (the sample mounting surface adjustment electrode 63a) is provided between the electrostatic chuck part and the cooling base part.

With this configuration, it is possible to easily install the second electrode (the sample mounting surface adjustment electrode 63a), and it is possible to reduce the thickness of the electrostatic chuck part 332. For this reason, in the electrostatic chuck device 303 according to this embodiment, in a case of reducing the non-uniformity of etching on the sample placing surface of the electrostatic chuck part 332, it is possible to easily install the second electrode (the sample mounting surface adjustment electrode 63a) having the effect of adjusting the sheath voltage on the sample placing surface.

In this embodiment, the case where a single sample mounting surface adjustment electrode 63a is provided has been described as an example. However, a plurality of sample mounting surface adjustment electrodes 63a may be provided. The case where a plurality of sample mounting surface adjustment electrodes 63a are provided will be described later with reference to FIG. 14.

Fourth Embodiment

Hereinafter, a fourth embodiment of the present invention will be described in detail with reference to the drawings.

In the third embodiment, the case has been described where the electrostatic chuck device has the sample mounting surface adjustment electrode between the electrode for wafer electrostatic attraction and the cooling base part to adjust the acceleration voltage of the power source for high frequency generation. In this embodiment, a case will be described where the electrostatic chuck device has an FR mounting surface adjustment electrode between the structure installation surface and the cooling base part to adjust the acceleration voltage of the power source for high frequency generation.

The electrostatic chuck device according to this embodiment is referred to as an electrostatic chuck device 401.

Figure 11:
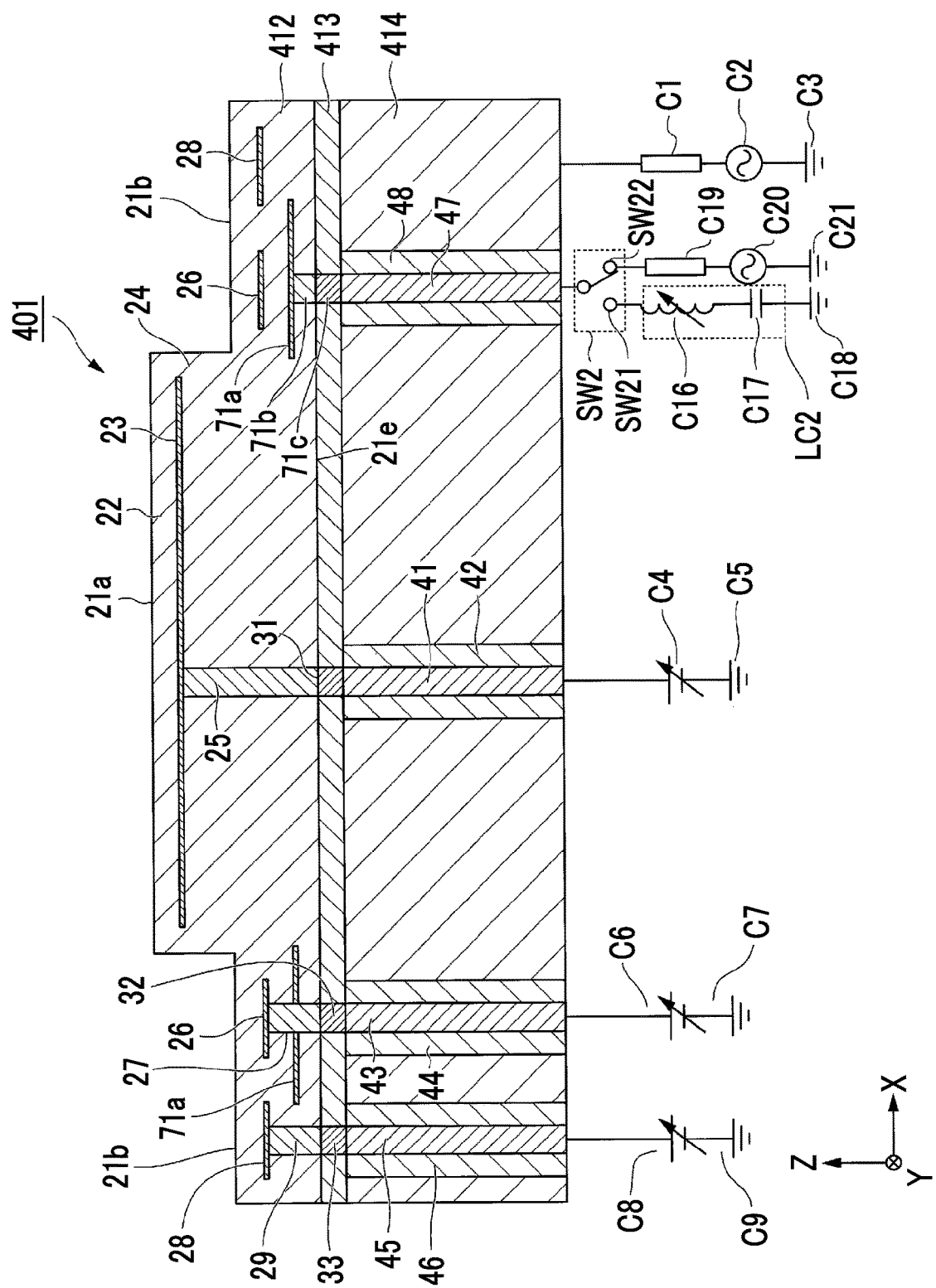
FIG. 11 is a sectional view showing an example of an electrostatic chuck device according to a fourth embodiment of the present invention.

FIG. 11 is a sectional view showing an example of the electrostatic chuck device 401 according to this embodiment.

The electrostatic chuck device 401 includes an electrostatic chuck part 412, an insulating adhesive layer 413, and a cooling base part 414.

If the electrostatic chuck device 401 (FIG. 11) according to this embodiment is compared with the electrostatic chuck device 301 (FIG. 8) according to the third embodiment, the shapes of the electrostatic chuck part 412, the insulating adhesive layer 413, and the cooling base part 414, and an FR mounting surface adjustment electrode 71a being provided instead of the sample mounting surface adjustment electrode 61a are different. Here, the functions of the other components are the same as those in the third embodiment. Description of the same functions as those in the third embodiment will be omitted, and in the fourth embodiment, description will be made focusing on portions different from those of the third embodiment.

The electrostatic chuck part 412 has the FR mounting surface adjustment electrode 71a in addition to the placing plate 22, the electrode for wafer electrostatic attraction 23, the supporting plate 24, the first electrode for FR electrostatic attraction 26, and the second electrode for FR electrostatic attraction 28.

The FR mounting surface adjustment electrode 71a is provided in the interior of the electrostatic chuck part 412 in the structure installation surface 21b of the electrostatic chuck part 412. The FR mounting surface adjustment electrode 71a is provided between the first electrode for FR electrostatic attraction 26 and the cooling base part 414. That is, the electrostatic chuck device 401 has the FR mounting surface adjustment electrode 71a between the structure installation surface 21b and the cooling base part 414. Further, the FR mounting surface adjustment electrode 71a is provided in the interior of the electrostatic chuck part 412.

The FR mounting surface adjustment electrode 71a is a ring-shaped electrode. The FR mounting surface adjustment electrode 71a is provided between the first electrode for FR electrostatic attraction 26 and the second electrode for FR electrostatic attraction 28, and the insulating adhesive layer 413. The FR mounting surface adjustment electrode 71a is electrically insulated from the first electrode for FR electrostatic attraction 26 and the second electrode for FR electrostatic attraction 28.

The insulating adhesive layer 413 has a conductive joining layer 71c in addition to the conductive adhesive layer 31, the conductive adhesive layer 32, and the conductive adhesive layer 33. The insulating adhesive layer 413 has the conductive joining layer 71c, which is a joining layer (a joining part) having conductivity, below the FR mounting surface adjustment electrode 71a at the portion which overlaps the structure installation surface 21b when the insulating adhesive layer 413 is viewed downward from above. The insulating adhesive layer 413 is formed to cover the periphery of the conductive joining layer 71c. The conductive joining layer 71c is formed of, for example, a brazing material.

The cooling base part 414 has the extraction electrode terminal 47 in addition to the extraction electrode terminal 41, the extraction electrode terminal 43, and the extraction electrode terminal 45. The cooling base part 414 is formed to cover the periphery of the extraction electrode terminal 47.

The extraction electrode terminal 47 is covered with the insulator 48. The extraction electrode terminal 47 is provided so as to penetrate the cooling base part 414 in the Z-axis direction. The extraction electrode terminal 47 is insulated with respect to the cooling base part 414 made of metal by the insulator 48.

The extraction electrode terminal 47 has a rod shape and is configured to apply a high-frequency voltage to the sample mounting surface adjustment electrode 71a. The extraction electrode terminal 47 is connected to an electrode pin for FR mounting surface adjustment electrode 71b through the conductive joining layer 71c.

The extraction electrode terminal 47 is connected to a control terminal of a switch SW2. In a case where the switch SW2 is connected to a first terminal SW21, the extraction electrode terminal 47 is connected to an LC resonance circuit LC2. The extraction electrode terminal 47 is grounded by an earth C18 through the LC resonance circuit LC2. The LC resonance circuit LC2 includes a variable conductor C16 and a capacitor C17.

The variable conductor C16 and the capacitor C17 are connected in series. In a case where the switch SW2 is connected to the first terminal SW21, the extraction electrode terminal 47 is connected to the variable conductor C16.

In a case where the switch SW2 is connected to a second terminal SW22, the extraction electrode terminal 47 is connected to a high-frequency power source C20 through a matching box C19. The extraction electrode terminal 47 is grounded by an earth C21 through the matching box C19 and the high-frequency power source C20.

A control circuit (not shown) switches whether the switch SW2 is connected to the first terminal SW21 or the second terminal SW22.

The matching box C19 includes a capacitor and a coil. The matching box C19 is an impedance matching device and matches the impedance between the high-frequency power source C20 on the input side and the FR mounting surface adjustment electrode 71a on the output side.

In a case where the switch SW2 is connected to the first terminal SW21, the control circuit (not shown) variably controls the magnitude of the voltage of the FR mounting surface adjustment electrode 71a by adjusting the L component of the LC resonance circuit LC2.

Since the RF current flowing through the cooling base part 414 flows through the variable conductor C16 and the capacitor C17, the electrostatic chuck device 401 can reduce the sheath voltage of the structure installation surface 21b at the portion which overlaps the FR mounting surface adjustment electrode 71a when the cooling base part 414 is viewed downward from above.

Since the RF acceleration voltage of the portion which overlaps the FR mounting surface adjustment electrode 71a when the cooling base part 414 is viewed downward from above is reduced, it is possible to reduce the sheath voltage of the structure installation surface 21b at the portion which overlaps the FR mounting surface adjustment electrode 71a when the electrostatic chuck part 412 is viewed downward from above in the structure installation surface 21b.

In a case where the switch SW2 is connected to the second terminal SW22, the control circuit (not shown) variably controls the magnitude of the voltage of the high-frequency power source C20.

The electrostatic chuck device 401 causes the control circuit to variably control the magnitude of the voltage of the high-frequency power source C20, the phase of the voltage of the high-frequency power source C2, and the magnitude and phase of the voltage of the high-frequency power source C2, whereby it is possible to control the magnitude and direction of the sheath voltage of the structure installation surface 21b at the portion which overlaps the FR mounting surface adjustment electrode 71a when the cooling base part 414 is viewed downward from above. In the electrostatic chuck device 401, the sheath voltage which is applied to the structure installation surface 21b can be increased or decreased by adjusting the voltages and phases of the high-frequency power sources C2 and C20.

The high-frequency power source C2 and the high-frequency power source C20 may be a common power source or may be independent power sources.

In this embodiment, the case where the high-frequency power source C20 and the LC resonance circuit LC2 are provided in the electrostatic chuck device 401 has been described. However, the electrostatic chuck device 401 may not be provided with the LC resonance circuit LC2. In that case, the extraction electrode terminal 47 is connected to the matching box C19 without the switch SW2 intervention.

In this embodiment, the case where the FR mounting surface adjustment electrode 71a is provided in the interior of the electrostatic chuck part 412 has been described as an example. However, the position where the FR mounting surface adjustment electrode 71a is provided is not limited to the interior of the electrostatic chuck part 412. The FR mounting surface adjustment electrode 71a may be provided, for example, between the adhesion surface 21e which is the lower surface of the electrostatic chuck part 412 and the insulating adhesive layer 413. That is, the FR mounting surface adjustment electrode 71a may be provided between the electrostatic chuck part 412 and the cooling base part 414. A specific example in a case where the FR mounting surface adjustment electrode 71a is provided between the electrostatic chuck part 412 and the cooling base part 414 will be described later with reference to FIG. 13.

Fourth Embodiment, First Modification Example

Figure 12:
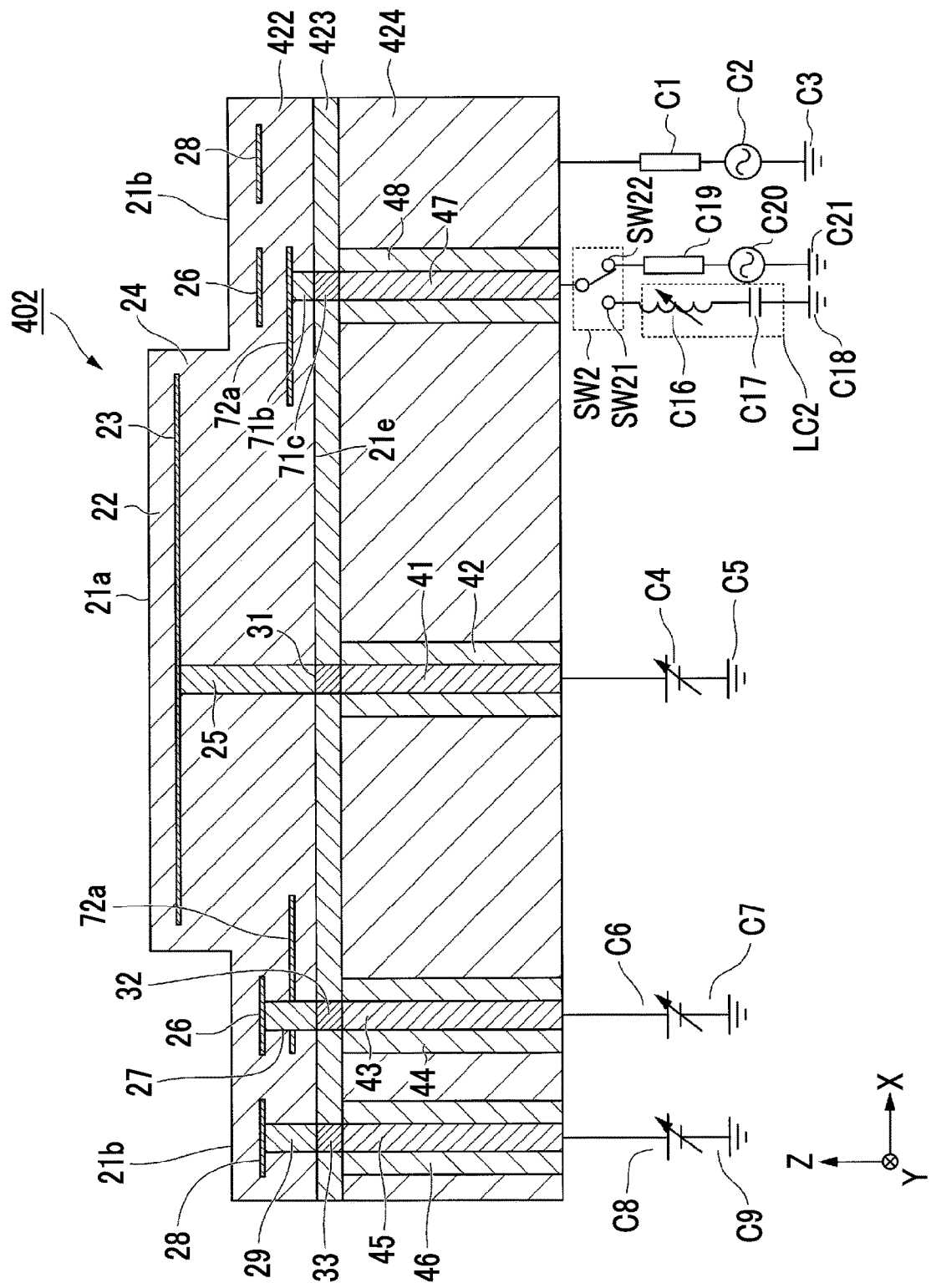
FIG. 12 is a sectional view showing a first modification example of the electrostatic chuck device according to the fourth embodiment of the present invention.

FIG. 12 is a sectional view showing a first modification example of the electrostatic chuck device 401 according to this embodiment. An electrostatic chuck device 402 includes an electrostatic chuck part 422, an insulating adhesive layer 423, and a cooling base part 424.

If the electrostatic chuck device 402 (FIG. 12) according to this modification example is compared with the electrostatic chuck device 401 (FIG. 11) according to the fourth embodiment, the method of installing an FR mounting surface adjustment electrode 72a is different. Here, the functions of the other components are the same as those in the fourth embodiment. Description of the same functions as those in the fourth embodiment will be omitted, and in this modification example, description will be made focusing on portions different from those of the fourth embodiment.

The electrostatic chuck part 422 has the FR mounting surface adjustment electrode 72a in addition to the placing plate 22, the electrode for wafer electrostatic attraction 23, the supporting plate 24, the first electrode for FR electrostatic attraction 26, and the second electrode for FR electrostatic attraction 28.

The FR mounting surface adjustment electrode 72a is provided in the interior of the electrostatic chuck part 422 in the structure installation surface 21b of the electrostatic chuck part 422. The FR mounting surface adjustment electrode 72a straddles the sample placing surface 21a and the structure installation surface 21b in a direction parallel to the sample placing surface 21a. The FR mounting surface adjustment electrode 72a is a ring-shaped electrode. The FR mounting surface adjustment electrode 72a has a portion which overlaps a part of the electrode for wafer electrostatic attraction 23 and a part of the first electrode for FR electrostatic attraction 26.

In a case where the switch SW2 is connected to the first terminal SW21, the control circuit (not shown) variably controls the magnitude of the voltage of the FR mounting surface adjustment electrode 72a by adjusting the L component of the LC resonance circuit LC2. Since the RF current flowing through the cooling base part 424 flows through the LC resonance circuit LC2, the electrostatic chuck device 402 can adjust the sheath voltage of the structure installation surface 21b and the sheath voltage of the sample placing surface 21a at the portion which overlaps the FR mounting surface adjustment electrode 72a when the cooling base part 424 is viewed downward from above.

In a case where the switch SW2 is connected to the second terminal SW22, the control circuit (not shown) variably controls the magnitude of the voltage of the high-frequency power source C20.

The electrostatic chuck device 402 causes the control circuit to variably control the magnitude of the voltage of the high-frequency power source C20, the phase of the voltage of the high-frequency power source C20 with respect to the phase of the voltage of the high-frequency power source C2, and the magnitude of the voltage of the high-frequency power source C2, whereby it is possible to adjust the RF acceleration voltage of the portion which overlaps the FR mounting surface adjustment electrode 72a when the cooling base part 424 is viewed downward from above.

In the electrostatic chuck device 402, it is also possible to increase or decrease the magnitudes of the sheath voltage of the structure installation surface 21b and the sheath voltage of the sample placing surface 21a at the portion which overlaps the FR mounting surface adjustment electrode 72a when the cooling base part 424 is viewed downward from above. The high-frequency power source C2 and the high-frequency power source C20 may be a common power source or may be independent power sources.

The electrostatic chuck device 402 can adjust the sheath voltage of the structure installation surface 21b and the sheath voltage of the sample placing surface 21a at the portion which overlaps the FR mounting surface adjustment electrode 72a when the cooling base part 424 is viewed downward from above.

In a case where the FR mounting surface adjustment electrode 72a is not provided, there is a case where at the outer peripheral portion of the sample placing surface 21a when the electrostatic chuck part 422 is viewed downward from above, the electric field in the electrostatic chuck part 422 is inclined from the downward direction perpendicular to the sample placing surface 21a toward the structure installation surface 21b. The electrostatic chuck device 402 is provided with the FR mounting surface adjustment electrode 72a, whereby the direction of the inclined electric field of the sheath voltage on the sample placing surface 21a and the structure installation surface 21b of the electrostatic chuck part 422 can be adjusted to the downward direction perpendicular to the sample placing surface 21a.

In the electrostatic chuck device 402, it is possible to adjust the direction of the inclined electric field at the outer peripheral portion of the sample placing surface 21a to the downward direction perpendicular to the sample placing surface 21a within the electrostatic chuck part 422, and therefore, it is possible to adjust the magnitude and direction of the sheath voltage above the portion which overlaps the FR mounting surface adjustment electrode 72a when the electrostatic chuck part 412 is viewed downward from above in the structure installation surface 21b.

Fourth Embodiment, Second Modification Example

Figure 13:
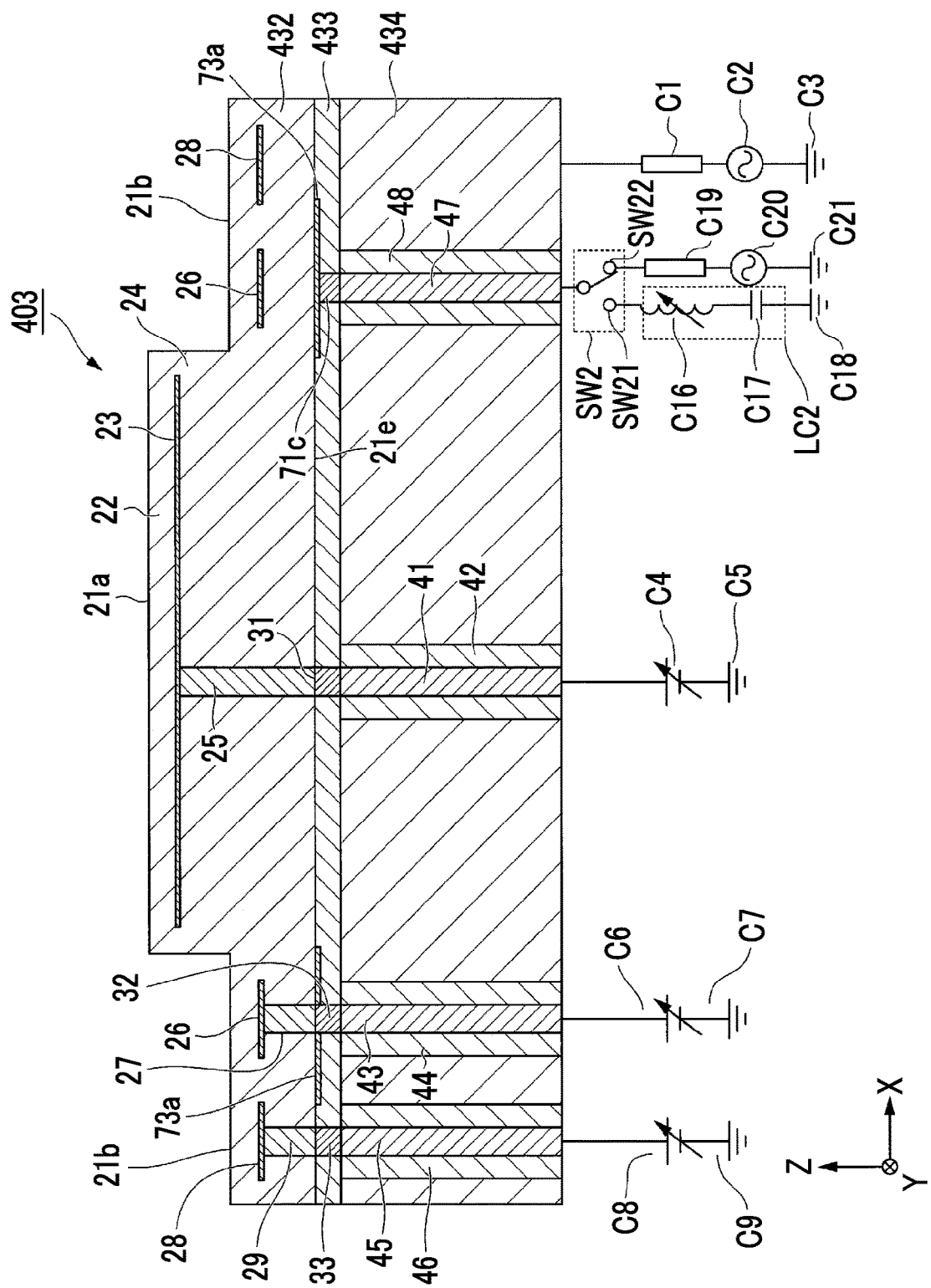
FIG. 13 is a sectional view showing a second modification example of the electrostatic chuck device according to the fourth embodiment of the present invention.

FIG. 13 is a sectional view showing a second modification example of the electrostatic chuck device 401 according to this embodiment. An electrostatic chuck device 403 includes an electrostatic chuck part 432, an insulating adhesive layer 433, and a cooling base part 434.

If the electrostatic chuck device 403 (FIG. 13) according to this modification example is compared with the electrostatic chuck device 401 (FIG. 11) according to the fourth embodiment, the electrostatic chuck device 403 is difference from the electrostatic chuck device 401 in that an FR mounting surface adjustment electrode 73a is provided between the electrostatic chuck part 432 and the cooling base part 434. Here, the functions of the other components are the same as those in the fourth embodiment. Description of the same functions as those in the fourth embodiment will be omitted, and in this modification example, description will be made focusing on portions different from those of the fourth embodiment.

The FR mounting surface adjustment electrode 73a is bonded to the adhesion surface 21e which is the lower surface of the electrostatic chuck part 432. The FR mounting surface adjustment electrode 73a is, for example, a metal foil electrode. In addition to the insulating adhesive layer 433, a polyimide sheet (not shown) is interposed between the FR mounting surface adjustment electrode 73a and the cooling base part 434, whereby the FR mounting surface adjustment electrode 73a is insulated from the cooling base part 434.

In a case where the FR mounting surface adjustment electrode 73a is provided on the lower surface of the electrostatic chuck part 432, the installation of the FR mounting surface adjustment electrode 73a is easy compared to a case where the FR mounting surface adjustment electrode 73a is provided in the interior of the electrostatic chuck part 432. Further, the FR mounting surface adjustment electrode is provided, whereby there is a case where the thickness of the electrostatic chuck part 432 is increased. However, in a case where the FR mounting surface adjustment electrode 73a is provided on the lower surface of the electrostatic chuck part 432, the thickness of the electrostatic chuck part 432 can be thinned compared to a case where the FR mounting surface adjustment electrode 73a is provided in the interior of the electrostatic chuck part 432. For this reason, the permeability when the high-frequency current applied to the cooling base part 434 propagates through the electrostatic chuck part 432 is also improved.

In this embodiment, the case where a single FR mounting surface adjustment electrode 71a or a single FR mounting surface adjustment electrode 72a is provided has been described as an example. However, a plurality of FR mounting surface adjustment electrodes 71a or a plurality of FR mounting surface adjustment electrodes 72a may be provided.

FIG. 14 is a table showing an example of a combination of the sample mounting surface adjustment electrode of the third embodiment and the FR mounting surface adjustment electrode according to this embodiment. In the table of FIG. 14, the symbol "○" indicates that a single or a plurality of electrodes shown in the same row as the symbol "○" is provided in the electrostatic chuck device. The symbol "x" indicates that a single or a plurality of electrodes shown in the same row as the symbol "○" is not provided in the electrostatic chuck device.

A wafer mounting portion indicates a case where the sample mounting surface adjustment electrode is provided in the portion which overlaps the sample placing surface 21a when the electrostatic chuck part is viewed downward from above. An intermediate portion indicates a case where the FR mounting surface adjustment electrode is provided in the portion which overlaps both the sample placing surface 21a and the structure installation surface 21b when the electrostatic chuck part is viewed downward from above. An FR portion indicates a case where the FR mounting surface adjustment electrode is provided in the portion which overlaps the structure installation surface 21b when the electrostatic chuck part is viewed downward from above.

The position where the sample mounting surface adjustment electrode or the FR mounting surface adjustment electrode is provided is in the interior of the electrostatic chuck part or between the electrostatic chuck part and the cooling base part.

For example, combination 2 indicates a configuration in which the electrostatic chuck device is provided with a plurality of FR mounting surface adjustment electrodes in the interior of the electrostatic chuck part or between the electrostatic chuck part and the cooling base part at the portion which overlaps the structure installation surface 21b when the electrostatic chuck part is viewed downward from above.

The sheet resistance value of the electrode for wafer electrostatic attraction 23 is higher than the sheet resistance values of the sample mounting surface adjustment electrode and the FR mounting surface adjustment electrode. In a case where the sample mounting surface adjustment electrode and the FR mounting surface adjustment electrode are not provided, the sheet resistance value of the electrode for wafer electrostatic attraction 23 may not be higher than a predetermined value.

In a case where a plurality of FR mounting surface adjustment electrodes 71a or a plurality of FR mounting surface adjustment electrodes 72a are provided, the electrostatic chuck device can change the RF acceleration voltage and the phase of the frequency which are applied to the plurality of FR mounting surface adjustment electrodes 71a or FR mounting surface adjustment electrodes 72a. The electrostatic chuck device changes the RF acceleration voltage and the phase of the frequency which are applied to the plurality of FR mounting surface adjustment electrodes 71a or FR mounting surface adjustment electrodes 72a, whereby it is possible to adjust the magnitude and direction of the sheath voltage on the structure installation surface 21b and the sample placing surface 21a at the portion which overlaps the plurality of FR mounting surface adjustment electrodes 71a or FR mounting surface adjustment electrodes 72a when the electrostatic chuck part 412 is viewed downward from above.

Third Embodiment, Third Modification Example

Figure 15:
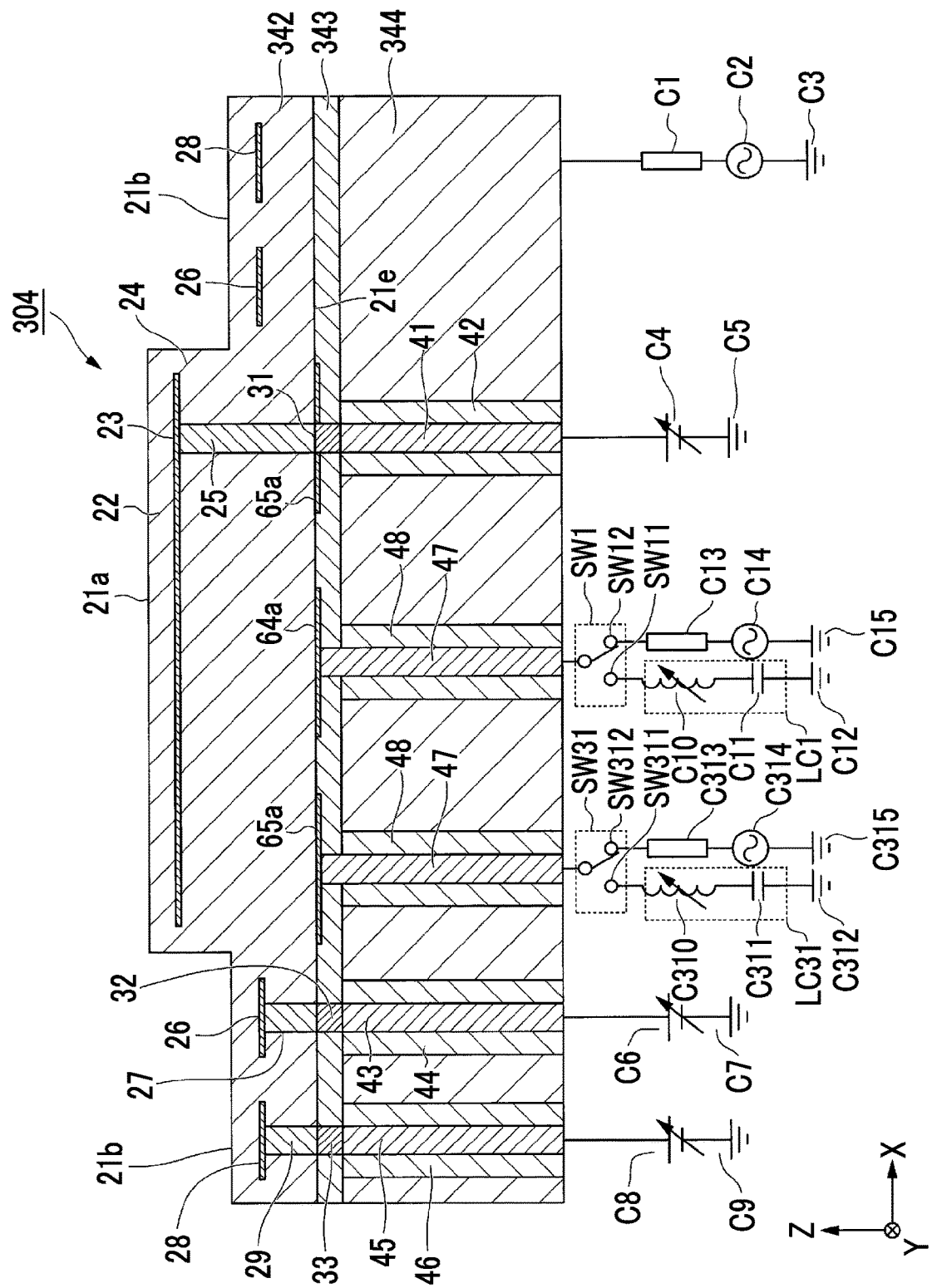
FIG. 15 is a sectional view showing a third modification example of the electrostatic chuck device according to the third embodiment of the present invention.

Here, a case where a plurality of sample mounting surface adjustment electrodes are provided in the electrostatic chuck device (the case of combination 12 in FIG. 14) will be described with reference to FIG. 15. FIG. 15 is a sectional view showing a third modification example of the electrostatic chuck device according to the third embodiment of the present invention. An electrostatic chuck device 304 shown in FIG. 15 includes an electrostatic chuck part 342, an insulating adhesive layer 343, and a cooling base part 344.

A sample mounting surface adjustment first electrode 64a and a sample mounting surface adjustment second electrode 65a are provided between the electrostatic chuck part 342 and the cooling base part 344.

The sample mounting surface adjustment first electrode 64a is provided at the inner peripheral portion of the disk of the portion where the sample placing surface 21a and the adhesion surface 21e of the electrostatic chuck part 342 overlap each other when the electrostatic chuck part 342 is viewed downward from above. The sample mounting surface adjustment first electrode 64a is a disk-shaped electrode.

The sample mounting surface adjustment second electrode 65a is provided at the outer peripheral portion of the disk of the portion where the sample placing surface 21a and the adhesion surface 21e of the electrostatic chuck part 342 overlap each other when the electrostatic chuck part 342 is viewed downward from above. The sample mounting surface adjustment second electrode 65a is a ring-shaped electrode.

Fourth Embodiment, Third Modification Example

Figure 16:
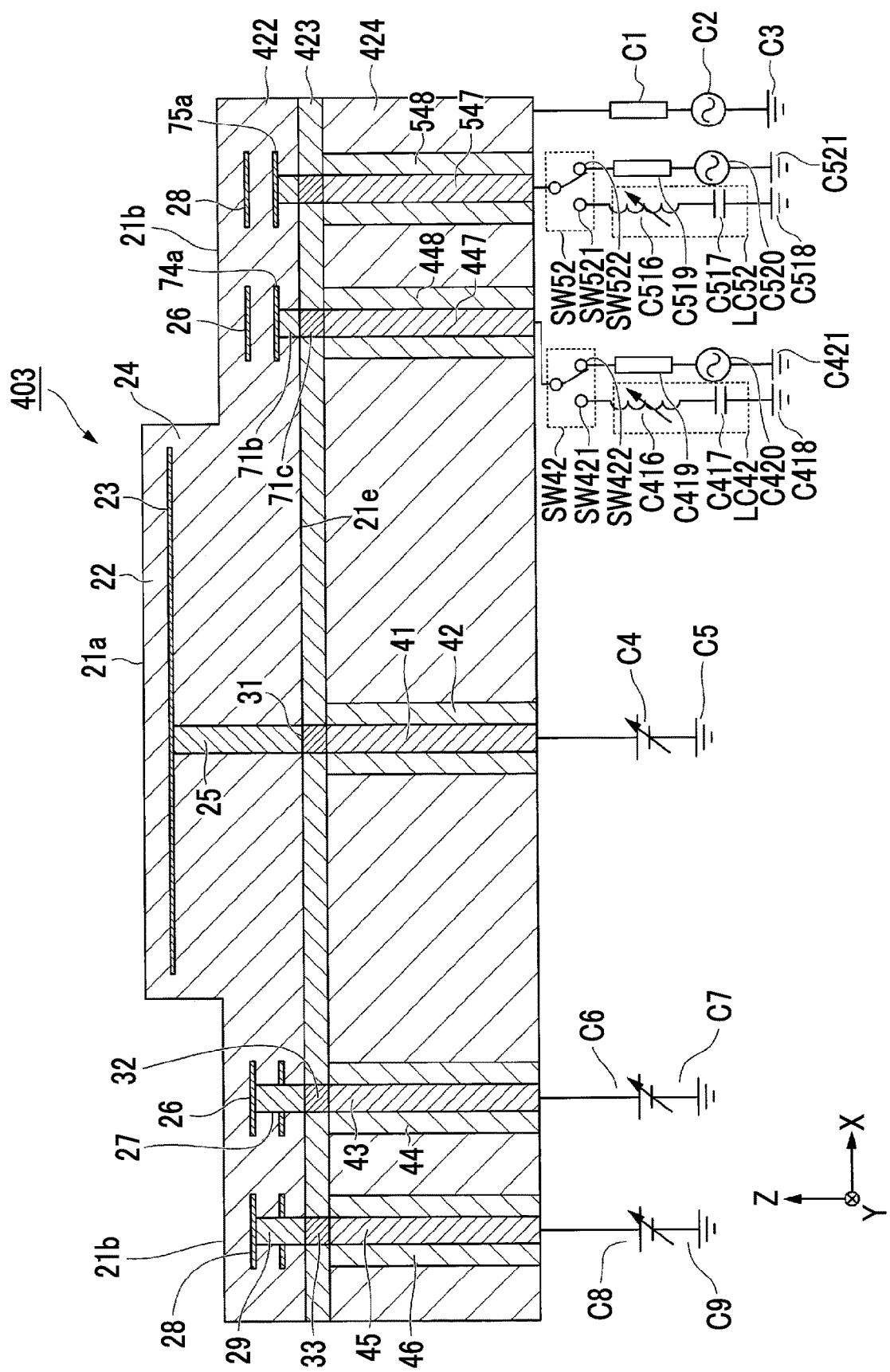
FIG. 16 is a sectional view showing a third modification example of the electrostatic chuck device according to the fourth embodiment of the present invention.

Here, a case where a plurality of FR mounting surface adjustment electrodes are provided in the electrostatic chuck device (the case of combination 2 in FIG. 14) will be described with reference to FIG. 16. FIG. 16 is a sectional view showing a third modification example of the electrostatic chuck device according to the fourth embodiment of the present invention. An electrostatic chuck device 403 shown in FIG. 16 includes an electrostatic chuck part 422, an insulating adhesion layer 423, and a cooling base part 424.

An FR mounting surface adjustment first electrode 74a and an FR mounting surface adjustment second electrode 75a are provided in the interior of the electrostatic chuck part 422 in the structure installation surface 21b of the electrostatic chuck part 422.

The FR mounting surface adjustment first electrode 74a is provided at the inner peripheral portion of the ring-shaped portion where the structure installation surface 21b and the adhesion surface 21e of the electrostatic chuck part 422 overlap each other when the electrostatic chuck part 422 is viewed downward from above. The FR mounting surface adjustment first electrode 74a is a ring-shaped electrode.

The FR mounting surface adjustment first electrode 74a has a portion which overlaps the first electrode for FR electrostatic attraction 26 when the electrostatic chuck part 422 is viewed downward from above. The FR mounting surface adjustment first electrode 74a has a portion where the first electrode pin for FR electrostatic attraction 27 penetrates in the Z-axis direction at a part of the ring shape.

The FR mounting surface adjustment second electrode 75a is provided at the outer peripheral portion of the ring-shaped portion where the structure installation surface 21b and the adhesion surface 21e of the electrostatic chuck part 422 overlap each other when the electrostatic chuck part 422 is viewed downward from above. The FR mounting surface adjustment second electrode 75a is a ring-shaped electrode.

The FR mounting surface adjustment second electrode 75a has a portion which overlaps the second electrode for FR electrostatic attraction 28 when the electrostatic chuck part 422 is viewed downward from above. The FR mounting surface adjustment second electrode 75a has a portion where the second electrode pin for FR electrostatic attraction 29 penetrates in the Z-axis direction at a part of the ring shape.

The FR mounting surface adjustment first electrode 74a, the FR mounting surface adjustment second electrode 75a, the first electrode pin for FR electrostatic attraction 27, and the second electrode pin for FR electrostatic attraction 29 are electrically insulated.

(Summary)

As described above, the electrostatic chuck device 401 according to this embodiment includes the electrostatic chuck part 412, the cooling base part 414, the adhesive layer (the insulating adhesive layer 413), and the fourth electrode (the FR mounting surface adjustment electrode 71a).

The electrostatic chuck device 401 has the fourth electrode (the FR mounting surface adjustment electrode 71a) between the structure installation surface and the cooling base part 414.

The fourth electrode (the FR mounting surface adjustment electrode 71a) is connected to the high-frequency power source C20 through the matching box C19 which includes a capacitor and a coil, or is grounded through the variable conductor (the variable conductor C16).

With this configuration, in the electrostatic chuck device 401 according to this embodiment, since it is possible to adjust the RF acceleration voltage of the portion which overlaps the fourth electrode (the FR mounting surface adjustment electrode 71a) when the cooling base part 414 is viewed downward from above, it is possible to adjust the sheath voltage of the structure installation surface 21b at the portion which overlaps the fourth electrode (the FR mounting surface adjustment electrode 71a) when the electrostatic chuck part 412 is viewed downward from above in the structure installation surface 21b.

Further, the fourth electrode (the FR mounting surface adjustment electrode 71a) is provided in the interior of the electrostatic chuck part 412 or between the electrostatic chuck part 412 and the cooling base part 414.

With this configuration, in the electrostatic chuck device 401 according to this embodiment, in a case where the fourth electrode (the FR mounting surface adjustment electrode 71a) is provided in the interior of the electrostatic chuck part 412, it is possible to install the fourth electrode (the FR mounting surface adjustment electrode 71a) while maintaining the general structure of the electrostatic chuck part 412. For this reason, in the electrostatic chuck device 401 according to this embodiment, in a case of reducing the non-uniformity of etching on the sample placing surface of the electrostatic chuck part 412, it is possible to install the fourth electrode (the FR mounting surface adjustment electrode 71a) while maintaining the general structure of the electrostatic chuck part 412.

With this configuration, in the electrostatic chuck device 403 according to this embodiment, in a case where the fourth electrode (the FR mounting surface adjustment electrode 73a) is provided between the electrostatic chuck part 432 and the cooling base part 434, it is possible to easily install the fourth electrode (the FR mounting surface adjustment electrode 73a), and it is possible to reduce the thickness of the electrostatic chuck part 432. For this reason, in the electrostatic chuck device 403 according to this embodiment, in a case of reducing the non-uniformity of etching on the sample placing surface of the electrostatic chuck part 432, it is possible to easily install the fourth electrode (the FR mounting surface adjustment electrode 73a).

Further, the fourth electrode (the FR mounting surface adjustment electrode 72a) straddles the sample placing surface 21a and the structure installation surface 21b in a direction parallel to the sample placing surface 21a.

With this configuration, in the electrostatic chuck device 402 according to this embodiment, since it is possible to adjust the direction of the electric field in the electrostatic chuck part 422, it is possible to adjust the magnitude and direction of the sheath voltage above the portion which overlaps the FR mounting surface adjustment electrode 72a when the electrostatic chuck part 422 is viewed downward from above in the structure installation surface 21b.

Further, a plurality of fourth electrodes (FR mounting surface adjustment electrodes 71a) may be provided.

With this configuration, in the electrostatic chuck device 403 according to this embodiment, since it is possible to change the RF acceleration voltage and the phase of the frequency which are applied to the plurality of fourth electrodes (FR mounting surface adjustment electrodes 74a and 75a), it is possible to adjust the magnitude and direction of the sheath voltage of the structure installation surface 21b which overlaps the plurality of fourth electrodes (FR mounting surface adjustment electrodes 74a and 75a) when the electrostatic chuck part 422 is viewed downward from above.

Fifth Embodiment

Hereinafter, a fifth embodiment of the present invention will be described in detail with reference to the drawings.

In the second modification example of the third embodiment, the case where the sample mounting surface adjustment electrode is disposed on the insulating adhesive layer has been described. In this embodiment, a case where a sample mounting surface high-frequency electrode is disposed on an organic material part will be described.

The electrostatic chuck device according to this embodiment is referred to as an electrostatic chuck device 501.

Figure 17:
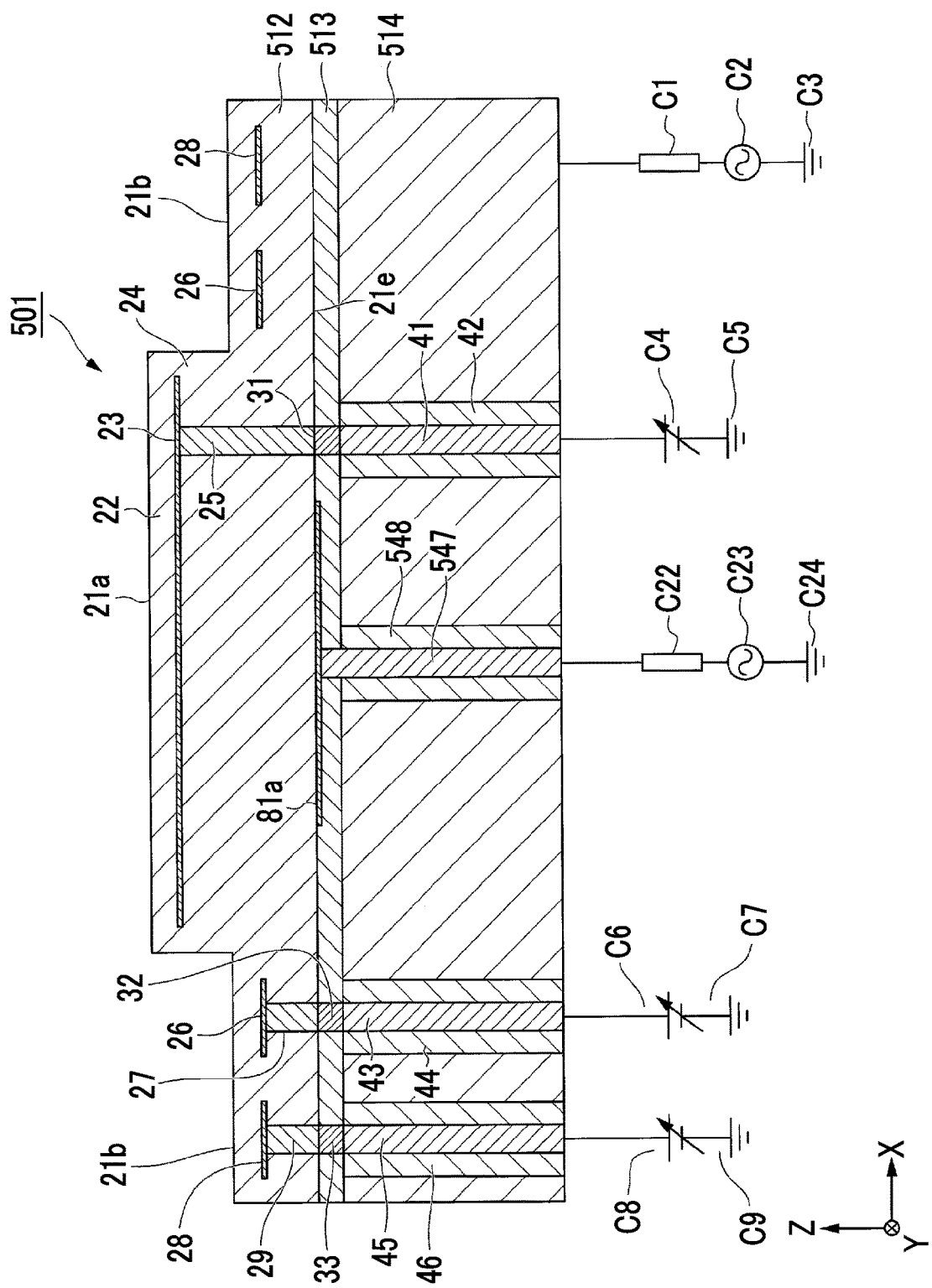
FIG. 17 is a sectional view showing an example of an electrostatic chuck device according to a fifth embodiment of the present invention.

FIG. 17 is a sectional view showing an example of the electrostatic chuck device 501 according to this embodiment. The electrostatic chuck device 501 includes an electrostatic chuck part 512, an organic material part 513, and a cooling base part 514.

If the electrostatic chuck device 501 (FIG. 17) according to this embodiment is compared with the electrostatic chuck device 303 (FIG. 10) according to the second modification example of the third embodiment, the electrostatic chuck device 501 is different from the electrostatic chuck device 303 in that the organic material part 513 and a sample mounting surface high-frequency electrode 81a are provided. Here, the functions of the other components are the same as those in the second modification example of the third embodiment.

Description of the same functions as those in the second modification example of the third embodiment will be omitted, and in the fifth embodiment, description will be made focusing on portions different from those of the second modification example of the third embodiment.

The organic material part 513 is provided between the electrostatic chuck part 512 and the cooling base part 514. The organic material part 513 has the sample mounting surface high-frequency electrode 81a in addition to the conductive adhesive layer 31, the conductive adhesive layer 32, and the conductive adhesive layer 33. An extraction electrode terminal 547 penetrates the organic material part 513 in the Z-axis direction and is connected to the sample mounting surface high-frequency electrode 81a. The organic material part 513 is formed to cover the peripheries of the sample mounting surface high-frequency electrode 81a and the extraction electrode terminal 547.

The sample mounting surface high-frequency electrode 81a is provided on the organic material part 513. The sample mounting surface high-frequency electrode 81a is a disk-shaped thin film electrode. The sample mounting surface high-frequency electrode 81a is, for example, a metal foil electrode. The sample mounting surface high-frequency electrode 81a is insulated from the cooling base part 514 by being provided in the interior of the organic material part 513.

In a case where the sample mounting surface high-frequency electrode 81a is provided on the organic material part 513, the manufacture of the sample mounting surface high-frequency electrode 81a is easy compared to a case where the sample mounting surface high-frequency electrode 81a is provided in the interior of the electrostatic chuck part 512. Further, in a case where the sample mounting surface high-frequency electrode 81a is provided on the organic material part 513, the thickness of the electrostatic chuck part 512 can be reduced compared to a case where the sample mounting surface high-frequency electrode 81a is provided in the interior of the electrostatic chuck part 512.

The extraction electrode terminal 547 has a rod shape and is configured to apply a high-frequency voltage to the sample mounting surface high-frequency electrode 81a. The extraction electrode terminal 547 is connected to a high-frequency power source C23 through a matching box C22 which includes a capacitor and a coil. The high-frequency power source C23 applies a high-frequency voltage to the sample mounting surface high-frequency electrode 81a through the extraction electrode terminal 547. The high-frequency power source C23 is grounded by an earth C24.

In the electrostatic chuck device 501, a high-frequency voltage is applied to the sample mounting surface high-frequency electrode 81a, whereby the sheath voltage above the portion which overlaps the sample mounting surface high-frequency electrode 81a when the electrostatic chuck part 512 is viewed downward from above in the sample placing surface 21a is reduced, and thus it is possible to reduce the non-uniformity of etching on the sample placing surface 21a. In this embodiment, the non-uniformity of etching means that the etching rate becomes non-uniform.

(Summary)

As described above, the electrostatic chuck device 501 according to this embodiment includes the electrostatic chuck part 512, the cooling base part 514, the organic material part 513, and a fifth electrode for high frequency (the sample mounting surface high-frequency electrode 81a).

The organic material part 513 is disposed between the electrostatic chuck part 512 and the cooling base part 514.

The fifth electrode for high frequency (the sample mounting surface high-frequency electrode 81a) is provided on the organic material part 513.

With this configuration, in the electrostatic chuck device 501 according to this embodiment, it is possible to make the manufacture and installation of the fifth electrode for high frequency (the sample mounting surface high-frequency electrode 81a) easy. Further, in the electrostatic chuck device 501, it is possible to reduce the thickness of the electrostatic chuck part 512. For this reason, in the electrostatic chuck device 501 according to this embodiment, in a case of reducing the non-uniformity of etching on the sample placing surface of the electrostatic chuck part 512, it is possible to make the manufacture and installation of the fifth electrode for high frequency (the sample mounting surface high-frequency electrode 81a) easy.

Sixth Embodiment

Figure 18:
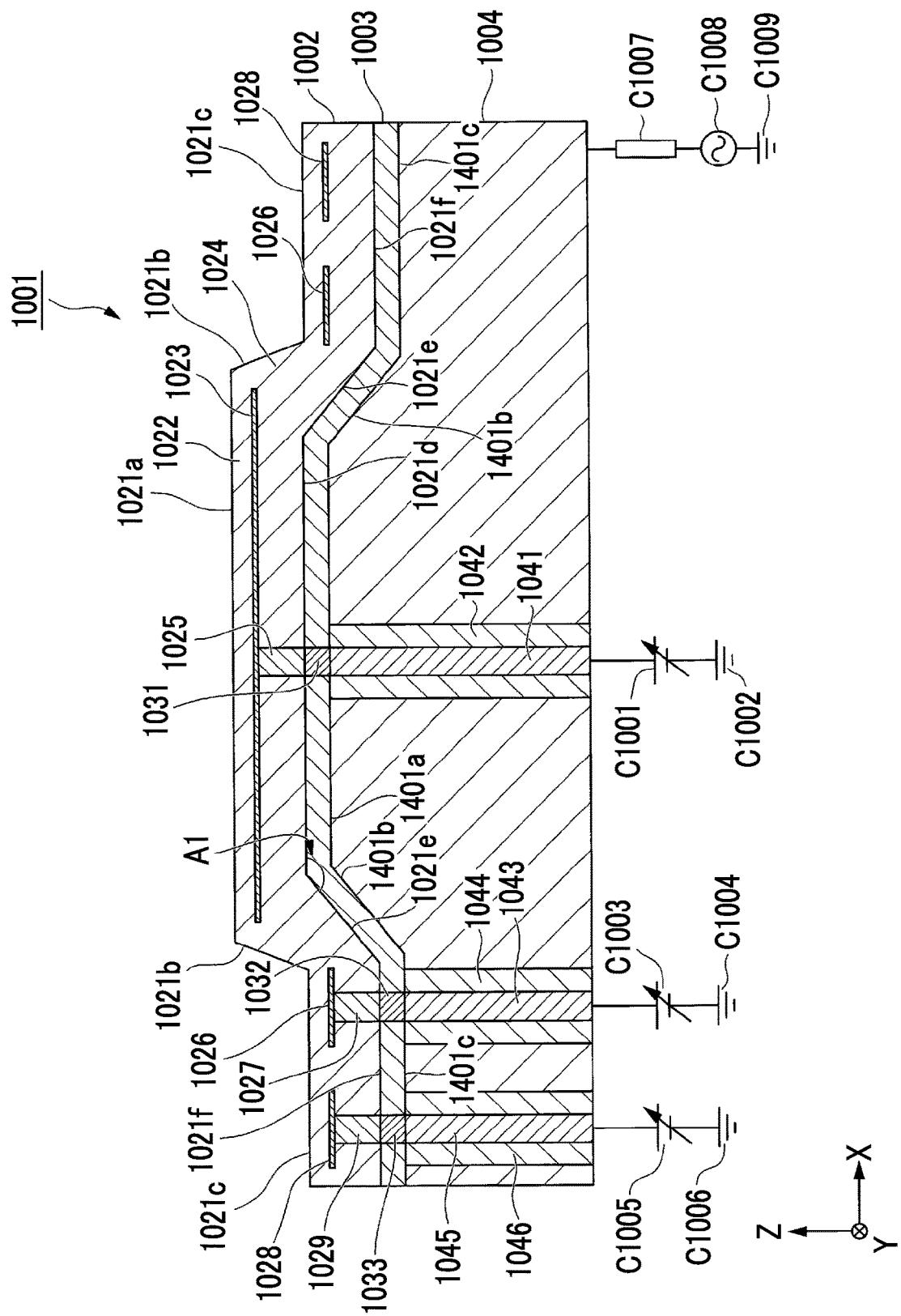
FIG. 18 is a sectional view showing an example of an electrostatic chuck device according to a sixth embodiment of the present invention.
Figure 19:
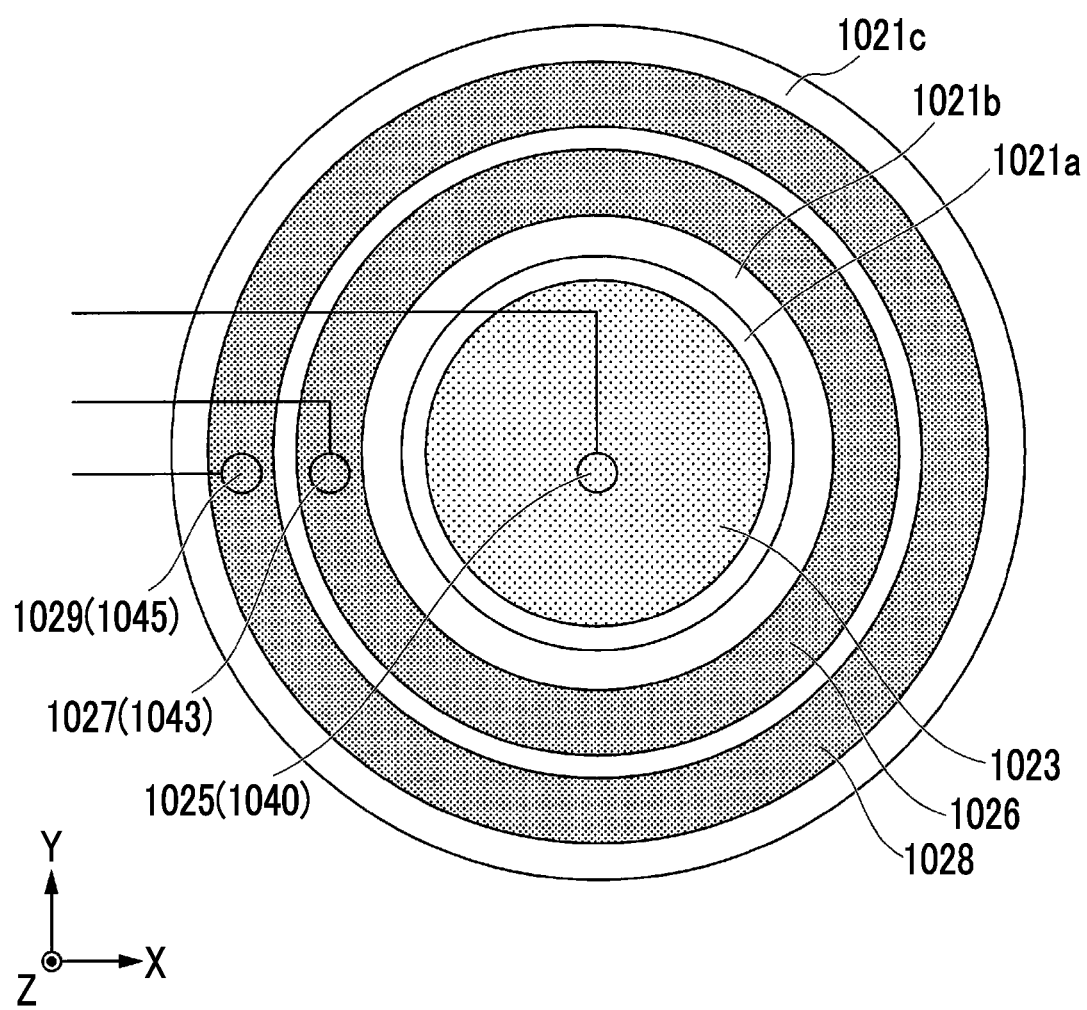
FIG. 19 is a plan view showing an example of an electrode of the electrostatic chuck device according to the sixth embodiment of the present invention.

Hereinafter, a sixth embodiment of the present invention will be described in detail with reference to the drawings. FIG. 18 is a sectional view showing an example of an electrostatic chuck device 1001 according to this embodiment. FIG. 19 is a plan view showing an example of an electrode of the electrostatic chuck device 1001 according to this embodiment. The electrostatic chuck device 1001 includes an electrostatic chuck part 1002, an insulating adhesive layer 1003, and a cooling base part 1004. Here, a coordinate system fixed to the electrostatic chuck device 1001 is a three-dimensional orthogonal coordinate system X, Y, Z. Here, an X axis of the three-dimensional orthogonal coordinate system X, Y, Z is a direction parallel to the horizontal direction, and a Z axis is an upward direction in the vertical direction. The upward direction is a positive direction of the Z axis.

Each of the electrostatic chuck part 1002, the insulating adhesive layer 1003, and the cooling base part 1004 has a disk-like shape when the electrostatic chuck device 1001 is viewed downward from above. The electrostatic chuck part 1002 is installed on the cooling base part 1004 with the insulating adhesive layer 1003 interposed therebetween. The electrostatic chuck part 1002, the insulating adhesive layer 1003, and the cooling base part 1004 are bonded together such that the centers of the disks overlap when the electrostatic chuck device 1001 is viewed downward from above.

(Electrostatic Chuck Part)

The electrostatic chuck part 1002 has a disk shape, as shown in FIG. 19. The electrostatic chuck part 1002 includes a placing plate 1022, an electrode for wafer electrostatic attraction 1023, a supporting plate 1024, a first electrode for FR (focus ring) electrostatic attraction 1026, and a second electrode for FR electrostatic attraction 1028. The placing plate 1022 and the supporting plate 1024 are integrated.

The placing plate 1022 has a sample placing surface 1021a which is an upper surface of an inner peripheral portion of the disk, an electrostatic chuck upper surface slope 1021b, and a structure installation surface 1021c which is an upper surface of an outer peripheral portion of the disk. The electrostatic chuck upper surface slope 1021b is a slope connecting the sample placing surface 1021a and the structure installation surface 1021c.

The structure installation surface 1021c is provided in a recessed portion recessed from the sample placing surface 1021a. The sample placing surface 1021a is a surface on which a plate-shaped sample such as a semiconductor wafer is placed. The structure installation surface 1021c is a surface on which a focus ring is placed. That is, the electrostatic chuck part 1002 has the structure installation surface 1021c on which the focus ring which is an annular structure surrounding the periphery of the sample placing surface 1021a is installed, in the recessed portion which is located around the sample placing surface 1021a and is recessed from the sample placing surface 1021a.

The focus ring (not shown) is formed of, for example, a material having the same electrical conductivity as the wafer which is placed on the sample placing surface 1021a. The focus ring is disposed at a peripheral edge portion of the wafer, whereby the electrical environment with respect to plasma can be made substantially coincident with that of the sample placing surface, and therefore, it is possible to reduce the non-uniformity of an etching rate between a central portion and a peripheral edge portion on the sample placing surface of the electrostatic chuck part 1002.

The placing plate 1022 and the supporting plate 1024 have disk shapes in which the shapes of the overlapping surfaces are the same, and are made of an insulating ceramics sintered body having mechanical strength and durability against corrosive gas and plasma thereof, such as an aluminum oxide-silicon carbide ($Al_2O_3$—SiC) composite sintered body, an aluminum oxide ($Al_2O_3$) sintered body, an aluminum nitride (AlN) sintered body, or an yttrium oxide ($Y_2O_3$) sintered body.

That is, the electrostatic chuck part 1002 is made of one or more of an aluminum oxide-silicon carbide composite sintered body and an aluminum oxide sintered body.

The sample placing surface 1021a of the placing plate 1022 is a surface in which the plate-shaped sample such as a semiconductor wafer is placed on the upper surface thereof. A plurality of protrusion portions (not shown) each having a diameter smaller than the thickness of the plate-shaped sample are formed at predetermined intervals on the sample placing surface 1021a, and these protrusion portions support the plate-shaped sample.

The electrode for wafer electrostatic attraction 1023 is provided between the placing plate 1022 and the supporting plate 1024 at an inner peripheral portion of the disk of the electrostatic chuck part 1002. The electrode for wafer electrostatic attraction 1023 is a disk-shaped electrode, as shown in FIG. 19. The electrode for wafer electrostatic attraction 1023 is provided between the sample placing surface 1021a and an adhesion surface 1021d and between the sample placing surface 1021a and an adhesion surface slope 1021e.

The electrode for wafer electrostatic attraction 1023 is used as an electrostatic chuck electrode for generating electric charges and fixing the plate-shaped sample with an electrostatic attraction force, and the shape or size thereof is appropriately adjusted according to the use thereof. The electrode for wafer electrostatic attraction 1023 is supported by an electrode pin for wafer electrostatic attraction 1025. The electrode for wafer electrostatic attraction 1023 is connected to an extraction electrode terminal 1041 (described later) through the electrode pin for wafer electrostatic attraction 1025.

The electrode for wafer electrostatic attraction 1023 is preferably formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The supporting plate 1024 has a recessed portion on the lower surface that is in contact with the insulating adhesive layer 1003. That is, the electrostatic chuck part 1002 has a recessed portion on the insulating adhesive layer 1003 side. The lower surface of the supporting plate 1024 is composed of the adhesion surface 1021d, the adhesion surface slope 1021e, and an outer peripheral portion adhesion surface 1021f. Here, a downward direction is a negative direction of the Z axis.

The adhesion surface 1021d is a circular flat surface which is located at an inner peripheral portion of the disk-shaped supporting plate 1024. The adhesion surface 1021d is recessed with respect to the outer peripheral portion adhesion surface 1021f on the lower surface of the supporting plate 1024. The outer peripheral portion adhesion surface 1021f is a flat surface having a concentric circular shape, which is located at an outer peripheral portion of the disk-shaped supporting plate 1024. The adhesion surface slope 1021e is a slope connecting the adhesion surface 1021d and the outer peripheral portion adhesion surface 1021f. That is, the outer periphery of the recessed portion of the electrostatic chuck part 1002 has a slope. Here, the outer periphery of the recessed portion is a surface connecting the recess portion of the recessed portion and the surface in which the recessed portion is provided.

In a case where the electrostatic chuck part 1002 is viewed downward from above, the center of the circle of the adhesion surface 1021d coincides with the center of the circle of the sample placing surface 1021a, and the diameter of the adhesion surface 1021d is smaller than the diameter of the sample placing surface 1021a. That is, in a case where the electrostatic chuck part 1002 is viewed downward from above, the adhesion surface 1021d is located at an inner peripheral portion of the sample placing surface 1021a.

The adhesion surface 1021d faces the sample placing surface 1021a. The outer peripheral portion adhesion surface 1021f faces the structure installation surface 1021c. When the electrostatic chuck part 1002 is viewed downward from above, the adhesion surface slope 1021e has a portion overlapping the sample placing surface 1021a and the electrostatic chuck upper surface slope 1021b. That is, the adhesion surface slope 1021e which is a part of the recessed portion of the electrostatic chuck part 1002 extends to the structure installation surface 1021c when the electrostatic chuck part 1002 is viewed downward from above. An inner angle A1 formed between the adhesion surface slope 1021e and the adhesion surface 1021d is larger than 95 degrees and smaller than 165 degrees, and more preferably, larger than 105 degrees and smaller than 155 degrees.

In a plasma etching apparatus, an etching rate and an etching direction are affected by the density of gas per unit area excited by plasma, and the intensity (sheath voltage) of an electric field and the direction of a line of electric force on the sample placing surface 1021a of the electrostatic chuck part 1002.

In a case where the density of the excited gas per unit area, the intensity of the electric field, and the direction of the line of electric force on the sample placing surface 1021a are non-uniform on the surface, the etching rate and the etching direction can become non-uniform.

In the sample placing surface 1021a, the density of the plasma-excited etching gas per unit volume varies according to the etching apparatus.

In a case where the density of the excited etching gas per unit volume is smaller in the inner peripheral portion than in the outer peripheral portion, in the sample placing surface 1021a, the etching rate becomes lower than in the inner peripheral portion that in the outer peripheral portion.

A recessed portion is provided on the bottom surface of the electrostatic chuck part 1002 by counterboring. In the electrostatic chuck part 1002, the thickness between the sample placing surface 1021a and the adhesion surface 1021d is made smaller than the thickness between the sample placing surface 1021a and the adhesion surface slope 1021e.

Accordingly, the capacitance between the sample placing surface 1021a and the adhesion surface 1021d is larger than the capacitance between the sample placing surface 1021a and the adhesion surface slope 1021e. For this reason, the sheath voltage above the portion facing the adhesion surface 1021d in the sample placing surface 1021a is reduced, and thus it is possible to reduce the non-uniformity of the etching rate on the sample placing surface 1021a.

Further, since the recessed portion on the bottom surface of the electrostatic chuck part 1002 has the adhesion surface slope 1021e, it is possible to suppress a sudden change in the capacitance between the sample placing surface 1021a and the adhesion surface slope 1021e, compared to the capacitance between the sample placing surface 1021a and the adhesion surface 1021d, in the outer peripheral portion of the electrostatic chuck part 1002.

The fact that since the recessed portion on the bottom surface of electrostatic chuck part 1002 has the adhesion surface slope 1021e, a sudden change in capacitance is suppressed in portions having a different thickness of the electrostatic chuck part 1002 will be described with reference to FIG. 24.

Figure 24:
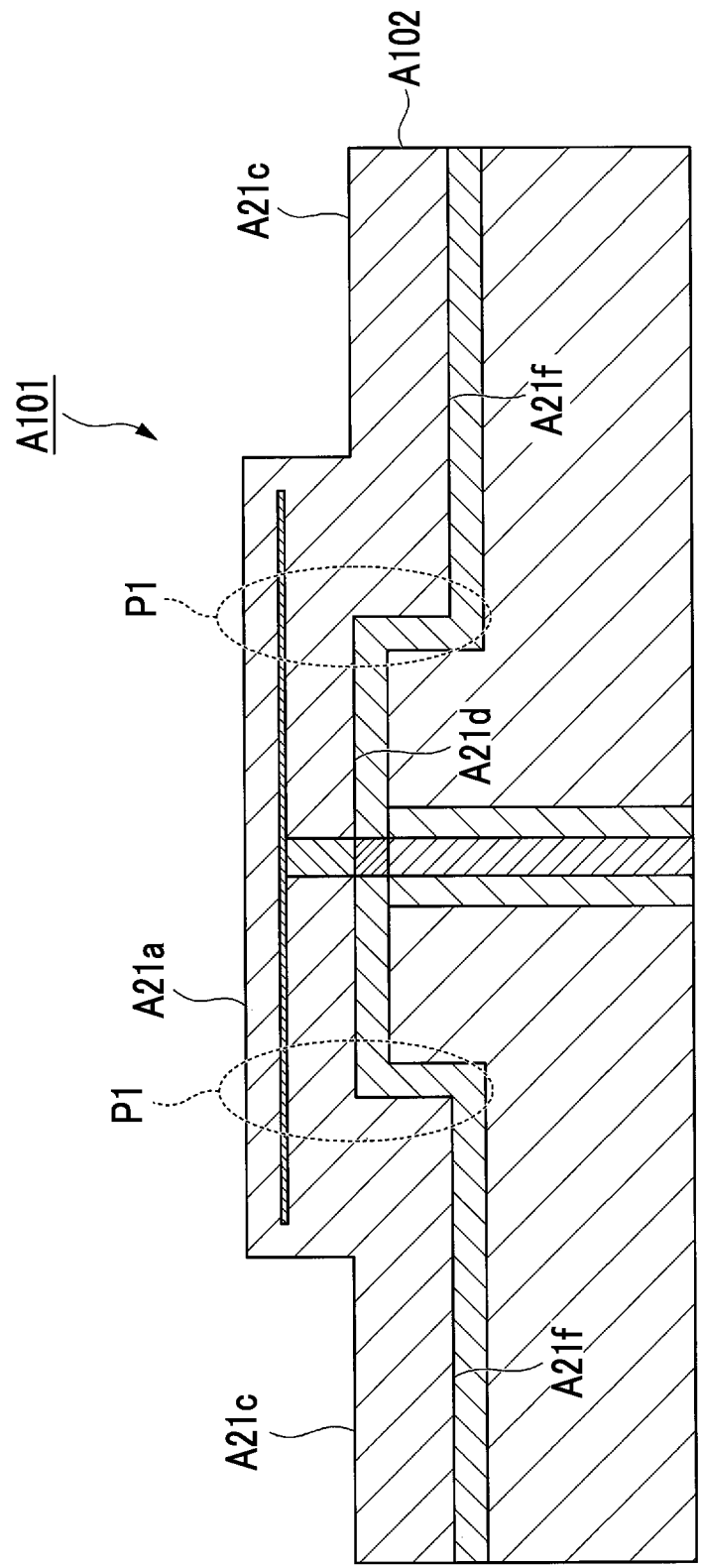
FIG. 24 is a diagram showing an example of an electrostatic chuck device according to a comparative example.

FIG. 24 is a diagram showing an example of an electrostatic chuck device A101 according to a comparative example. An electrostatic chuck part A102 has a sample placing surface A21a which is an upper surface of an inner peripheral portion of a disk, and a structure installation surface A21c which is an upper surface of an outer peripheral portion of the disk.

The electrostatic chuck part A102 has a recessed portion on the lower surface thereof. The lower surface of the electrostatic chuck part A102 is composed of an adhesion surface A21d and an outer peripheral portion adhesion surface A21f. The adhesion surface A21d is recessed with respect to the outer peripheral portion adhesion surface A21f on the lower surface of the electrostatic chuck part A102.

In the electrostatic chuck part A102, the thickness between the sample placing surface A21a and the adhesion surface A21d is smaller than the thickness between the sample placing surface A21a and the outer peripheral portion adhesion surface A21f.

Accordingly, the capacitance between the sample placing surface A21a and the adhesion surface A21d is larger than the capacitance between the sample placing surface A21a and the outer peripheral portion adhesion surface A21f.

Here, in a portion P1 of the electrostatic chuck part A102, the magnitude of the capacitance suddenly changes from the capacitance between the sample placing surface A21a and the adhesion surface A21d to the capacitance between the sample placing surface A21a and the outer peripheral portion adhesion surface A21f.

In the electrostatic chuck device A101, since the capacitance suddenly changes in the portion P1 of the electrostatic chuck part A102, the etching rate on the sample placing surface A21a can become non-uniform in the portion where the sample placing surface A21a overlaps the portion P1 when the electrostatic chuck part A102 is viewed from above.

On the other hand, in the electrostatic chuck device 1001 according to this embodiment, since the recessed portion on the bottom surface of the electrostatic chuck part 1002 has the adhesion surface slope 1021e, a sudden change in capacitance in a portion having a different thickness of the electrostatic chuck part 1002 is suppressed.

The thickness between the sample placing surface 1021a and the adhesion surface 1021d and the thickness between the sample placing surface 1021a and the adhesion surface slope 1021e are formed to be 0.7 mm or more and 5.0 mm or less, as an example.

For example, if the thickness of the electrostatic chuck part 1002 is less than 0.7 mm, it becomes difficult to secure the mechanical strength of the electrostatic chuck part 1002. If the thickness of the electrostatic chuck part 1002 exceeds 5.0 mm, the high-frequency permeability of the electrostatic chuck part 1002 decreases and the sheath voltage decreases. Further, if the thickness of the electrostatic chuck part 1002 exceeds 5.0 mm, the thermal conductivity of the electrostatic chuck part 1002 decreases and the heat capacity of the electrostatic chuck part 1002 increases, so that the cooling performance or the thermal responsiveness of the plate-shaped sample placed on the electrostatic chuck part 1002 deteriorates. The thickness of each part described here is an example, and is not limited to the range described above.

When the recessed portion is formed on the bottom surface of the electrostatic chuck part 1002 by counterboring, in a case where the side surface forming the depth of the recessed portion is perpendicular to the bottom surface, in the electrostatic chuck part 1002, capacitance greatly changes between the portion subjected to counterboring and the portion not subjected to counterboring.

If the capacitance greatly changes for each portion of the sample placing surface 1021a in the electrostatic chuck part 1002, a sudden change in the intensity of the electric field and a sudden change in the direction of the electric field in the outer peripheral portion can occur.

Further, when the recessed portion is formed on the bottom surface of the electrostatic chuck part 1002 by counterboring, in a case where the side surface forming the depth of the recessed portion is perpendicular to the bottom surface, the thickness of the side surface is reduced, so that the mechanical strength of the portion subjected to the counterboring is reduced, and thus there is a danger that the electrostatic chuck part 1002 may be broken.

In the electrostatic chuck part 1002, the recessed portion provided on the bottom surface by counterboring has the adhesion surface slope 1021e instead of the side surface in the outer peripheral portion. In the electrostatic chuck part 1002, the adhesion surface slope 1021e is provided, whereby a large change in capacitance between the portion subjected to counterboring and the portion not subjected to counterboring can be suppressed, and therefore, it is possible to suppress a sudden change in the intensity of the electric field and a sudden change in the direction of the electric field in the outer peripheral portion.

Further, in the electrostatic chuck part 1002, the adhesion surface slope 1021e which is a part of the recessed portion extends to the structure installation surface 1021c, whereby it is possible to make the thickness of the electrostatic chuck part 1002 the same at the sample placing surface 1021a and the structure installation surface 1021c, and therefore, it is possible to adjust the intensity and direction of the electric field of the sheath voltage in the outer peripheral portion of the electrostatic chuck part 1002.

Further, in the electrostatic chuck part 1002, the inner angle A1 formed between the adhesion surface slope 1021e and the adhesion surface 1021d is larger than 95 degrees and smaller than 165 degrees, and more preferably, larger than 105 degrees and smaller than 155 degrees. For this reason, it is possible to suppress a sudden change in the intensity of the electric field and the direction of the electric field, and it is possible to suppress the occurrence of cracking from the adhesion surface slope 1021e which is the outer peripheral portion of the recessed portion on the bottom surface of the electrostatic chuck part 1002.

The sheet resistance value of the electrode for wafer electrostatic attraction 1023 is higher than $1.0\Omega/\square$ and lower than $1.0\times10^{10}\Omega/\square$. It is preferable that the sheet resistance value of the electrode for wafer electrostatic attraction 1023 is higher than $2.0\Omega/\square$ and lower than $1.0\times10^{7}\Omega/\square$. If the sheet resistance value of the electrode for wafer electrostatic attraction 1023 is lower than the lower limit value described above, an eddy current is generated in the electrode for wafer electrostatic attraction 1023, and thus an equal potential can be formed. Due to the eddy current flowing through the electrode for wafer electrostatic attraction 1023, there is a case where the effect of reducing the non-uniformity of the etching rate on the sample placing surface 1021a of the electrostatic chuck part 1002 is not sufficiently obtained. In the electrostatic chuck device 1001, by making the sheet resistance value of the electrode for wafer electrostatic attraction 1023 higher than the lower limit value described above, it is possible to suppress the generation of the eddy current in the electrode for wafer electrostatic attraction 1023. On the other hand, by making the sheet resistance value of the electrode for wafer electrostatic attraction 1023 lower than the upper limit value described above, it is possible to maintain a good attraction characteristic.

The thickness of the electrode for wafer electrostatic attraction 1023 is larger than 0.5 μm and smaller than 50 μm. It is preferable that the thickness of the electrode for wafer electrostatic attraction 1023 is larger than 10 μm and smaller than 30 μm. The electrode for wafer electrostatic attraction 1023 having such a thickness can be easily formed by a film forming method such as a sputtering method or a vapor deposition method, or a coating method such as a screen printing method.

If the thickness of the electrode for wafer electrostatic attraction 1023 is less than 0.5 μm, it becomes difficult to secure sufficient conductivity. If the thickness of the electrode for wafer electrostatic attraction 1023 exceeds 50 μm, due to the difference in coefficient of thermal expansion between the electrode for wafer electrostatic attraction 1023 and the placing plate 1022, and the difference in coefficient of thermal expansion between the electrode for wafer electrostatic attraction 1023 and the supporting plate 1024, peeling or cracking easily occurs at the joining interface between the electrode for wafer electrostatic attraction 1023 and the placing plate 1022 and the joining interface between the electrode for wafer electrostatic attraction 1023 and the supporting plate 1024.

The first electrode for FR electrostatic attraction 1026 and the second electrode for FR electrostatic attraction 1028 are provided between the structure installation surface 1021c and the cooling base part 1004 in the interior of the electrostatic chuck part 1002. The first electrode for FR electrostatic attraction 1026 and the second electrode for FR electrostatic attraction 1028 are ring-shaped electrodes, as shown in FIG. 19. The first electrode for FR electrostatic attraction 1026 and the second electrode for FR electrostatic attraction 1028 are provided between the structure installation surface 1021c and the outer peripheral portion adhesion surface 1021f.

The diameter of the second electrode for FR electrostatic attraction 1028 which is a ring-shaped electrode is larger than the diameter of the first electrode for FR electrostatic attraction 1026 which is a ring-shaped electrode.

The first electrode for FR electrostatic attraction 1026 is supported by a first electrode pin for FR electrostatic attraction 1027 at a portion of the circumference of the ring, as shown in FIG. 19. The first electrode for FR electrostatic attraction 1026 is connected to an extraction electrode terminal 1043 (described later) through the first electrode pin for FR electrostatic attraction 1027. The second electrode for FR electrostatic attraction 1028 is supported by a second electrode pin for FR electrostatic attraction 1029 at a portion of the circumference of the ring. The second electrode for FR electrostatic attraction 1028 is connected to an extraction electrode terminal 1045 (described later) through the second electrode pin for FR electrostatic attraction 1029.

(Insulating Adhesive layer)

The insulating adhesive layer 1003 attaches the cooling base part 1004 to the lower surface of the electrostatic chuck part 1002, that is, the adhesion surface 1021*d*, the adhesion surface slope 1021*e*, and the outer peripheral portion adhesion surface 1021*f*.

The insulating adhesive layer 1003 is preferably formed of an organic adhesive such as polyimide resin, silicone resin, or epoxy resin. These organic adhesives have heat resistance and insulation properties after bonding and curing. The silicone adhesive has a low glass transition temperature, a high heat resistance temperature, and rubber elasticity. It is preferable that insulating ceramic powder (aluminum oxide, aluminum nitride, or the like) is added to the silicone resin.

Further, it is preferable that the adhesive before curing is formed of a gel-shaped or flexible sheet-shaped or film-shaped adhesive resin.

The insulating adhesive layer 1003 has a conductive adhesive layer 1031, a conductive adhesive layer 1032, and a conductive adhesive layer 1033. The insulating adhesive layer 1003 is formed to cover the peripheries of the conductive adhesive layer 1031, the conductive adhesive layer 1032, and the conductive adhesive layer 1033.

The conductive adhesive layer 1031 attaches the electrode pin for wafer electrostatic attraction 1025 to the extraction electrode terminals 1041. The conductive adhesive layer 1032 attaches the first electrode pin for FR electrostatic attraction 1027 to the extraction electrode terminal 1043. The conductive adhesive layer 1033 attaches the second electrode pin for FR electrostatic attraction 1029 to the extraction electrode terminal 1045.

The conductive adhesive layer 1031, the conductive adhesive layer 1032, and the conductive adhesive layer 1033 are preferably formed of a silicone-based conductive adhesive (adhesion obtained by adding conductive materials such as metal or carbon to a silicone adhesive) having flexibility and electric resistance. Further, as the shape of the conductive material, a needle-shaped conductive material is preferable compared to a spherical conductive material, because conductivity can be secured with addition of a small amount.

(Cooling Base Part)

The cooling base part 1004 has a thick disk shape and is configured to adjust the temperature of the electrostatic chuck part 1002 to a desired temperature. The cooling base part 1004 has an inner peripheral upper surface 1401*a*, a slope 1401*b*, and an outer peripheral upper surface 1401*c* as upper surfaces thereof. The inner peripheral upper surface 1401*a* is a protrusion portion corresponding to the adhesion surface 1021*d* which is the recessed portion of the electrostatic chuck part 1002. The slope 1401*b* is a slope connecting the inner peripheral upper surface 1401*a* and the outer peripheral upper surface 1401*c*.

As the cooling base part 1004, for example, a water-cooled base or the like, in which a flow path for circulating water is formed in the interior thereof, is preferable.

As the material for forming the cooling base part 1004, as long as it is nonmagnetic metal having excellent thermal conductivity, electrical conductivity, and workability, or a composite material containing such metal, there is no limitation, and for example, aluminum (Al), an aluminum alloy, copper (Cu), a copper alloy, stainless steel (SUS), or titanium (Ti), or the like is suitably used.

In a case where the material of the electrostatic chuck part 1002 is an aluminum oxide ($Al_2O_3$) sintered body or an aluminum oxide-silicon carbide ($Al_2O_3$—SiC) composite sintered body, in order to reduce the difference in thermal expansion between the electrostatic chuck part 1002 and the cooling base part 1004, titanium (Ti) is preferable as a material for forming the cooling base part 1004.

It is preferable that at least the surface of the cooling base part 1004, which is exposed to plasma, is subjected to alumite treatment or has an insulating film such as alumina formed thereon.

The cooling base part 1004 is connected to a high-frequency power source C1008 through a matching box C1007 which includes a capacitor and a coil. The high-frequency power source C1008 applies an RF current for a bias voltage to the cooling base part 1004. The high-frequency power source C1008 is grounded by an earth C1009.

The cooling base part 1004 has the extraction electrode terminal 1041, the extraction electrode terminal 1043, and the extraction electrode terminal 1045. The cooling base part 1004 is formed to cover the peripheries of the extraction electrode terminal 1041, the extraction electrode terminal 1043, and the extraction electrode terminal 1045. The extraction electrode terminal 1041, the extraction electrode terminal 1043, and the extraction electrode terminal 1045 are respectively covered with an insulator 1042, an insulator 1044, and an insulator 1046 having insulation properties.

The extraction electrode terminal 1041, the extraction electrode terminal 1043, and the extraction electrode terminal 1045 are provided so as to penetrate the cooling base part 1004.

The extraction electrode terminal 1041 has a rod shape and is configured to apply a direct-current voltage to the electrode for wafer electrostatic attraction 1023. The extraction electrode terminal 1041 is connected to the electrode pin for wafer electrostatic attraction 1025 through the conductive adhesive layer 1031. The extraction electrode terminal 1041 is connected to a variable direct-current power source C1001 through a high-frequency cutoff filter (not shown).

The extraction electrode terminal 1043 has a rod shape and is configured to apply a direct-current voltage to the first electrode for FR electrostatic attraction 1026. The extraction electrode terminal 1043 is connected to the first electrode pin for FR electrostatic attraction 1027 through the conductive adhesive layer 1032. The extraction electrode terminal 1043 is connected to a variable direct-current power source C1003 through a high-frequency cutoff filter (not shown).

The extraction electrode terminal 1045 has a rod shape and is configured to apply a direct-current voltage to the second electrode for FR electrostatic attraction 1028. The extraction electrode terminal 1045 is connected to the second electrode pin for FR electrostatic attraction 1029 through the conductive adhesive layer 1033. The extraction electrode terminal 1045 is connected to a variable direct-current power source C1005 through a high-frequency cutoff filter (not shown).

The variable direct-current power source C1001 is grounded by an earth C1002. The variable direct-current power source C1003 is grounded by an earth C1004. The variable direct-current power source C1005 is grounded by an earth C1006.

The extraction electrode terminal 1041, the extraction electrode terminal 1043, and the extraction electrode terminal 1045 are insulated with respect to the cooling base part 1004 made of metal by the insulator 1042, the insulator 1044, and the insulator 1046, respectively.

As the material of each of the extraction electrode terminal 1041, the extraction electrode terminal 1043, and the extraction electrode terminal 1045, as long as it is a non-magnetic conductive material having excellent heat resistance, there is no limitation. However, a material having a coefficient of thermal expansion close to the coefficients of thermal expansion of the electrode for wafer electrostatic attraction 1023 and the supporting plate 1024 is preferable, and for example, a metal material such as titanium is used.

(Summary)

As described above, the electrostatic chuck device 1001 according to this embodiment includes the electrostatic chuck part 1002, the cooling base part 1004, and the adhesive layer (the insulating adhesive layer 1003).

The electrostatic chuck part 1002 has the sample placing surface 1021*a* on which a sample is placed, and has a sixth electrode for electrostatic attraction (the electrode for wafer electrostatic attraction 1023). The electrostatic chuck part 1002 has a first recessed portion (the adhesion surface 1021*d*) on the adhesive layer (the insulating adhesive layer 1003) side, and the outer periphery of the first recessed portion (the adhesion surface 1021*d*) has a slope (the adhesion surface slope 1021*e*).

The cooling base part 1004 is placed on the side opposite to the sample placing surface 1021*a* with respect to the electrostatic chuck part 1002 to cool the electrostatic chuck part 1002. The cooling base part 1004 has the first protrusion portion (the inner peripheral upper surface 1401*a*) corresponding to the first recessed portion (the adhesion surface 1021*d*) of the electrostatic chuck part 1002.

The adhesive layer (the insulating adhesive layer 1003) bonds the electrostatic chuck part 1002 and the cooling base part 1004 together.

With this configuration, in the electrostatic chuck device 1001 according to this embodiment, since the thickness of the electrostatic chuck part 1002 at the portion where the etching rate is high is increased, so that the sheath voltage can be reduced, it is possible to reduce the non-uniformity of etching on the sample placing surface of the electrostatic chuck part 1002 without increasing the number of high-frequency power sources. In this embodiment, the non-uniformity of etching means that the etching rate becomes non-uniform.

Further, in the electrostatic chuck device 1001 according to this embodiment, since a large change in capacitance between the portion subjected to counterboring and the portion not subjected to counterboring can be suppressed, it is possible to suppress a sudden change in the intensity of the electric field and a sudden change in the direction of the electric field in the outer peripheral portion. For this reason, in the electrostatic chuck device 1001 according to this embodiment, it is possible to reduce the non-uniformity of etching on the sample placing surface of the electrostatic chuck part 1002 without increasing the number of high-frequency power sources.

Further, the electrostatic chuck part 1002 has the structure installation surface 1021*c* on which an annular structure surrounding the periphery of the sample placing surface 1021*a* is installed, in a second recessed portion which is located around the sample placing surface 1021*a* and is recessed from the sample placing surface 1021*a*.

With this configuration, in the electrostatic chuck device 1001 according to this embodiment, since the focus ring can be placed, it is possible to reduce the non-uniformity of the etching rate between the central portion and the peripheral edge portion on the sample placing surface 1021*a* of the electrostatic chuck part 1002.

Further, in the electrostatic chuck device 1001 according to this embodiment, a part (the adhesion surface slope 1021*e*) of the first recessed portion of the electrostatic chuck part 1002 extends to the structure installation surface 1021*c*.

With this configuration, in the electrostatic chuck device 1001 according to this embodiment, it is possible to adjust the intensity and direction of the electric field of the sheath voltage on the structure installation surface 1021*c*.

Further, in the electrostatic chuck device 1001 according to this embodiment, the inner angle A1 of the slope (the adhesion surface slope 1021*e*) of the outer periphery of the first recessed portion of the electrostatic chuck part 1002 is larger than 95 degrees and smaller than 165 degrees, and more preferably, larger than 105 degrees and smaller than 155 degrees.

With this configuration, in the electrostatic chuck device 1001 according to this embodiment, it is possible to suppress a sudden change in the intensity of the electric field and the direction of the electric field, and it is possible to suppress the occurrence of cracking from the adhesion surface slope 1021*e* which is the outer peripheral portion of the recessed portion on the bottom surface of the electrostatic chuck part 1002. For this reason, in the electrostatic chuck device 1001 according to this embodiment, it is possible to reduce the non-uniformity of etching on the sample placing surface of the electrostatic chuck part 1002 without increasing the number of high-frequency power sources.

Further, in the electrostatic chuck device 1001 according to this embodiment, the sheet resistance value of the sixth electrode (the electrode for wafer electrostatic attraction 1023) is higher than $1.0\Omega/\square$ and lower than $1.0\times10^{10}\Omega/\square$. It is preferable that the sheet resistance value of the sixth electrode (the electrode for wafer electrostatic attraction 1023) is higher than $2.0\Omega/\square$ and lower than $1.0\times10^{7}\Omega/\square$.

In the electrostatic chuck device 1001 according to this embodiment, by making the sheet resistance value of the sixth electrode (the electrode for wafer electrostatic attraction 1023) higher than the lower limit value described above, it is possible to suppress the generation of the eddy current in the electrode for wafer electrostatic attraction 1023. For this reason, it is possible to reduce the non-uniformity of the etching rate on the sample placing surface of the electrostatic chuck part 1002. On the other hand, by making the sheet resistance value of the sixth electrode (the electrode for wafer electrostatic attraction 1023) lower than the upper limit value described above, it is possible to maintain a good attraction characteristic.

The thickness of the sixth electrode (the electrode for wafer electrostatic attraction 1023) is larger than 0.5 μm and smaller than 50 μm. It is preferable that the thickness of the sixth electrode (the electrode for wafer electrostatic attraction 1023) is larger than 10 μm and smaller than 30 μm.

Further, in the electrostatic chuck device 1001 according to this embodiment, for example, the electrostatic chuck part 1002 is made of one or more of an aluminum oxide-silicon carbide composite sintered body and an aluminum oxide sintered body.

With this configuration, in the electrostatic chuck device 1001 according to this embodiment, durability in a semiconductor manufacturing process such as plasma etching is improved, and mechanical strength is maintained. For this reason, it is possible to reduce the non-uniformity of the etching rate on the sample placing surface of the electrostatic chuck part 1002 in a state where the durability in a semiconductor manufacturing process such as plasma etching is improved and the mechanical strength is maintained.

Seventh Embodiment

Hereinafter, a seventh embodiment of the present invention will be described in detail with reference to the drawings.

In the sixth embodiment described above, the case has been described where the electrostatic chuck device is provided with the electrostatic chuck part 1002 having the recessed portion on the insulating adhesive layer side to reduce the non-uniformity of the etching rate. In this embodiment, a case will be described where the electrostatic chuck device is further provided with a dielectric layer provided between the electrostatic chuck part and the cooling base part to reduce the non-uniformity of the etching rate.

The electrostatic chuck device according to this embodiment is referred to as an electrostatic chuck device 1201.

Figure 20:
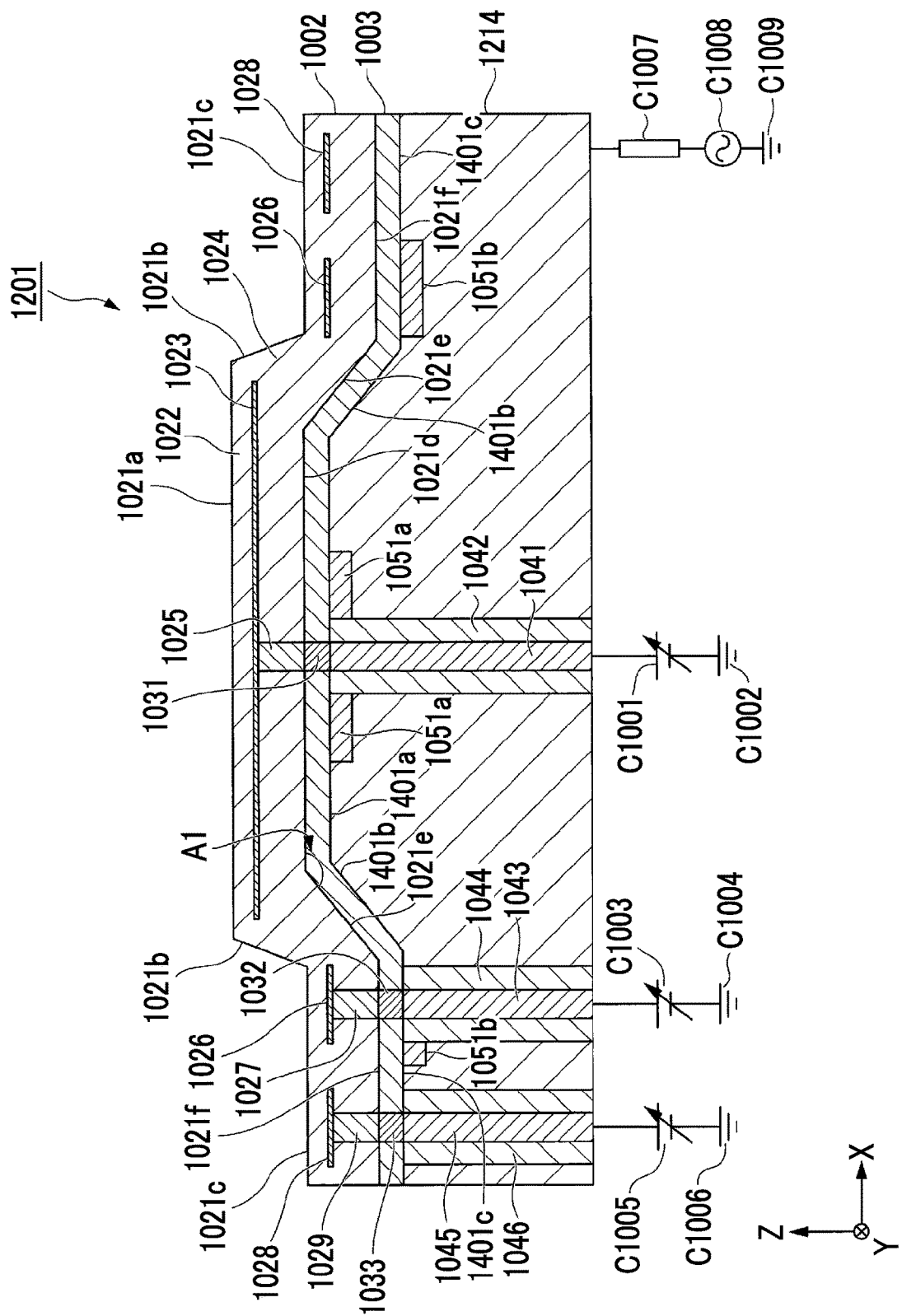
FIG. 20 is a sectional view showing an example of an electrostatic chuck device according to a seventh embodiment of the present invention.

FIG. 20 is a sectional view showing an example of the electrostatic chuck device 1201 according to this embodiment. The electrostatic chuck device 1201 includes the electrostatic chuck part 1002, the insulating adhesive layer 1003, a cooling base part 1214, a dielectric layer 1051a, and a dielectric layer 1051b.

If the electrostatic chuck device 1201 (FIG. 20) according to this embodiment is compared with the electrostatic chuck device 1001 (FIG. 18) according to the sixth embodiment, the presence or absence of the dielectric layers 1051a and 1051b is different.

Here, the functions of the other components are the same as those in the sixth embodiment. Description of the same functions as those in the sixth embodiment will be omitted, and in the seventh embodiment, description will be made focusing on portions different from those of the sixth embodiment.

The dielectric layer 1051a and the dielectric layer 1051b are provided between the electrostatic chuck part 1002 and the cooling base part 1214. The dielectric layer 1051a is provided in a recessed portion provided on the inner peripheral upper surface 1401a which is an inner peripheral portion of the cooling base part 1214. The dielectric layer 1051a has a ring shape, and the insulator 1042 penetrates the center of the ring. The dielectric layer 1051b is provided in a recessed portion provided on the outer peripheral upper surface 1401c which is an outer peripheral portion of the cooling base part 1214. The dielectric layer 1051b has a ring shape, and has a portion through which the insulator 1044 penetrates at a part of the ring shape.

It is not easy to perform fine adjustment of the sheath voltage only by providing a recessed portion on the bottom surface of the electrostatic chuck part 1002 by counterboring. In the electrostatic chuck device 1201, the dielectric layer 1051a and the dielectric layer 1051b are installed at portions of the upper surface of the electrostatic chuck part 1002 where the intensity of the electric field is strong.

The portions where the electrostatic chuck part 1002 overlaps the dielectric layer 1051a and the dielectric layer 1051b when the electrostatic chuck part 1002 is viewed downward from above have small capacitance compared to the portions where the electrostatic chuck part 1002 does not overlap the dielectric layer 1051a and the dielectric layer 1051b. For this reason, the sheath voltage above the portions which overlap the dielectric layer 1051a and the dielectric layer 1051b when the electrostatic chuck part 1002 is viewed downward from above on the upper surface of the electrostatic chuck part 1002 is reduced, and thus it is possible to reduce the non-uniformity of the etching rate and the etching direction on the upper surface of the electrostatic chuck part 1002.

Summary

As described above, in the electrostatic chuck device 1201 according to this embodiment, the dielectric layer 1051a and the dielectric layer 1051b are provided between the electrostatic chuck part 1002 and the cooling base part 1214.

With this configuration, in the electrostatic chuck device 1201 according to this embodiment, the dielectric layer 1051a and the dielectric layer 1051b are provided at the portions of the upper surface of the electrostatic chuck part 1002 where the intensity of the electric field is strong, whereby it is possible to reduce the non-uniformity of the etching rate and the etching direction on the upper surface of the electrostatic chuck part 1002.

Eighth Embodiment

Hereinafter, an eighth embodiment of the present invention will be described in detail with reference to the drawings.

In the sixth embodiment described above, the case has been described where the electrostatic chuck device is provided with the electrostatic chuck part having the recessed portion on the insulating adhesive layer side to reduce the non-uniformity of the etching rate. In this embodiment, a case will be described where the thickness of the insulating adhesive layer in the portion which overlaps the structure installation surface when the electrostatic chuck part is viewed downward from above is thicker than that in the portion which overlaps the recessed portion of the electrostatic chuck part.

The electrostatic chuck device according to this embodiment is referred to as an electrostatic chuck device 1301.

Figure 21:
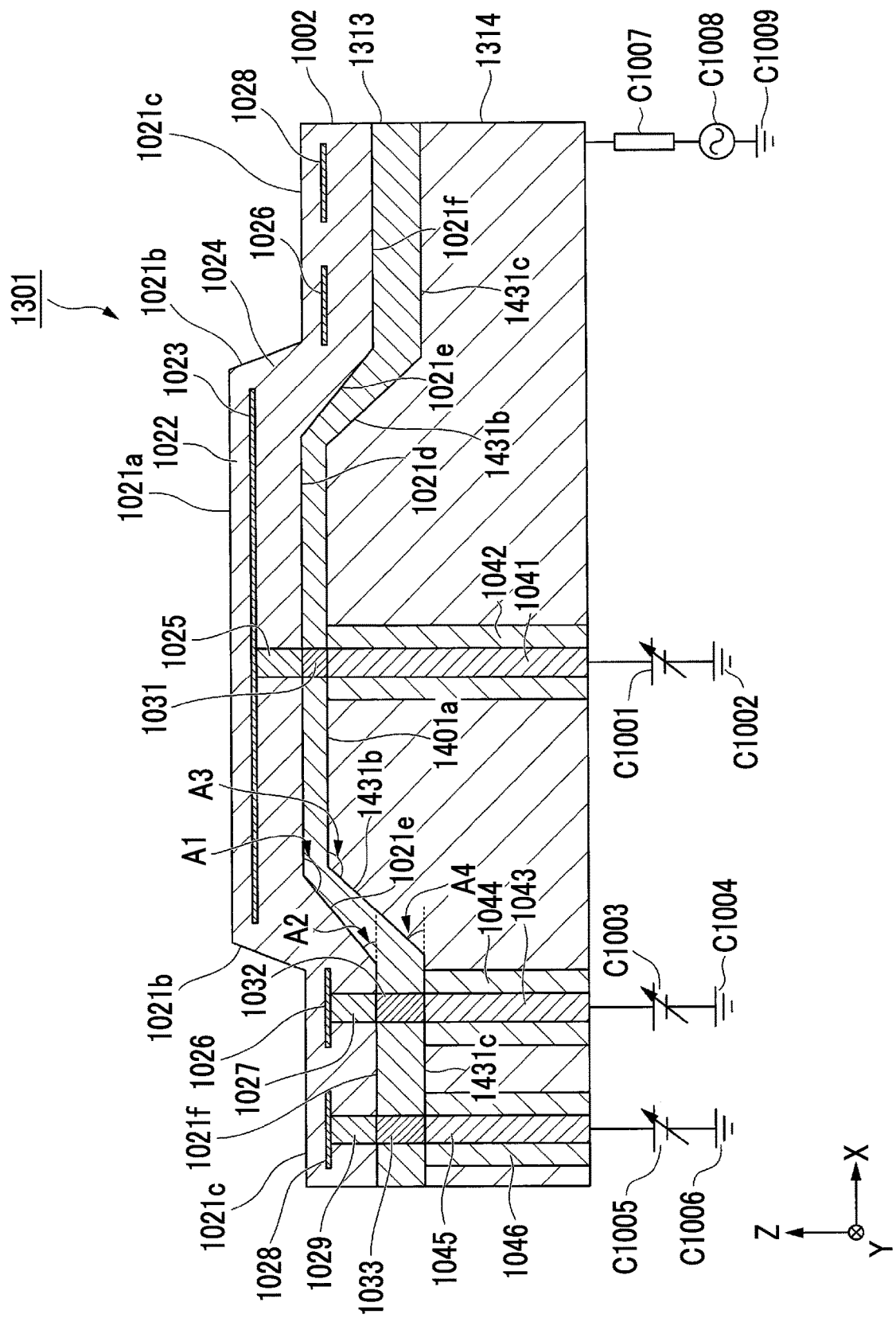
FIG. 21 is a sectional view showing an example of an electrostatic chuck device according to an eighth embodiment of the present invention.

FIG. 21 is a sectional view showing an example of the electrostatic chuck device 1301 according to this embodiment. The electrostatic chuck device 1301 includes the electrostatic chuck part 1002, an insulating adhesive layer 1313, and a cooling base part 1314.

If the electrostatic chuck device 1301 (FIG. 21) according to this embodiment is compared with the electrostatic chuck device 1001 (FIG. 18) according to the sixth embodiment, the shapes of the insulating adhesive layer 1313 and the cooling base part 1314 are different. Here, the functions of the other components are the same as those in the sixth embodiment.

Description of the same functions as those in the sixth embodiment will be omitted, and in the eighth embodiment, description will be made focusing on portions different from those of the sixth embodiment.

The cooling base part 1314 has the inner peripheral upper surface 1401a, a slope 1431b, and an outer peripheral upper surface 1431c as upper surfaces thereof. The slope 1431b is a slope connecting the inner peripheral upper surface 1401a and the outer peripheral upper surface 1431c. Here, the height in an up-down direction of the outer peripheral upper surface 1431c is lower than that of the outer peripheral upper surface 1401c of the electrostatic chuck device 1001 (FIG. 18) according to the sixth embodiment.

In response to the low height of the outer peripheral upper surface 1431c, in the insulating adhesive layer 1313 bonding the electrostatic chuck part 1002 and the cooling base part 1314 together, the thickness of the portion which is in contact with the outer peripheral portion adhesion surface 1021f is larger than the thickness of the portion which is in contact with the adhesion surface 1021d. That is, the thickness of the insulating adhesive layer 1313 at the position corresponding to the structure installation surface 1021c is larger than the thickness of the insulating adhesive layer 1313 between the adhesion surface 1021d and the cooling base part 1314. An inner angle A3 of the slope 1431b is smaller than the inner angle A1 of the adhesion surface slope 1021*e*. Further, an inner angle A4 of the slope 1431*b* is larger than an inner angle A2 of the adhesion surface slope 1021*e*.

In the electrostatic chuck device 1301, by increasing the thickness of the insulating adhesive layer 1313 at the position corresponding to the structure installation surface 1021*c*, it is possible to reduce stress which is applied to the insulating adhesive layer 1313 at the position corresponding to the structure installation surface 1021*c* and to suppress peeling of the insulating adhesive layer 1313 or deformation of the electrostatic chuck part 1002. Further, in the electrostatic chuck device 1301, the flow of an adhesive is improved in a bonding step, and thus it is possible to reduce the non-uniformity of the thickness of the insulating adhesive layer 1313. Further, in the electrostatic chuck device 1301, it is possible to increase the temperature of the sample placed on the sample placing surface 1021*a* and increase the temperature of the FR can be increased, whereby it is possible to reduce the re-deposition of a reactant gas on the structure installation surface 1021*c*.

(Summary)

As described above, in the electrostatic chuck device 1301 according to this embodiment, the thickness of the adhesive layer (the insulating adhesive layer 1313) at the position corresponding to the structure installation surface 1021*c* is larger than the thickness of the adhesive layer (the insulating adhesive layer 1313) between the bottom surface (the adhesion surface 1021*d*) of the first recessed portion and the cooling base part 1314.

With this configuration, in the electrostatic chuck device 1301 according to this embodiment, by increasing the thickness of the adhesive layer (the insulating adhesive layer 1313) of the outer peripheral portion, it is possible to reduce the stress which is applied to the adhesive layer (the insulating adhesive layer 1313) of the outer peripheral portion and to suppress the peeling of the adhesive layer (the insulating adhesive layer 1313) or the deformation of the electrostatic chuck part 1002. Further, in the electrostatic chuck device 1301, the flow of the adhesive is improved in the bonding step, and thus it is possible to reduce the non-uniformity of the thickness of the adhesive layer (the insulating adhesive layer 1313). Further, in the electrostatic chuck device 1301, it is possible to increase the temperature of the sample placed on the sample placing surface 1021*a* and increase the temperature of the FR can be increased, whereby it is possible to reduce the re-deposition of the reactant gas on the structure installation surface 1021*c*. For this reason, in the electrostatic chuck device 1301 according to this embodiment, it is possible to reduce the non-uniformity of etching in the plane of the wafer without increasing the number of high-frequency power sources.

Further, in the electrostatic chuck device 1301 according to this embodiment, the inner angle A3 of the slope (the slope 1431*b*) of the first protrusion portion of the cooling base part 1314 is smaller than the inner angle A1 of the slope (the adhesion surface slope 1021*e*) of the outer periphery of the first recessed portion of the electrostatic chuck part 1002.

With this configuration, in the electrostatic chuck device 1301 according to this embodiment, the flow of the adhesive is improved in the bonding step, and thus it is possible to reduce the non-uniformity of the thickness of the adhesive layer (the insulating adhesive layer 1313). For this reason, in the electrostatic chuck device 1301 according to this embodiment, it is possible to reduce the non-uniformity of etching in the plane of the wafer without increasing the number of high-frequency power sources.

Ninth Embodiment

Hereinafter, a ninth embodiment of the present invention will be described in detail with reference to the drawings.

In the sixth embodiment described above, the case has been described where the electrostatic chuck device is provided with the electrostatic chuck part having the recessed portion on the insulating adhesive layer side to reduce the non-uniformity of the etching rate. In this embodiment, a case will be described where the electrostatic chuck device has a sample mounting surface adjustment electrode between the electrostatic chuck part and the cooling base part to adjust the acceleration voltage of a power source for high frequency generation.

The electrostatic chuck device according to this embodiment is referred to as an electrostatic chuck device 1401.

Figure 22:
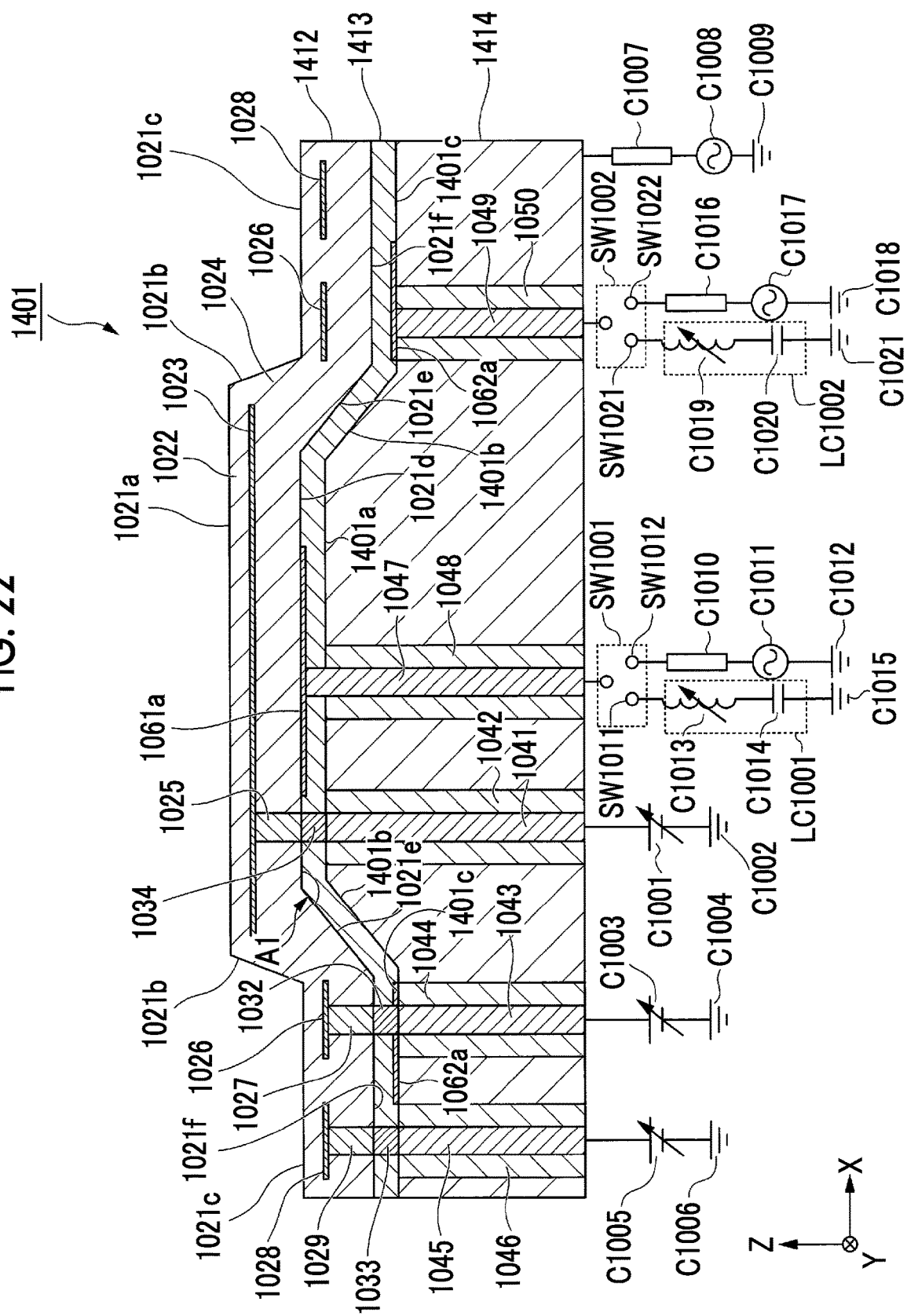
FIG. 22 is a sectional view showing an example of an electrostatic chuck device according to a ninth embodiment of the present invention.

FIG. 22 is a sectional view showing an example of the electrostatic chuck device 1401 according to this embodiment. The electrostatic chuck device 1401 includes an electrostatic chuck part 1412, an insulating adhesive layer 1413, and a cooling base part 1414.

If the electrostatic chuck device 1401 (FIG. 22) according to this embodiment is compared with the electrostatic chuck device 1001 (FIG. 18) according to the sixth embodiment, the electrostatic chuck device 1401 (FIG. 22) according to this embodiment is different from the electrostatic chuck device 1001 in that it has a sample mounting surface adjustment electrode 1061*a* and a structure installation surface adjustment electrode 1062*a*.

Here, the functions of the other components are the same as those in the sixth embodiment. Description of the same functions as those in the sixth embodiment will be omitted, and in the ninth embodiment, description will be made focusing on portions different from those of the sixth embodiment.

The sample mounting surface adjustment electrode 1061*a* is provided between the electrostatic chuck part 1412 and the insulating adhesive layer 1413. That is, the sample mounting surface adjustment electrode 1061*a* is provided between the electrostatic chuck part 1412 and the cooling base part 1414. The sample mounting surface adjustment electrode 1061*a* is provided at the portion which overlaps the adhesion surface 1021*d* of the inner peripheral portion of the disk of the electrostatic chuck part 1412 when the electrostatic chuck part 1412 is viewed downward from above. The sample mounting surface adjustment electrode 1061*a* is a disk-shaped electrode.

The structure installation surface adjustment electrode 1062*a* is provided between the insulating adhesive layer 1413 and the cooling base part 1414. The structure installation surface adjustment electrode 1062*a* is provided at the portion which overlaps the outer peripheral portion adhesion surface 1021*f* of the outer peripheral portion of the disk of the electrostatic chuck part 1412 when the electrostatic chuck part 1412 is viewed downward from above.

The structure installation surface adjustment electrode 1062*a* is a ring-shaped electrode. The structure installation surface adjustment electrode 1062*a* is electrically insulated from the electrode for wafer electrostatic attraction 1023, the first electrode for FR electrostatic attraction 1026, and the second electrode for FR electrostatic attraction 1028. The structure installation surface adjustment electrode 1062*a* has a portion through which the conductive adhesive layer 1032 penetrates in the Z-axis direction.

The sample mounting surface adjustment electrode 1061*a* is joined to an extraction electrode terminal 1047. The sample mounting surface adjustment electrode 1061*a* is a disk-shaped electrode.

The sample mounting surface adjustment electrode 1061*a* and the structure installation surface adjustment electrode 1062*a* are, for example, metal foil electrodes. A polyimide sheet (not shown) is interposed between the structure installation surface adjustment electrode 1062*a* and the cooling base part 1414, whereby the structure installation surface adjustment electrode 1062*a* is insulated from the cooling base part 1414.

The polyimide sheet may be interposed between the sample mounting surface adjustment electrode 1061*a* and the insulating adhesive layer 1413.

The extraction electrode terminal 1047 has a rod shape and is configured to apply an alternating-current voltage to the sample mounting surface adjustment electrode 1061*a*. The extraction electrode terminal 1047 is directly connected to the sample mounting surface adjustment electrode 1061*a*.

The extraction electrode terminal 1047 is connected to a control terminal of a switch SW1001. In a case where the switch SW1001 is connected to a first terminal SW1011, the extraction electrode terminal 1047 is connected to an LC resonance circuit LC1001. The extraction electrode terminal 1047 is grounded by an earth C1015 through the LC resonance circuit LC1001.

The LC resonance circuit LC1001 includes a variable conductor C1013 and a capacitor C1014. The variable conductor C1013 and the capacitor C1014 are connected in series. In a case where the switch SW1001 is connected to the first terminal SW1011, the extraction electrode terminal 1047 is connected to the variable conductor C1013.

In a case where the switch SW1001 is connected to a second terminal SW1012, the extraction electrode terminal 1047 is connected to a high-frequency power source C1011 through a matching box C1010. The extraction electrode terminal 1047 is grounded by an earth C1012 through the matching box C1010 and the high-frequency power source C1011.

A control circuit (not shown) switches whether the switch SW1001 is connected to the first terminal SW1011 or the second terminal SW1012.

In a case where the switch SW1001 is connected to the first terminal SW1011, the control circuit (not shown) variably controls the magnitude of the voltage of the sample mounting surface adjustment electrode 1061*a* by adjusting an L component of the LC resonance circuit LC1001.

Since an RF (radio frequency) current flowing through the cooling base part 1414 flows through the variable conductor C1013 and the capacitor C1014, the electrostatic chuck device 1401 can reduce the RF acceleration voltage of the portion which overlaps the sample mounting surface adjustment electrode 1061*a* when the cooling base part 1414 is viewed downward from above.

Since the RF acceleration voltage of the portion which overlaps the sample mounting surface adjustment electrode 1061*a* when the cooling base part 1414 is viewed downward from above is reduced, the sheath voltage above the portion which overlaps the sample mounting surface adjustment electrode 1061*a* when the electrostatic chuck part 1412 is viewed downward from above in the sample placing surface 1021*a* is reduced, and thus it is possible to reduce the non-uniformity of the etching rate on the sample placing surface 1021*a*.

In a case where the switch SW1001 is connected to the second terminal SW1012, the control circuit (not shown) variably controls the magnitude of the voltage of the high-frequency power source C1011.

The matching box C1010 includes a capacitor and a coil. The matching box C1010 is an impedance matching device and matches the impedance between the high-frequency power source C1011 on the input side and the sample mounting surface adjustment electrode 1061*a* on the output side.

In this embodiment, the case where the high-frequency power source C1011 and the LC resonance circuit LC1001 are provided in the electrostatic chuck device 1401 has been described. However, the electrostatic chuck device 1401 may not be provided with the LC resonance circuit LC1001. In that case, the extraction electrode terminal 1047 is connected to the matching box C1010 without the switch SW1001 intervention. Further, in this embodiment, the case where a high-frequency power source C1017 and an LC resonance circuit LC1002 are provided in the electrostatic chuck device 1401 has been described. However, the electrostatic chuck device 1401 may not be provided with the LC resonance circuit LC1002. In that case, an extraction electrode terminal 1049 is connected to a matching box C1016 without a switch SW1002 intervention.

The extraction electrode terminal 1049 has a rod shape and is configured to apply an alternating-current voltage to the structure installation surface 1021*c*. The extraction electrode terminal 1049 is directly connected to the structure installation surface adjustment electrode 1062*a*. It is preferable that the extraction electrode terminal 1049 and the structure installation surface adjustment electrode 1062*a* are made of the same material.

The extraction electrode terminal 1049 is connected to a control terminal of the switch SW1002. In a case where the switch SW1002 is connected to a first terminal SW1021, the extraction electrode terminal 1049 is connected to the LC resonance circuit LC1002. The extraction electrode terminal 1049 is grounded by an earth C1021 through the LC resonance circuit LC1002.

The LC resonance circuit LC1002 includes a variable conductor C1019 and a capacitor C1020. The variable conductor C1019 and the capacitor C1020 are connected in series. In a case where the switch SW1002 is connected to the first terminal SW1021, the extraction electrode terminal 1049 is connected to the variable conductor C1019.

In a case where the switch SW1002 is connected to a second terminal SW1022, the extraction electrode terminal 1049 is connected to the high-frequency power source C1017 through the matching box C1016. The extraction electrode terminal 1049 is grounded by an earth C1018 through the matching box C1016 and the high-frequency power source C1017.

The control circuit (not shown) switches whether the switch SW1002 is connected to the first terminal SW1021 or the second terminal SW1022.

In a case where the switch SW1002 is connected to the first terminal SW1021, the control circuit (not shown) variably controls the magnitude of the voltage of the structure installation surface adjustment electrode 1062*a* by adjusting the L component of the LC resonance circuit LC1002.

Since the RF current flowing through the cooling base part 1414 flows through the variable conductor C1019 and the capacitor C1020, the electrostatic chuck device 1401 can reduce the RF acceleration voltage of the portion which overlaps the structure installation surface adjustment electrode 1062*a* when the cooling base part 1414 is viewed downward from above.

Since the RF acceleration voltage of the portion which overlaps the structure installation surface adjustment electrode 1062a when the cooling base part 1414 is viewed downward from above is reduced, the sheath voltage above the portion which overlaps the structure installation surface adjustment electrode 1062a when the electrostatic chuck part 1412 is viewed downward from above in the structure installation surface 1021c is reduced, and thus it is possible to reduce the non-uniformity of the etching rate on the structure installation surface 1021c.

In a case where the switch SW1002 is connected to the second terminal SW1022, the control circuit (not shown) variably controls the magnitude of the voltage of the high-frequency power source C1017.

The matching box C1016 includes a capacitor and a coil. The matching box C1016 is an impedance matching device and matches the impedance between the high-frequency power source C1017 on the input side and the structure installation surface adjustment electrode 1062a on the output side.

The sample mounting surface adjustment electrode 1061a is provided at the portion which overlaps the adhesion surface 1021d of the inner peripheral portion of the disk of the electrostatic chuck part 1412 when the electrostatic chuck part 1412 is viewed downward from above, and therefore, in the electrostatic chuck part 1412, the electrode pin for wafer electrostatic attraction 1025 is provided at the portion which does not overlap the sample mounting surface adjustment electrode 1061a on the outer periphery side of the adhesion surface 1021d.

In the insulating adhesive layer 1413, the extraction electrode terminal 1047 penetrates at the inner peripheral portion of the surface which is in contact with the adhesion surface 1021d. The conductive adhesive layer 1034 is provided at the outer peripheral portion of the surface which is in contact with the adhesion surface 1021d so as not to overlap the extraction electrode terminal 1047.

The cooling base part 1414 has the extraction electrode terminal 1047 and the extraction electrode terminal 1049 in addition to the extraction electrode terminal 1041, the extraction electrode terminal 1043, and the extraction electrode terminal 1045. The extraction electrode terminal 1047 is provided to penetrate the inner peripheral portion of the inner peripheral upper surface 1401a of the cooling base part 1414. The extraction electrode terminal 1049 is provided to penetrate the inner peripheral portion of the outer peripheral upper surface 1401c. The extraction electrode terminal 1041 is provided to penetrate the cooling base part 1414 at the outer peripheral portion of the inner peripheral upper surface 1401a so as not to overlap the extraction electrode terminal 1047.

The extraction electrode terminal 1047 is covered with an insulator 1048. The extraction electrode terminal 1049 is covered with an insulator 1050. The cooling base part 1414 is formed to cover the peripheries of the insulator 1048 and the insulator 1050. The extraction electrode terminal 1047 is insulated with respect to the cooling base part 1414 made of metal by the insulator 1048. The extraction electrode terminal 1049 is insulated with respect to the cooling base part 1414 made of metal by the insulator 1050.

(Summary)

As described above, the electrostatic chuck device 1401 according to this embodiment includes the RF application or LC component electrode layers (the sample mounting surface adjustment electrode 1061a and the structure installation surface adjustment electrode 1062a) between the electrostatic chuck part 1412 and the cooling base part 1414.

With this configuration, in the electrostatic chuck device 1401 according to this embodiment, since the adjustment can be performed by increasing and decreasing the sheath voltage, it is possible to reduce the non-uniformity of the etching rate and the etching direction on the electrostatic chuck part 1412.

Tenth Embodiment

Hereinafter, a tenth embodiment of the present invention will be described in detail with reference to the drawings.

In the ninth embodiment described above, the case has been described where the electrostatic chuck device has the sample mounting surface adjustment electrode between the electrostatic chuck part and the cooling base part to adjust the accelerating voltage of the power source for high frequency generation. In this embodiment, a case will be described where one or more sample mounting surface high-frequency electrodes are disposed in the interior of an organic material part connecting an electrostatic chuck part and a metallic base.

The electrostatic chuck device according to this embodiment is referred to as an electrostatic chuck device 1501.

Figure 23:
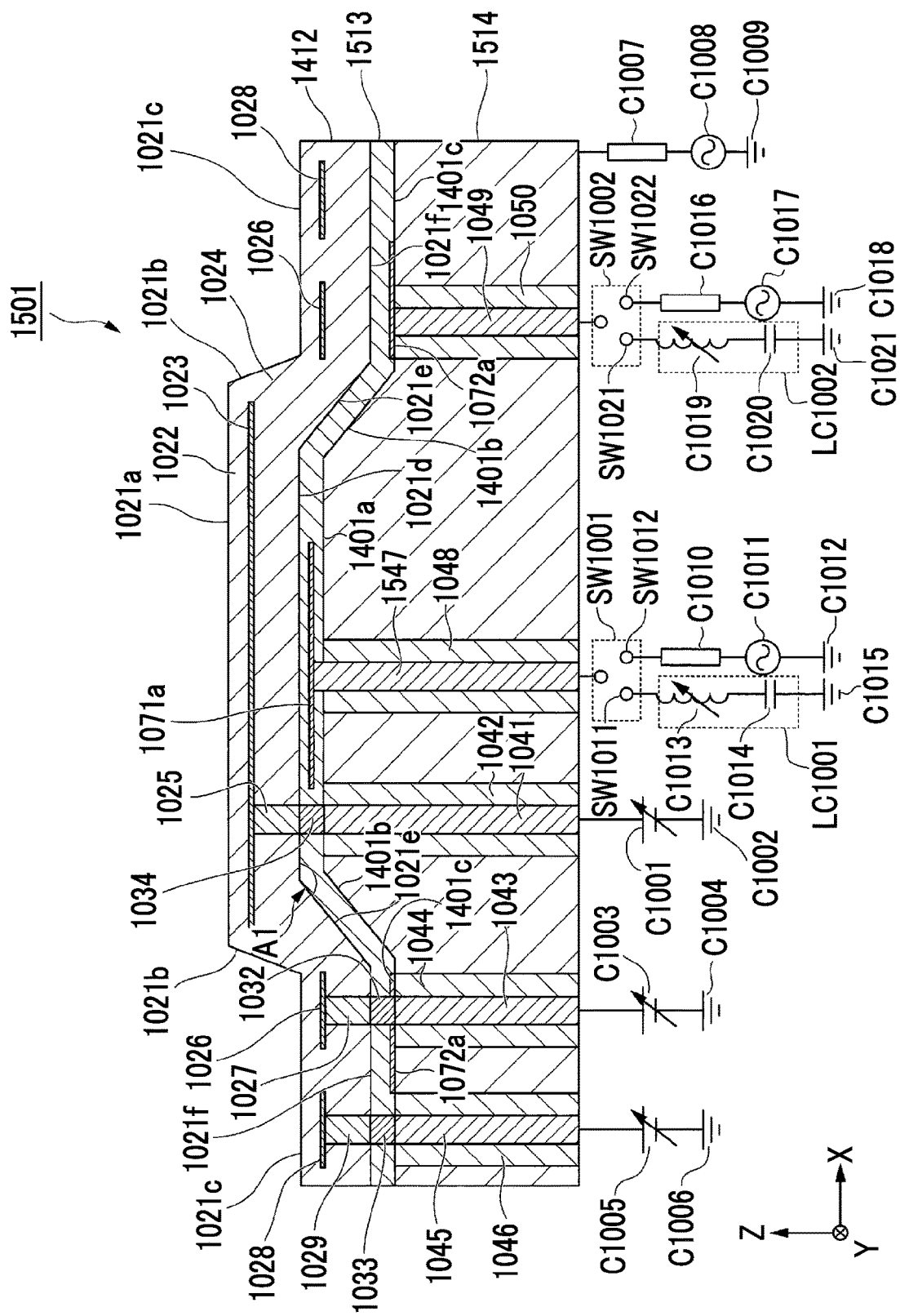
FIG. 23 is a sectional view showing an example of an electrostatic chuck device according to a tenth embodiment of the present invention.

FIG. 23 is a sectional view showing an example of the electrostatic chuck device 1501 according to this embodiment. The electrostatic chuck device 1501 includes the electrostatic chuck part 1412, an organic material part 1513, and a metallic base 1514.

If the electrostatic chuck device 1501 (FIG. 23) according to this embodiment is compared with the electrostatic chuck device 1401 (FIG. 22) according to the ninth embodiment, the electrostatic chuck device 1501 is different from the electrostatic chuck device 1401 in that the organic material part 1513 and the metallic base 1514 are provided and a sample mounting surface adjustment electrode 1071a is provided in the interior of the organic material part 1513. Here, the functions of the other components are the same as those in the ninth embodiment. Description of the same functions as those in the ninth embodiment will be omitted, and in the tenth embodiment, description will be made focusing on portions different from those of the ninth embodiment.

The organic material part 1513 is provided between the electrostatic chuck part 1412 and the metallic base 1514. The organic material part 1513 has the sample mounting surface adjustment electrode 1071a in the interior thereof in addition to the conductive adhesion layer 1032, the conductive adhesion layer 1033, and the conductive adhesion layer 1034.

An extraction electrode terminal 1547 penetrates the organic material part 1513 and is connected to the sample mounting surface adjustment electrode 1071a. It is preferable that the extraction electrode terminal 1547 and the sample mounting surface adjustment electrode 1071a are made of the same material. The organic material part 1513 is formed to cover the peripheries of the sample mounting surface adjustment electrode 1071a and the extraction electrode terminal 1547.

The sample mounting surface adjustment electrode 1071a is provided at an inner peripheral portion of the portion which overlaps the inner peripheral upper surface 1401a when the organic material part 1513 is viewed downward from above.

The sample mounting surface adjustment electrode 1071a is provided in the organic material part 1513. The sample mounting surface adjustment electrode 1071a is a disk-shaped thin film electrode. The sample mounting surface adjustment electrode 1071a is, for example, a metal foil electrode. The sample mounting surface adjustment electrode 1071a is provided in the interior of the organic material part 1513, thereby being insulated from the metallic base 1514.

In a case where the sample mounting surface adjustment electrode 1071a is provided in the organic material part 1513, the manufacturing of the sample mounting surface adjustment electrode 1071a is easy compared to a case where the sample mounting surface adjustment electrode 1071a is provided in the interior of the electrostatic chuck part 1412. Further, in a case where the sample mounting surface adjustment electrode 1071a is provided in the organic material part 1513, the thickness of the electrostatic chuck part 1412 can be made thinner than in a case where the sample mounting surface adjustment electrode 1071a is provided in the interior of the electrostatic chuck part 1412.

The extraction electrode terminal 1547 has a rod shape and is configured to apply a high-frequency voltage to the sample mounting surface adjustment electrode 1071a. The extraction electrode terminal 1547 is directly connected to the sample mounting surface adjustment electrode 1071a. The extraction electrode terminal 1547 is connected to the control terminal of the switch SW1001.

In the electrostatic chuck device 1501, the high-frequency voltage is applied to the sample mounting surface adjustment electrode 1071a, whereby the sheath voltage above the portion which overlaps the sample mounting surface adjustment electrode 1071a when the electrostatic chuck part 1412 is viewed downward from above in the sample placing surface 1021a is reduced, and thus it is possible to reduce the non-uniformity of the etching rate and the etching direction on the sample placing surface 1021a.

In this embodiment, as an example, the case where one sample mounting surface adjustment electrode 1071a is provided in the interior of the organic material part 1513 has been described. However, a plurality of sample mounting surface adjustment electrodes may be provided in the interior of the organic material part 1513. In a case where the plurality of sample mounting surface adjustment electrodes are provided in the interior of the organic material part 1513, the plurality of sample mounting surface adjustment electrodes are provided such that the plurality of sample mounting surface adjustment electrodes do not overlap each other at the portion which overlaps the inner peripheral upper surface 1401a in a case where the organic material part 1513 is viewed downward from above. The shapes of the plurality of sample mounting surface adjustment electrodes are a disk shape or a ring shape and may be the combination of the disk shapes or the ring shapes.

(Summary)

As described above, the electrostatic chuck device 1501 according to this embodiment includes the electrostatic chuck part 1412, the metallic base 1514, the organic material part 1513, and one or more seventh electrodes for RF voltage application or LC adjustment (sample mounting surface adjustment electrodes 1071a).

The metallic base 1514 is placed on the side opposite to the sample placing surface 1021a with respect to the electrostatic chuck part 1412 and can apply an RF voltage.

The organic material part 1513 is disposed between the electrostatic chuck part 1412 and the metallic base 1514.

One or more seventh electrodes for RF voltage application or LC adjustment (sample mounting surface adjustment electrodes 1071a) are provided in the organic material part 1513.

With this configuration, in the electrostatic chuck device 1501 according to this embodiment, since the sheath voltage can be reduced, it is possible to reduce the non-uniformity of the etching rate and the etching direction on the electrostatic chuck part 1412. Further, in the electrostatic chuck device 1501, it is possible to make the manufacture and installation of the seventh electrode for RF voltage application or LC adjustment (the sample mounting surface adjustment electrode 1071a) easy. Further, in the electrostatic chuck device 1501, it is possible to reduce the thickness of the electrostatic chuck part 1412. Further, in the electrostatic chuck device 1501, it is possible to apply an RF current for a high-frequency bias voltage to the metallic base 1514.

Embodiments of the present invention have been described in detail above with reference to the drawings. However, the specific configurations are not limited to the configurations described above, and various design changes and the like can be made within a scope which does not depart from the gist of the present invention.

INDUSTRIAL APPLICABILITY

It is possible to reduce non-uniformity of etching in a plane of a wafer.

REFERENCE SIGNS LIST 1, 201, 301, 302, 303, 401, 402, 501: electrostatic chuck device
2, 212, 312, 322, 332, 412, 422, 512: electrostatic chuck part
3, 213, 313, 323, 333, 413, 423: insulating adhesive layer
4, 214, 314, 324 334, 414, 424, 514: cooling base part
21a: sample placing surface
21b: structure installation surface
21c, 21d, 21e: adhesion surface
22: placing plate
23, 23a, 23b: electrode for wafer electrostatic attraction (first electrode)
24, 224: supporting plate
25: electrode pin for wafer electrostatic attraction
26: first electrode for FR electrostatic attraction (third electrode)
27: first electrode pin for FR electrostatic attraction
28: second electrode for FR electrostatic attraction (third electrode)
29: second electrode pin for FR electrostatic attraction
31, 32, 33: conductive adhesive layer
513: organic material part
41, 43, 45, 47, 547: extraction electrode terminal
42, 44, 46, 48: insulator
51: dielectric layer
61a, 62a, 63a: sample mounting surface adjustment electrode (second electrode)
61b: electrode pin for sample mounting surface adjustment electrode
61c, 71c: conductive joining layer
71a, 72a: mounting surface adjustment electrode (fourth electrode)
71b: electrode pin for FR mounting surface adjustment electrode
81a: sample mounting surface high-frequency electrode (fifth electrode)
C1, C13, C19, C22: matching box
C2, C14, C20, C23: high-frequency power source
C3, C5, C7, C9, C12, C15, C18, C21, C24: earth
C4, C6, C8: variable direct-current power source C10, C16: variable conductor
C11, C17: capacitor
LC1, LC2: resonance circuit
SW1, SW2: switch
SW11, SW21: first terminal
SW12, SW22: second terminal
1001, 1201, 1301, 1401, 1501: electrostatic chuck device
1002, 1212, 1312, 1412: electrostatic chuck part
1003, 1313, 1413: insulating adhesive layer
1513: organic material part
1004, 1214, 1314, 1414: cooling base part
1514: metallic base
1021a: sample placing surface
1021b: electrostatic chuck upper surface slope
1021c: structure installation surface
1021d: adhesion surface
1021e: adhesion surface slope
1021f: outer peripheral portion adhesion surface
1022: placing plate
1023: electrode for wafer electrostatic attraction (sixth electrode)
1024: supporting plate
1025: electrode pin for wafer electrostatic attraction
1026: first electrode for FR electrostatic attraction
1027: first electrode pin for FR electrostatic attraction
1028: second electrode for FR electrostatic attraction
1029: second electrode pin for FR electrostatic attraction
1031, 1032, 1033, 1034: conductive adhesive layer
1041, 1043, 1045, 1049, 1547: extraction electrode terminal
1042, 1044, 1046, 1048, 1050: insulator
1051a, 1051b: dielectric layer
1061a, 1071a: sample mounting surface adjustment electrode (seventh electrode)
1062a, 1072a: structure installation surface adjustment electrode
1401a: inner peripheral upper surface
1401b, 1431b: slope
1401c, 1431c: outer peripheral upper surface
A1, A2, A3, A4: inner angle
C1001, C1003, C1005: variable direct-current power source
C1002, C1004, C1006, C1009, C1012, C1015, C1018, C1021: earth
C1013, C1019: variable conductor
C1014, C1020: capacitor
C1007, C1010, C1016: matching box
C1008, C1011, C1017: high-frequency power source
LC1001, LC1002: resonance circuit
SW1001, SW1002: switch
SW1011, SW1021: first terminal
SW1012, SW1022: second terminal

The invention claimed is:

1. An electrostatic chuck device comprising:
an electrostatic chuck part having a sample placing surface on which a sample is placed and having a first electrode for electrostatic attraction;
a cooling base part placed on a side opposite to the sample placing surface with respect to the electrostatic chuck part to cool the electrostatic chuck part; and
an adhesive layer that bonds the electrostatic chuck part and the cooling base part together,
wherein the electrostatic chuck part has a recess on the adhesive layer side,
the cooling base part has a protrusion on the adhesion layer side,
a sheet resistance value of the first electrode is higher than $1.0\Omega/\square$ and lower than $1.0\times10^{10}\Omega/\square$, and
the adhesion layer is provided along the recess and protrusion.

2. The electrostatic chuck device according to claim 1, wherein the cooling base part is connected to a high-frequency power source through a matching box which includes a capacitor and a coil.

3. The electrostatic chuck device according to claim 1, wherein the first electrode is connected to a direct-current power source through a high-frequency cutoff filter.

4. The electrostatic chuck device according to claim 1, wherein the electrostatic chuck part has a structure installation surface on which an annular structure surrounding a periphery of the sample placing surface is installed, in a recessed portion which is located around the sample placing surface and is recessed from the sample placing surface.

5. The electrostatic chuck device according to claim 4, wherein a third electrode for electrostatic attraction is provided between the structure installation surface and the cooling base part.

6. The electrostatic chuck device according to claim 5, wherein a sheet resistance value of the third electrode is higher than $1.0\Omega/\square$ and lower than $1.0\times10^{10}\Omega/\square$.

7. The electrostatic chuck device according to claim 4, wherein a fourth electrode is provided between the structure installation surface and the cooling base part, and
the fourth electrode is connected to a high-frequency power source through a matching box which includes a capacitor and a coil, or is grounded through a variable conductor.

8. The electrostatic chuck device according to claim 7, wherein the fourth electrode is provided in an interior of the electrostatic chuck part or between the electrostatic chuck part and the cooling base part.

9. The electrostatic chuck device according to claim 7, wherein the fourth electrode straddles the sample placing surface and the structure installation surface in a direction parallel to the sample placing surface.

10. The electrostatic chuck device according to claim 7, wherein a plurality of the fourth electrodes are provided.

* * * * *